(12) United States Patent
Kim et al.

(10) Patent No.: US 8,815,418 B2
(45) Date of Patent: Aug. 26, 2014

(54) COMPOUND INCLUDING FLUORENYL GROUP FOR ORGANIC PHOTOELECTRIC DEVICE AND ORGANIC PHOTOELECTRIC DEVICE INCLUDING THE SAME

(75) Inventors: Hyung-Sun Kim, Uiwang-si (KR); Ho-Jae Lee, Uiwang-si (KR); Eui-Su Kang, Uiwang-si (KR); Nam-Heon Lee, Uiwang-si (KR); Young-Sung Park, Uiwang-si (KR); Eun-Sun Yu, Uiwang-si (KR); Mi-Young Chae, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/295,572

(22) Filed: Nov. 14, 2011

(65) Prior Publication Data

US 2012/0056171 A1 Mar. 8, 2012

Related U.S. Application Data

(63) Continuation of application No. PCT/KR2010/003071, filed on May 14, 2010.

(30) Foreign Application Priority Data

May 15, 2009 (KR) .................. 10-2009-0042706

(51) Int. Cl.
| | | |
|---|---|---|
| H01L 51/54 | (2006.01) | |
| C09K 11/06 | (2006.01) | |
| C07D 403/10 | (2006.01) | |
| C07D 403/14 | (2006.01) | |
| C07D 487/04 | (2006.01) | |
| C07D 251/24 | (2006.01) | |
| C07D 239/26 | (2006.01) | |

(52) U.S. Cl.
USPC ............ 428/690; 428/917; 313/502; 257/40; 257/E51.026; 544/180; 544/24

(58) Field of Classification Search
None
See application file for complete search history.

(56) References Cited

U.S. PATENT DOCUMENTS

| | | | |
|---|---|---|---|
| 5,698,740 | A | 12/1997 | Enokida et al. |
| 6,229,012 | B1 | 5/2001 | Hu et al. |
| 7,189,877 | B2 | 3/2007 | Nishiyama et al. |
| 2002/0182439 | A1 | 12/2002 | Tao et al. |
| 2007/0051944 | A1 | 3/2007 | Vestweber et al. |
| 2007/0141390 | A1 | 6/2007 | Coggan et al. |
| 2008/0036365 | A1 | 2/2008 | Miki et al. |
| 2009/0206742 | A1 | 8/2009 | Oda et al. |
| 2009/0261711 | A1 | 10/2009 | Ito et al. |
| 2010/0187978 | A1 | 7/2010 | Yu et al. |

FOREIGN PATENT DOCUMENTS

| | | |
|---|---|---|
| EP | 1400578 A1 | 3/2004 |
| EP | 1690847 A1 | 8/2006 |
| EP | 1752440 A1 | 2/2007 |
| JP | 07-145372 A | 6/1995 |
| JP | 2005-035919 A | 2/2005 |
| JP | 2005-085599 A | 3/2005 |
| JP | 2005-162660 A | 6/2005 |
| JP | 2005-239703 A | 9/2005 |
| JP | 2007-049055 A | 2/2007 |
| KR | 10-2004-0025826 A | 3/2004 |
| KR | 10-2007-0017733 A | 2/2007 |
| KR | 10-2008-0012015 A | 2/2008 |
| KR | 10-2008-0052589 A | 6/2008 |
| KR | 10-2008-0104997 A | 12/2008 |
| KR | 10-2009-0088309 A | 8/2009 |
| TW | 200910663 | 3/2009 |
| WO | WO-2007/108327 A1 | 9/2007 |

OTHER PUBLICATIONS

Son et al. "Analyzing Bipolar Carrier Transport Characteristics of Diarylamino-Substituted Heterocyclic Compounds in Organic Light-Emitting Diodes by Probing Electroluminescence Spectra" Chem. Mater. 2008, 20, 4439-4446. Date of on-line publication: Jun. 14, 2008.*

Tang, C. W., et al., "Organic electroluminescent diodes," *Applied Physics Letters*, vol. 51, No. 12, Sep. 21, 1987, pp. 913-915.

O'Brien, D.F., et al., "Improved energy transfer in electrophosphorescent devices," *Applied Physics Letters*, vol. 74, No. 3, Jan. 18, 1999, pp. 442-444.

Baldo, M. A., et al., "Very high-efficiency green organic light-emitting devices based on electrophosphorescence," *Applied Physics Letters*, vol. 75, No. 1, Jul. 5, 1999, pp. 4-6.

Analyzing Bipolar Carrier Transport Characteristics of Diarylamino-Substituted Heterocyclic Compounds in Organic Light-Emitting, etc., Kyung Soo Son, Chem. Mater., 2008, 20, 4439-4446.

European Search Report dated Jul. 24, 2013 and Chinese Office Action dated Jun. 15, 2013.

* cited by examiner

*Primary Examiner* — Andrew K Bohaty
(74) *Attorney, Agent, or Firm* — Lee & Morse, P.C.

(57) ABSTRACT

A compound for an organic photoelectric device, organic photoelectric device, and a display device, the compound being represented by the following Chemical Formula 1:

[Chemical Formula 1]

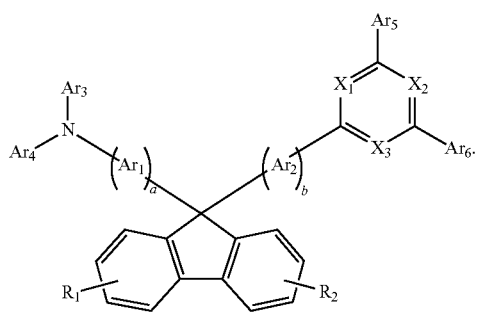

20 Claims, 4 Drawing Sheets

COMPOUND INCLUDING FLUORENYL GROUP FOR ORGANIC PHOTOELECTRIC DEVICE AND ORGANIC PHOTOELECTRIC DEVICE INCLUDING THE SAME

CROSS-REFERENCE TO RELATED APPLICATION

This application is a continuation of pending International Application No. PCT/KR2010/003071, entitled "Compound for Organic Photoelectric Device and Organic Photoelectric Device Including the Same," which was filed on May 14, 2010, the entire contents of which are hereby incorporated by reference.

BACKGROUND

1. Field

Embodiments relate to a compound for an organic photoelectric device and an organic photoelectric device including the same.

2. Description of the Related Art

An organic photoelectric device is, in a broad sense, a device for transforming photo-energy to electrical energy or a device for transforming electrical energy to photo-energy conversely. As examples, the organic photoelectric device may include an organic light emitting diode (OLED), a solar cell, a transistor, and the like. For example, an organic light emitting diode has recently drawn attention due to the increase in demand for flat panel displays.

When current is applied to an organic light emitting diode, holes are injected from an anode and electrons are injected from a cathode, then injected holes and electrons move to a respective hole transport layer (HTL) and electron transport layer (ETL) and recombine to form a light emitting exciton in an emission layer. The light emitting excitons generate light while shifting to a ground state. The light emission material may be classified as a fluorescent material (using singlet excitons) and a phosphorescent material (using triplet excitons) according to light emitting mechanism. The fluorescent and phosphorescent materials may be used for a light emitting source of an organic light emitting diode.

When electrons are transported from the ground state to the exited state, a singlet exciton may undergo non-light emitting transition to a triplet exciton through intersystem crossing, and the triplet exciton may be transited to the ground state to emit light. Such light emission is referred to as phosphorescent emission. When the triplet exciton is transited, it may not directly transit to the ground state. Therefore, it may be transited to the ground state after the electron spin is flipped. Accordingly, a half-life (light emitting time, lifetime) of phosphorescent emission is longer than that of fluorescent emission.

When holes and electrons are recombined to produce a light emitting exciton, three times as many triplet light emitting excitons may be produced, compared to the amount of the singlet light emitting excitons. A fluorescent material has 25% of the singlet-exited state and a limit in luminous efficiency. On the other hand, a phosphorescent material may utilize 75% of the triplet exited state and 25% of the singlet exited state, so it may theoretically reach 100% of the internal quantum efficiency. Accordingly, the phosphorescent light emitting material may have advantages of accomplishing around four times greater luminous efficiency than the fluorescent light emitting material.

SUMMARY

Embodiments are directed to a compound for an organic photoelectric device and an organic photoelectric device including the same.

The embodiments may be realized by providing a compound for an organic photoelectric device, the compound being represented by the following Chemical Formula 1:

[Chemical Formula 1]

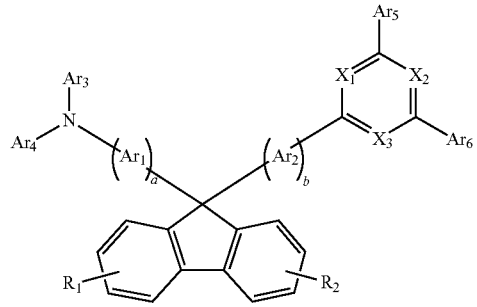

wherein, in Chemical Formula 1 $X_1$ to $X_3$ are each independently N or CR, in which R is hydrogen or a C1 to C10 alkyl group and provided that at least one of $X_1$ to $X_3$ is N, $Ar_1$ and $Ar_2$ are each independently a substituted or unsubstituted C6 to C18 arylene group, $Ar_3$ and $Ar_4$ are each a independently substituted or unsubstituted C1 to C30 alkyl group, a substituted or unsubstituted C1 to C30 alkylene group, a substituted or unsubstituted C6 to C30 aryl group, a substituted or unsubstituted C6 to C30 arylene group, a substituted or unsubstituted C2 to C30 heteroaryl group, a substituted or unsubstituted C2 to C30 heteroarylene group, or a combination thereof, or $Ar_3$ and $Ar_4$ are fused to each other to provide a fused ring, $Ar_5$ and $Ar_6$ are each independently substituted or unsubstituted C1 to C30 alkyl group, a substituted or unsubstituted C6 to C30 aryl group, a substituted or unsubstituted C2 to C30 heteroaryl group, or a combination thereof, $R_1$ and $R_2$ are each independently hydrogen or a C1 to C10 alkyl group, and a and b are each independently 1 or 2.

All of $X_1$ to $X_3$ of Chemical Formula 1 may be N.

$Ar_1$ and $Ar_2$ in Chemical Formula 1 may each independently be a phenylene group, a naphthylene group, an anthracenylene group, or a combination thereof.

$Ar_3$ to $Ar_6$ of Chemical Formula 1 may each independently be a phenyl group, a naphthyl group, an anthracenyl group, a phenanthrenyl group, a tetracenyl group, a pyrenyl group, a fluorenyl group, or a combination thereof.

$Ar_3$ to $Ar_6$ of Chemical Formula 1 may each independently be represented by one of the following Chemical Formulae 2a to 2c, or a combination thereof.

[Chemical Formula 2a]

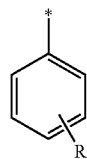

[Chemical Formula 2b]

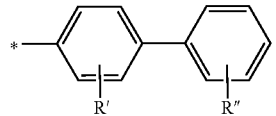

[Chemical Formula 2c]

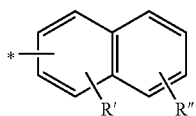

wherein, in Chemical Formulae 2a to 2c, R' and W' are each independently hydrogen, a C1 to C10 alkyl group, a C6 to C18 aryl group, or a combination thereof.

$Ar_5$ and $Ar_6$ in Chemical Formula 1 may each independently be furanyl, pyrrolyl, imidazolyl, thiazolyl, oxazolyl, oxadiazolyl, thiadiazolyl, triazolyl, triazinyl, pyridinyl, pyrimidinyl, pyridazinyl, pyrazinyl, quinolinyl, isoquinolinyl, or a combination thereof.

The compound for an organic photoelectric device represented by Chemical Formula 1 may be represented by the following Chemical Formula 3a or Chemical Formula 3b:

[Chemical Formula 3a]

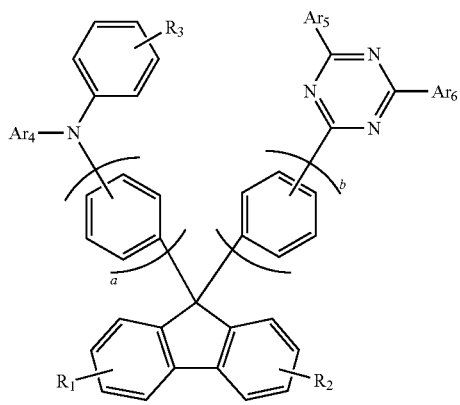

[Chemical Formula 3b]

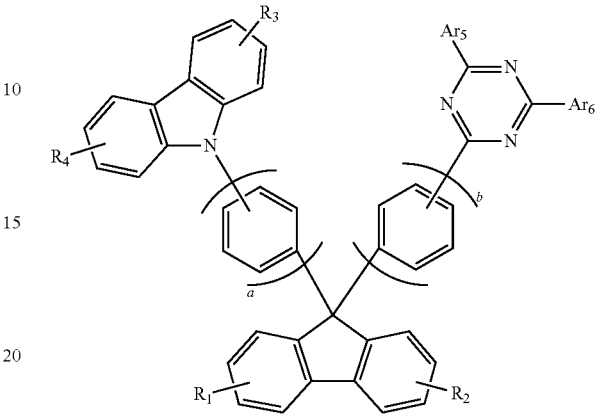

wherein, in Chemical Formulae 3a and 3b $Ar_4$ to $Ar_6$ are each independently a substituted or unsubstituted C1 to C30 alkyl group, a substituted or unsubstituted C6 to C30 aryl group, a substituted or unsubstituted C2 to C30 heteroaryl group, or a combination thereof, $R_1$ and $R_2$ are each independently hydrogen or a C1 to C10 alkyl group, $R_3$ and $R_4$ are each independently hydrogen, a C1 to C10 alkyl group, a C6 to C18 aryl group, or a combination thereof, and a and b are each independently 1 or 2.

The compound represented by Chemical Formula 1 may be represented by one of the following Chemical Formulae 4 to 35 and ad-1 to ad-4:

[Chemical Formula 4]

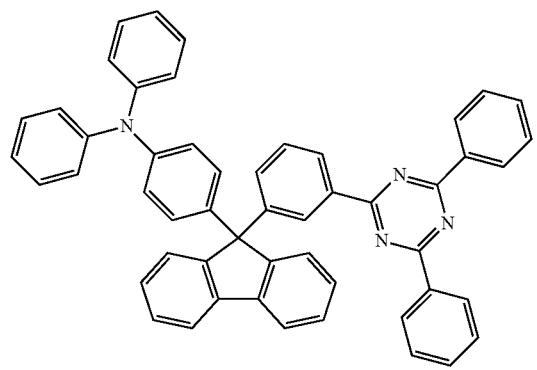

[Chemical Formula 5]

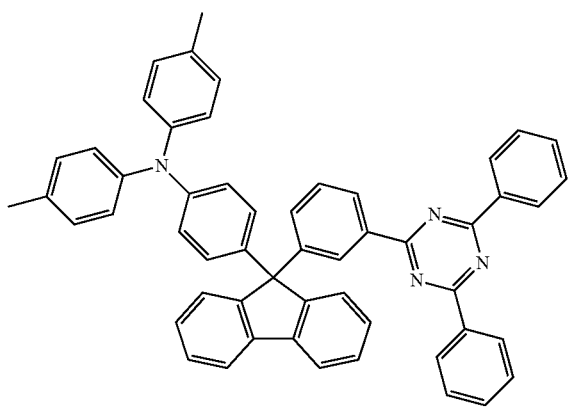

-continued
[Chemical Formula 6]
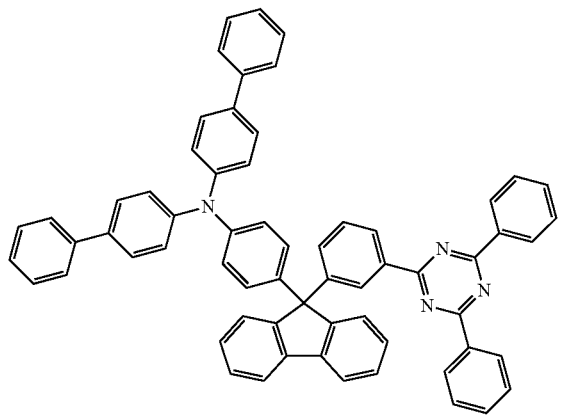
[Chemical Formula 7]
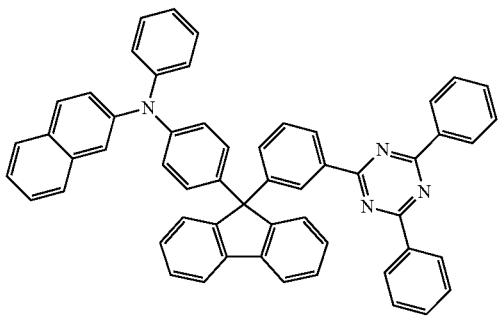
[Chemical Formula 8]
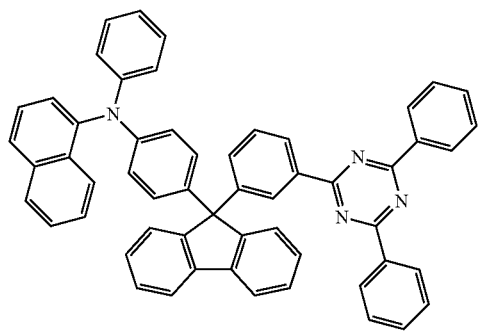
[Chemical Formula 9]
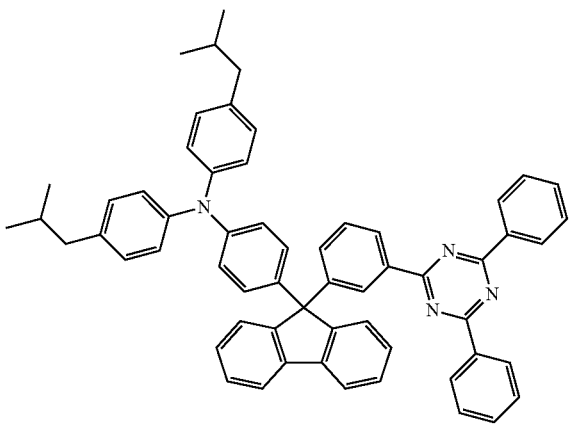
[Chemical Formula 10]
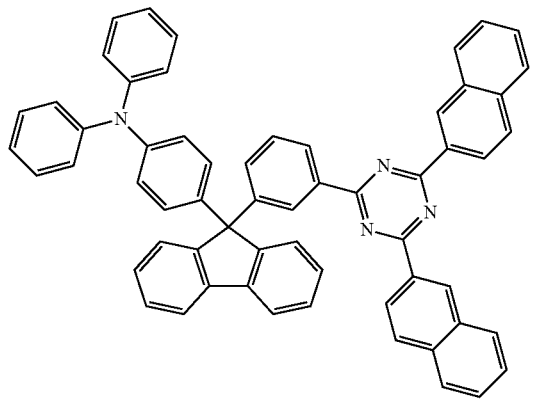
[Chemical Formula 11]
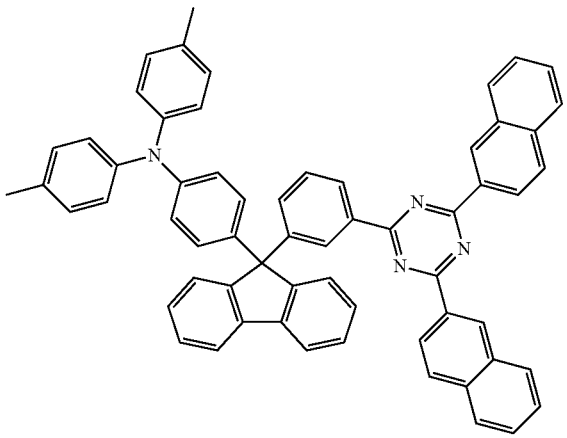

[Chemical Formula 12]
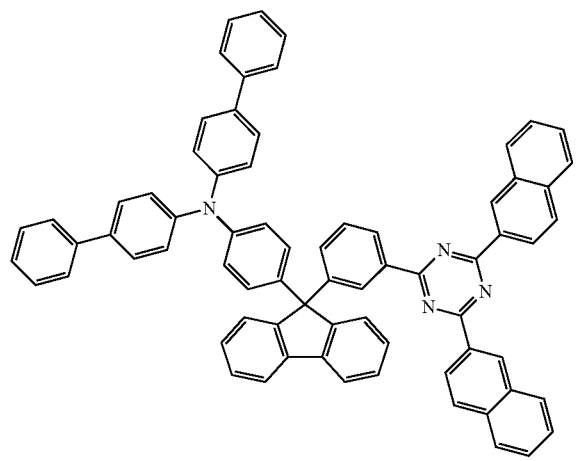
[Chemical Formula 13]
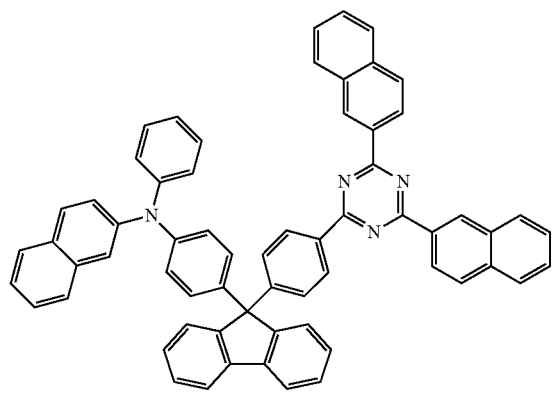
[Chemical Formula 14]
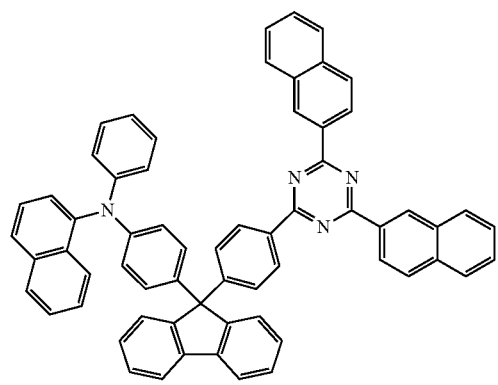
[Chemical Formula 15]
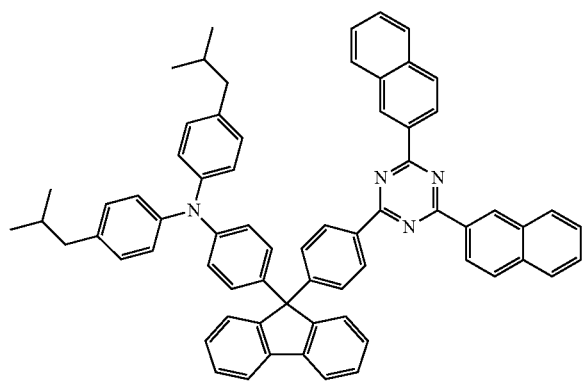
[Chemical Formula 16]
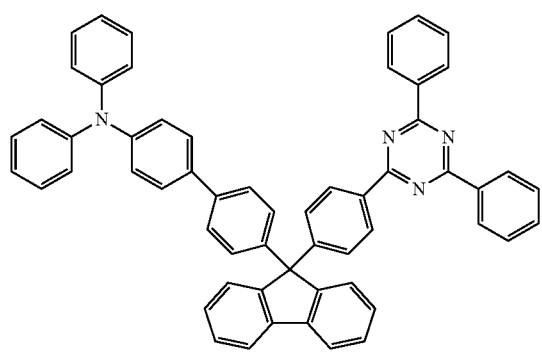
[Chemical Formula 17]
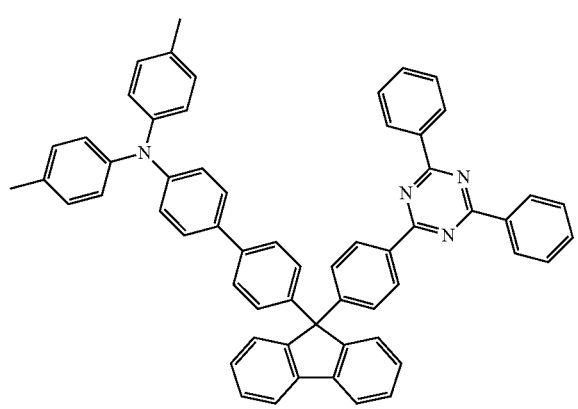

[Chemical Formula 18]
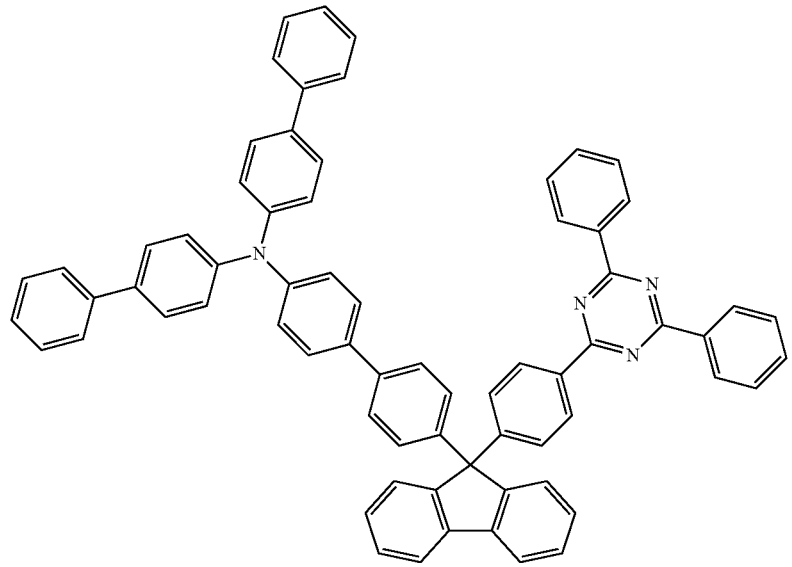
[Chemical Formula 19]
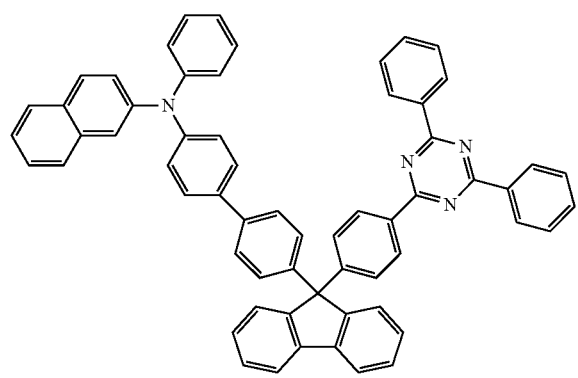
[Chemical Formula 20]
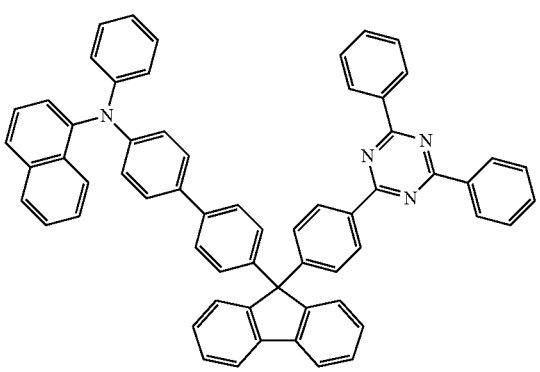
[Chemical Formula 21]
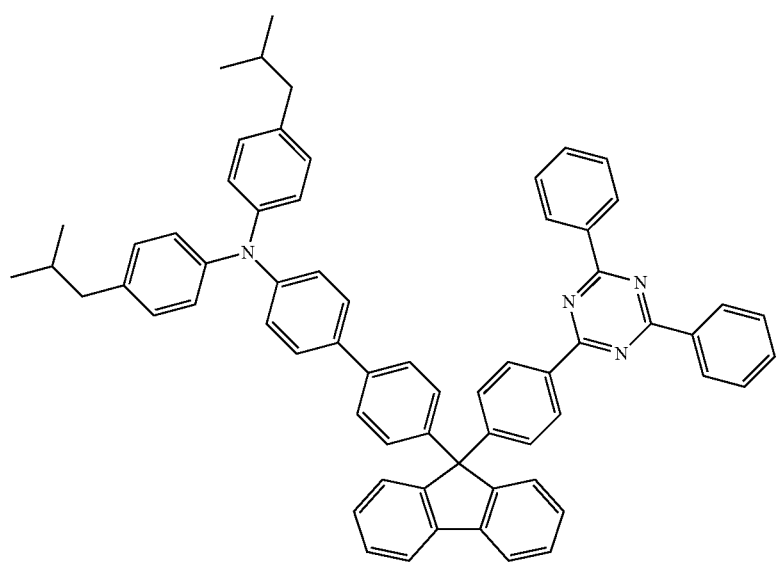

[Chemical Formula 22]
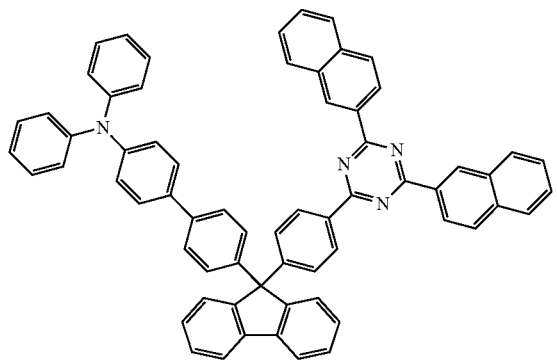
[Chemical Formula 23]
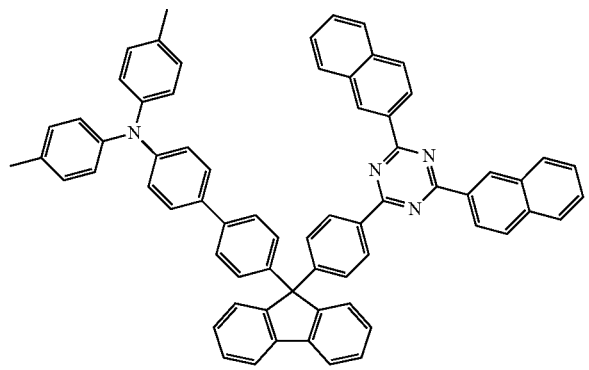
[Chemical Formula 24]
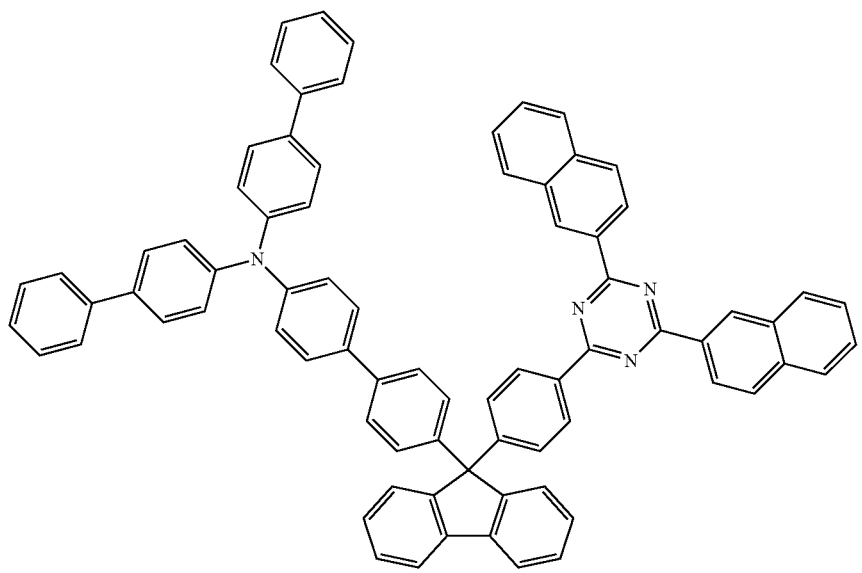
[Chemical Formula 25]
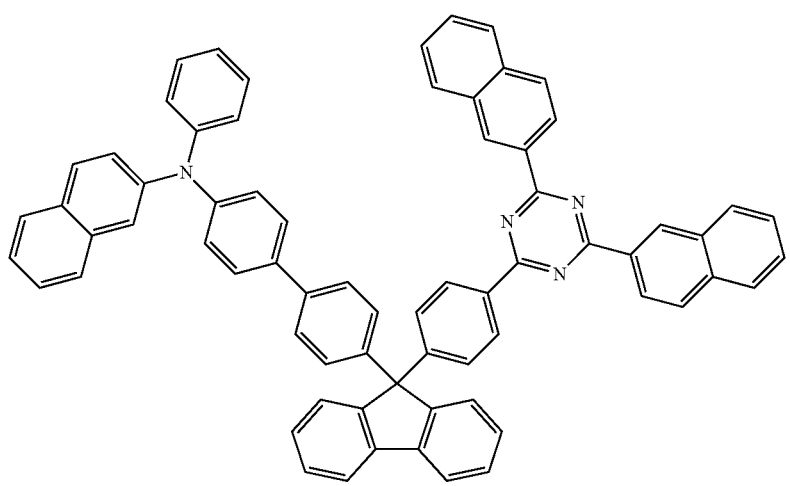

[Chemical Formula 26]
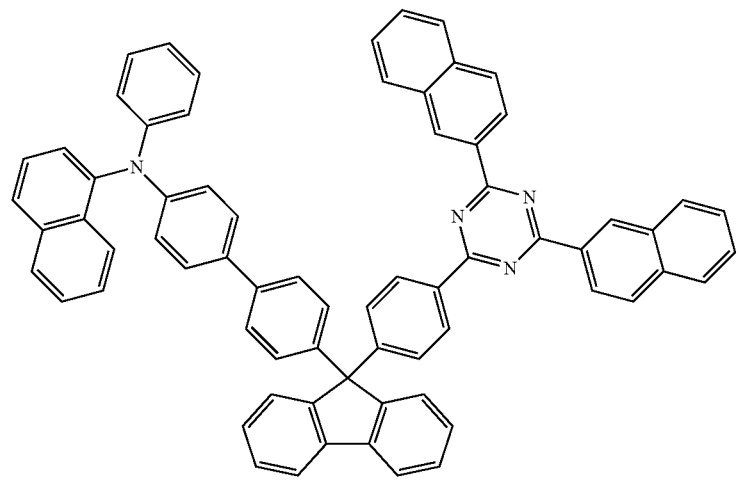
[Chemical Formula 27]
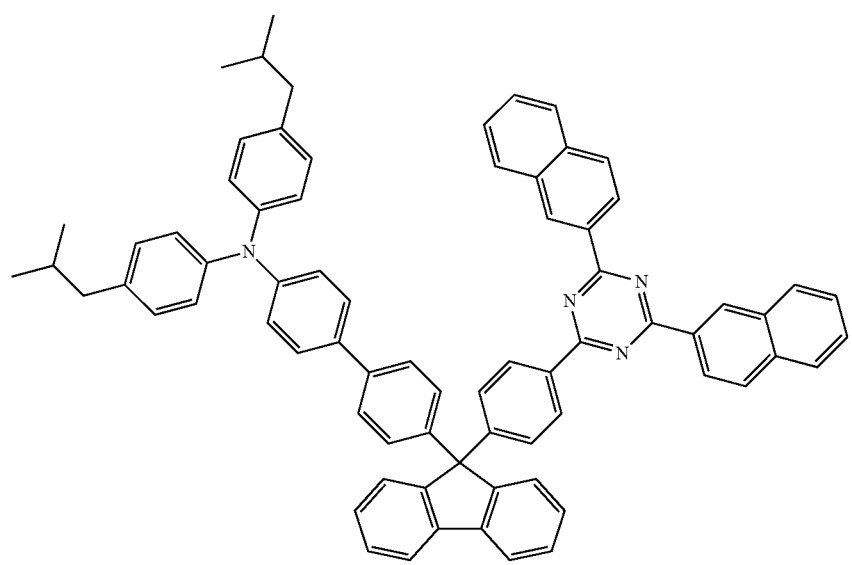
[Chemical Formula 28]
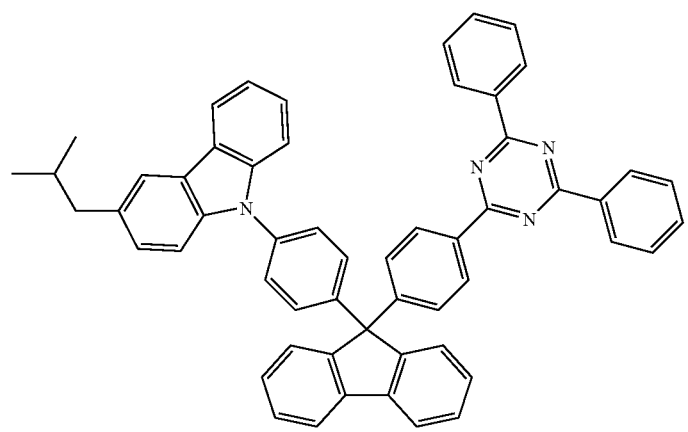

-continued
[Chemical Formula 29]
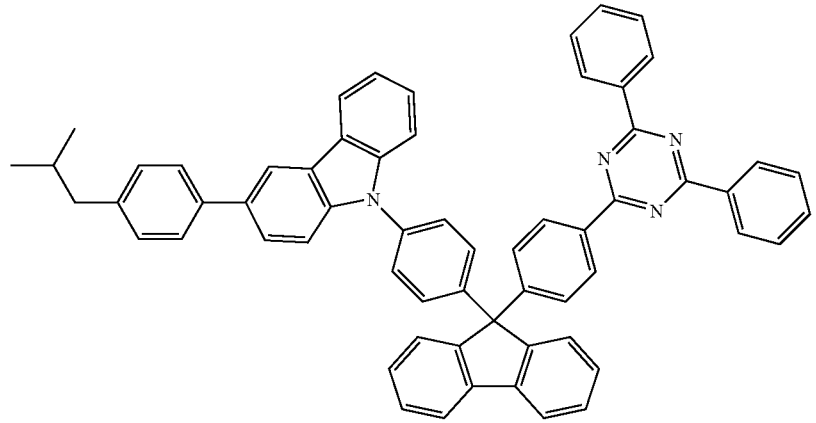
[Chemical Formula 30]
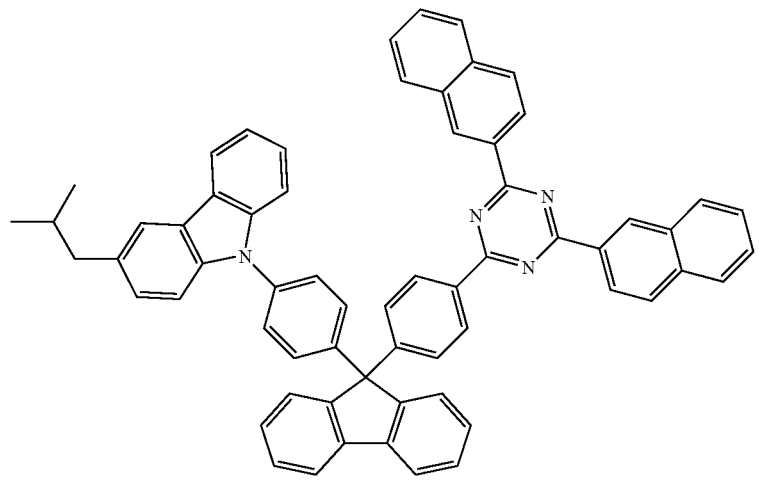
[Chemical Formula 31]
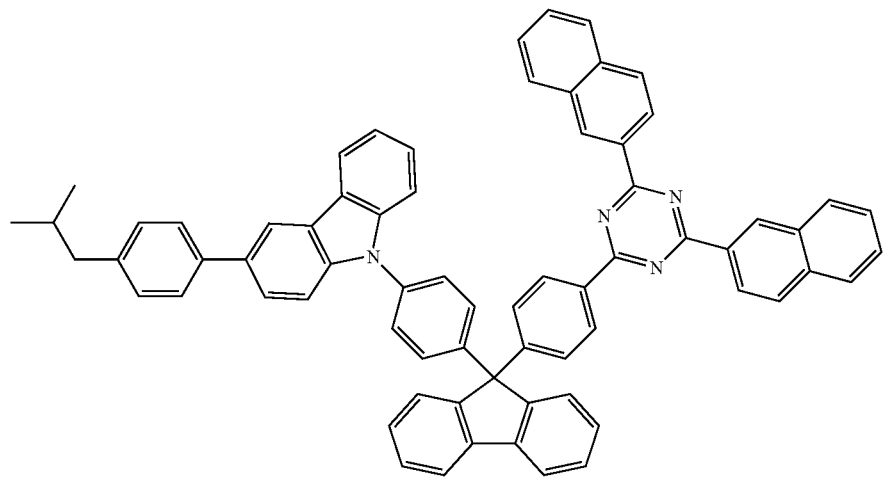

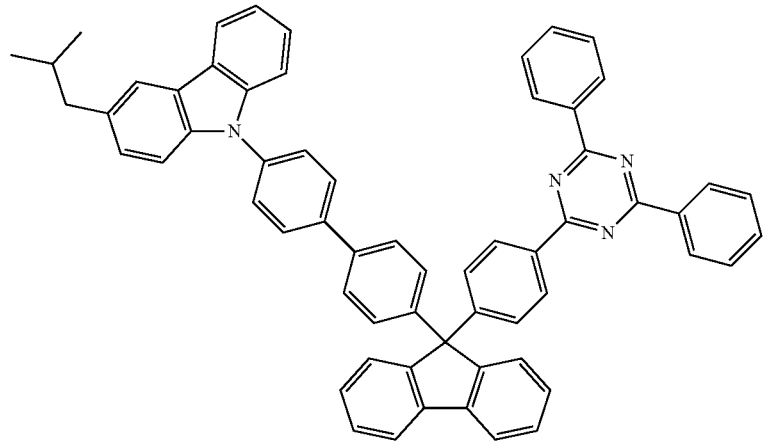
[Chemical Formula 32]
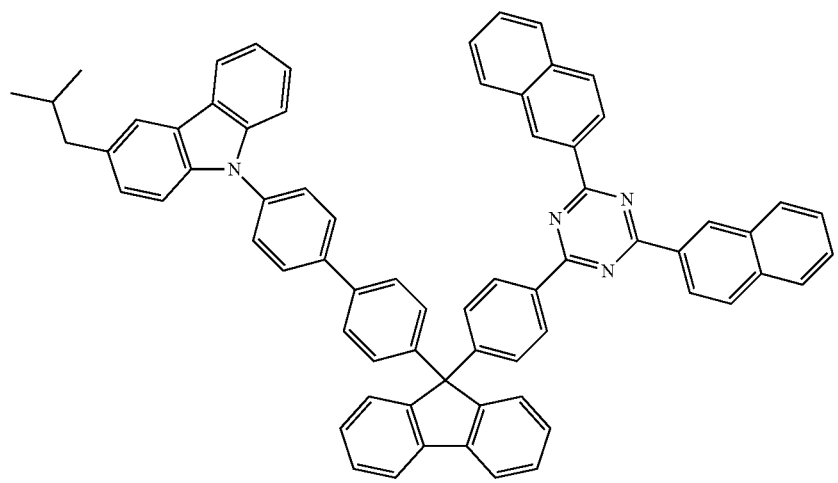
[Chemical Formula 33]
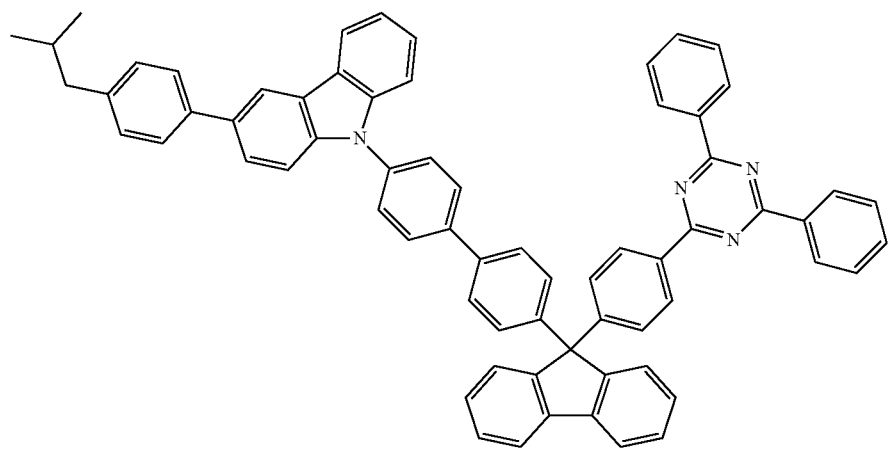
[Chemical Formula 34]

[Chemical Formula 35]
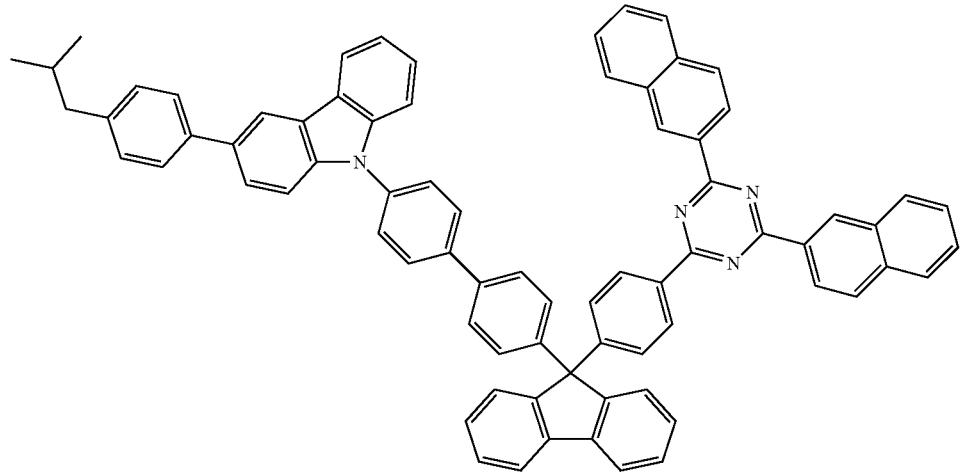
[Chemical Formula ad-1]
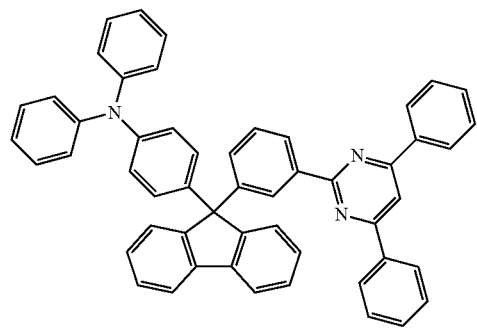
[Chemical Formula ad-2]
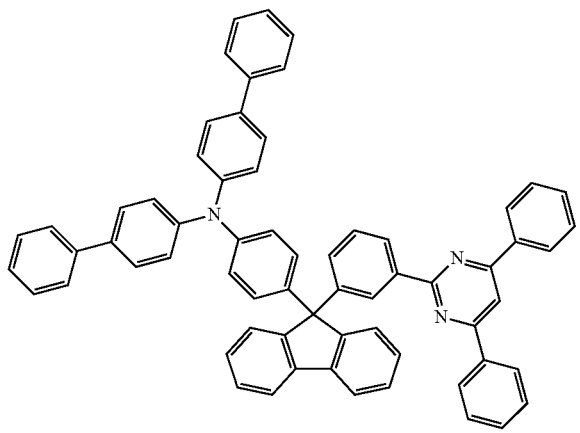
[Chemical Formula ad-3]
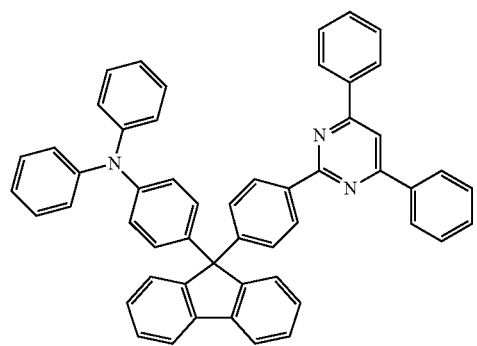
[Chemical Formula ad-4]
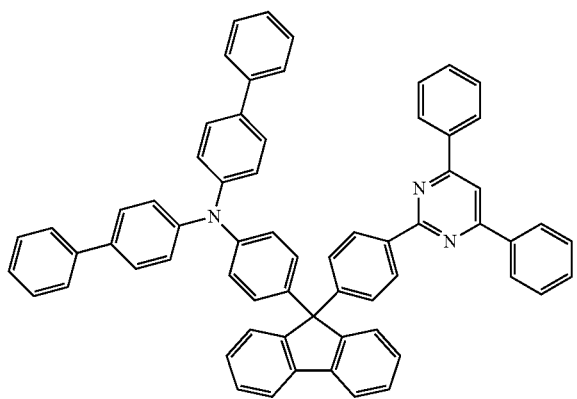

The compound for an organic photoelectric device may be a charge transport material or a host material.

The compound for an organic photoelectric device may have a glass transition temperature ($T_g$) of about 110° C. or higher and a thermal decomposition temperature (Td) of about 400° C. or higher.

The embodiments may also be realized by providing a compound for an organic photoelectric device, the compound being represented by the following Chemical Formula A-1:

[Chemical Formula A-1]

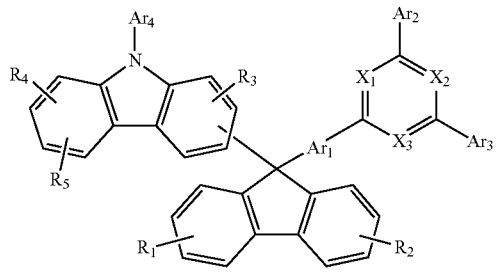

wherein, in Chemical Formula A-1 $X_1$ to $X_3$ are each independently N or CR, in which R is hydrogen or a C1 to C10 alkyl and provided that at least one of $X_1$ to $X_3$ is N, $Ar_1$ is a single bond or a substituted or unsubstituted C6 to C18 arylene group, $Ar_2$ to $Ar_4$ are each independently a substituted or unsubstituted C1 to C30 alkyl group, a substituted or unsubstituted C6 to C30 aryl group, a substituted or unsubstituted C2 to C30 heteroaryl group or a combination thereof, $R_1$ to $R_3$ are each independently hydrogen or a C1 to C10 alkyl group, and $R_4$ and $R_5$ are each independently hydrogen, a substituted or unsubstituted C1 to C30 alkyl group, a substituted or unsubstituted C6 to C30 aryl group, a substituted or unsubstituted C2 to C30 heteroaryl group, or a combination thereof, or $R_4$ and $R_5$ are fused to an adjacent ring to provide a fused ring.

All of $X_1$ to $X_3$ of Chemical Formula A-1 may be N.

$Ar_1$ in Chemical Formula A-1 may be a phenylene group, a naphthylene group, an anthracenylene group, or a combination thereof.

$Ar_2$ to $Ar_4$ in Chemical Formula A-1 may each independently be represented by one of the following Chemical Formulae 2a to 2c, or combination thereof:

[Chemical Formula 2a]

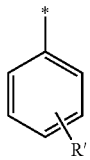

[Chemical Formula 2b]

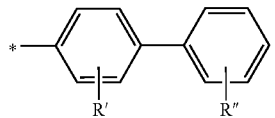

[Chemical Formula 2c]

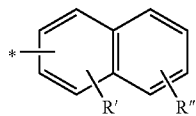

wherein, in Chemical Formula 2a to 2c, R' and R" are each independently hydrogen, a C1 to C10 alkyl group, a C6 to C18 aryl group, or a combination thereof.

$Ar_2$ and $Ar_3$ in Chemical Formula A-1 may each independently be furanyl, pyrrolyl, imidazolyl, thiazolyl, oxazolyl, oxadiazolyl, thiadiazolyl, triazolyl, triazinyl, pyridinyl, pyrimidinyl, pyridazinyl, pyrazinyl, quinolinyl, isoquinolinyl, or a combination thereof.

The compound represented by Chemical Formula A-1 may be represented by one of the following Chemical Formulae ad-5 to ad-24:

[Chemical Formula ad-5]

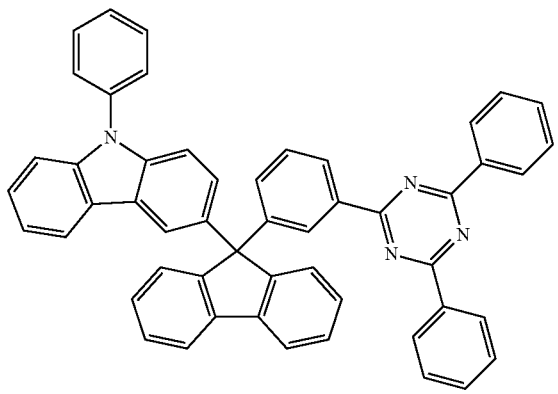

[Chemical Formula ad-6]

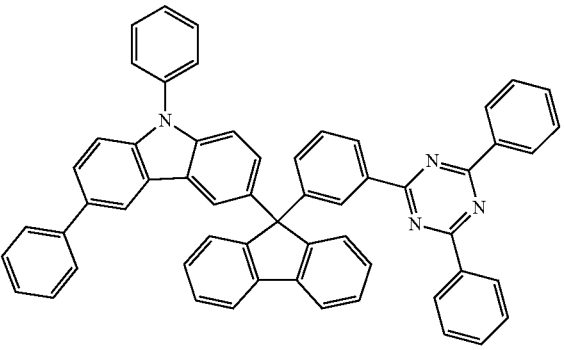

[Chemical Formula ad-7]

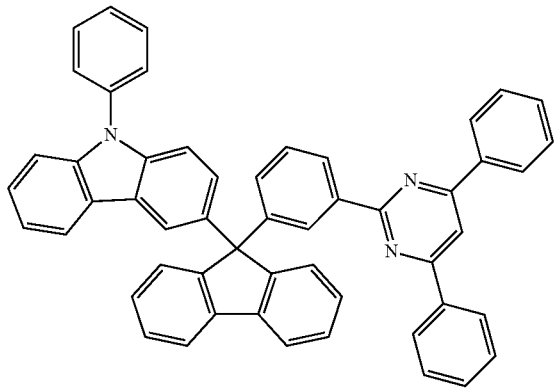

[Chemical Formula ad-8]
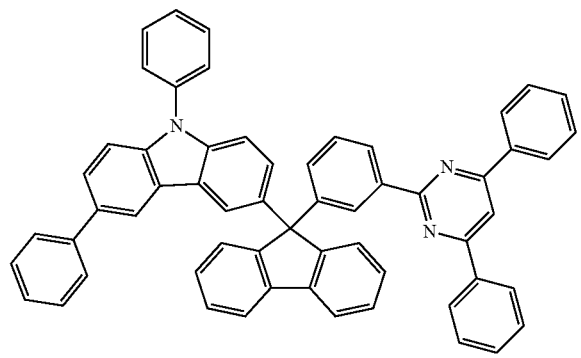
[Chemical Formula ad-9]
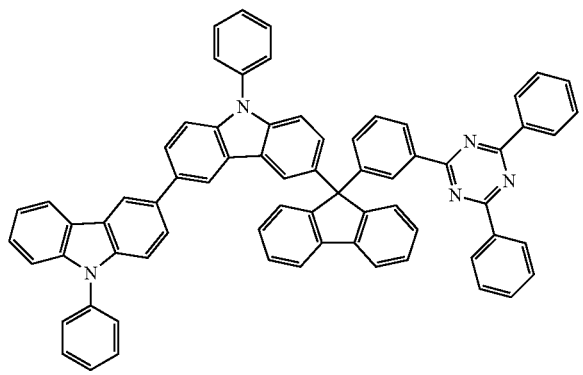
[Chemical Formula ad-10]
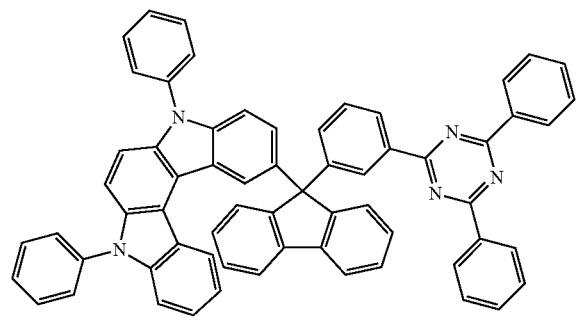
[Chemical Formula ad-11]
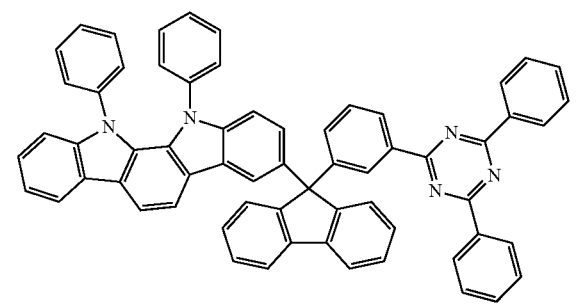
[Chemical Formula ad-12]
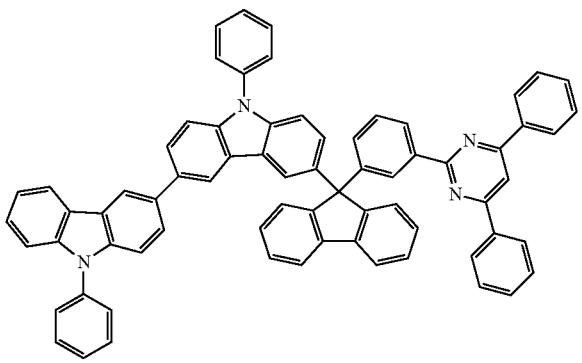
[Chemical Formula ad-13]
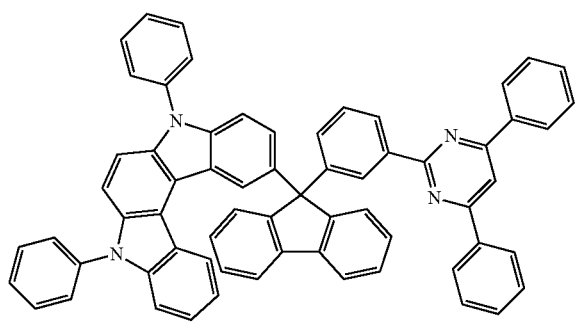
[Chemical Formula ad-14]
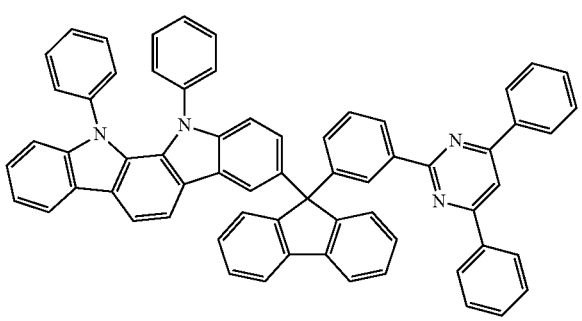
[Chemical Formula ad-15]
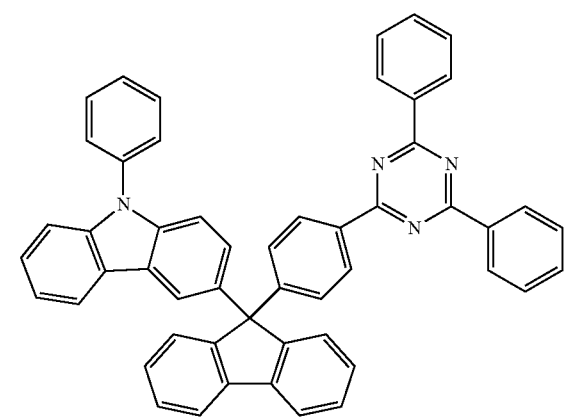

[Chemical Formula ad-16]
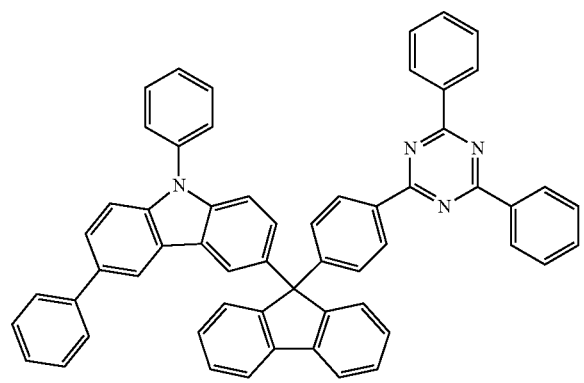
[Chemical Formula ad-17]
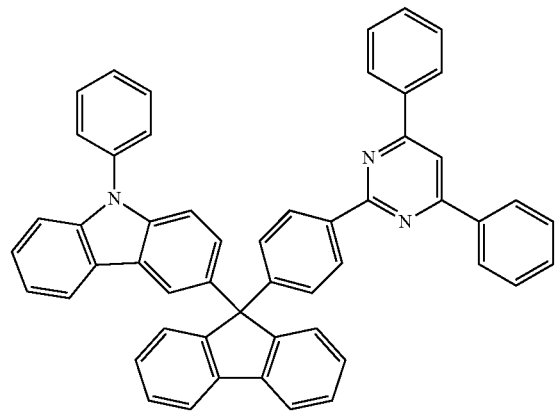
[Chemical Formula ad-18]
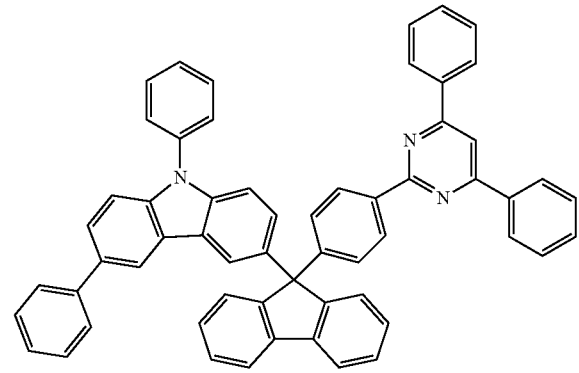
[Chemical Formula ad-19]
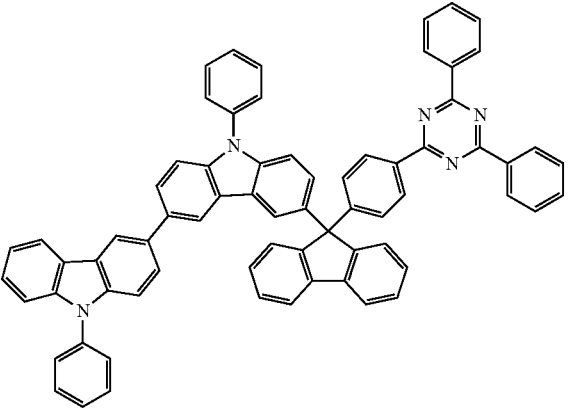
[Chemical Formula ad-20]
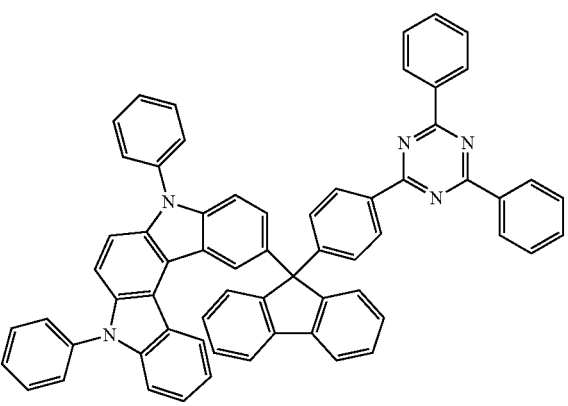
[Chemical Formula ad-21]
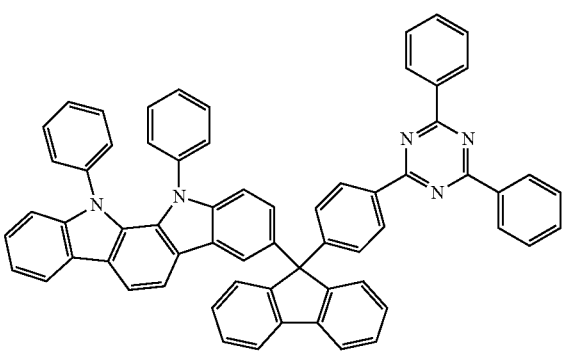
[Chemical Formula ad-22]
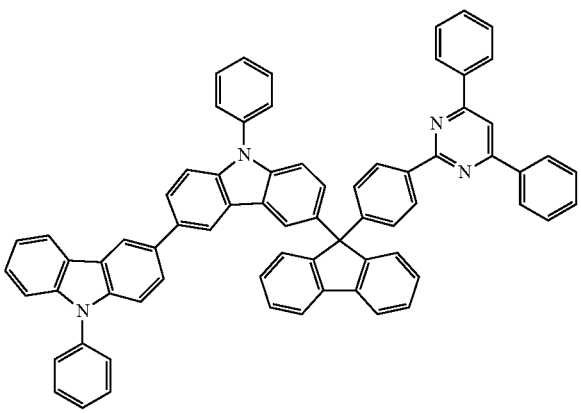

[Chemical Formula ad-23]

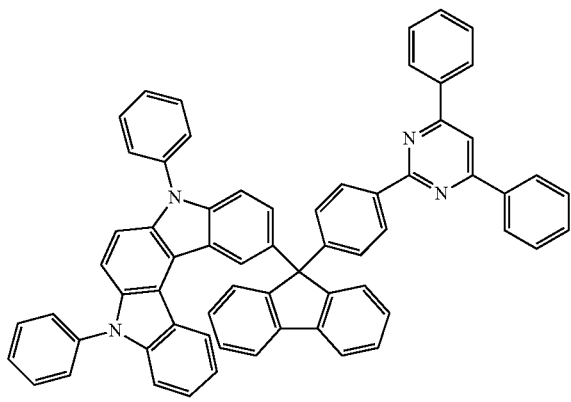

[Chemical Formula ad-24]

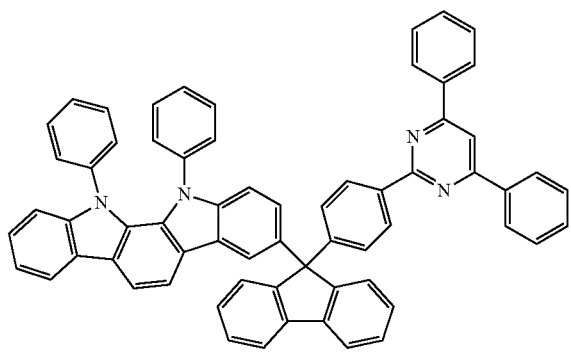

The embodiments may also be realized by providing an organic photoelectric device including an anode; a cathode; and an organic thin layer between the anode and the cathode, wherein the organic thin layer includes the compound for an organic photoelectric device according to an embodiment.

The organic thin layer may include an emission layer, a hole transport layer (HTL), a hole injection layer (HIL), a hole blocking layer, an electron transport layer (ETL), an electron injection layer (EIL), an electron blocking layer, or a combination thereof.

The organic thin layer may further include a dopant.

The embodiments may also be realized by providing a display device including the organic photoelectric device according to an embodiment.

BRIEF DESCRIPTION OF THE DRAWINGS

The embodiments will become apparent to those of ordinary skill in the art by describing in detail exemplary embodiments with reference to the attached drawings, in which.

DETAILED DESCRIPTION

Figure 1:
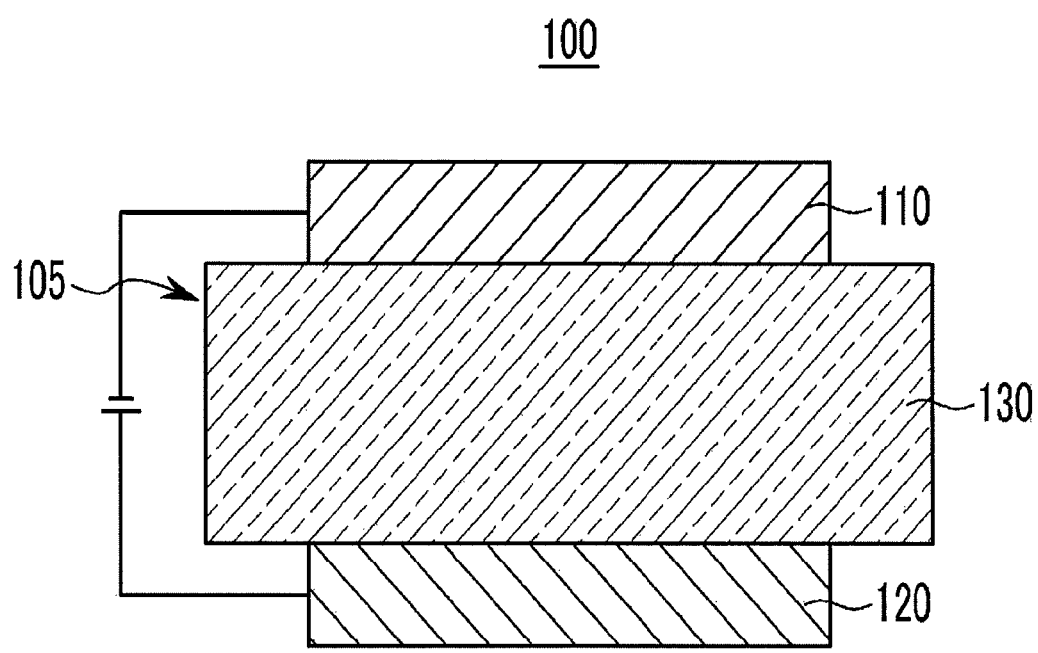
FIGS. 1 to 5 illustrate cross-sectional views showing organic photoelectric devices including compounds according to various embodiments.

Korean Patent Application No. 10-2009-0042706, filed on May 15, 2009, in the Korean Intellectual Property Office, and entitled: "Compound for Organic Photoelectric Device and Organic Photoelectric Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

In the present specification, the term "substituted", when a definition is not otherwise provided, may refer to one substituted with a C1 to C30 alkyl group; a C1 to C10 alkylsilyl group; a C3 to C30 cycloalkyl group; a C6 to C30 aryl group; a C1 to C10 alkoxy group; a fluoro group, a C1 to C10 trifluoroalkyl group such as a trifluoromethyl group, and the like; or a cyano group.

In the present specification, the term "hetero", when a definition is not otherwise provided, may refer to one including 1 to 3 of N, O, S, and P, and remaining carbons in a compound or a substituent.

In the present specification, the term "combination thereof", when a definition is not otherwise provided, may refer to at least two substituents bound to each other, or at least two substituents condensed to each other.

In the specification, the term "alkyl group" when a definition is not otherwise provided, refers to a "saturated alkyl group" that does not include any alkene group or alkyne group; or an "unsaturated alkyl group" that includes at least one alkene group or alkyne group. The term "alkene group" refers to a group in which at least two carbon atoms are bound with at least one carbon-carbon double bond, and the term "alkyne group" refers to a group in which at least two carbon atoms are bound with at least one carbon-carbon triple bond. The alkyl group may be branched, linear, or cyclic.

The alkyl group may include a C1 to C20 alkyl group, e.g., a C1 to C6 lower alkyl group, a C7 to C10 middle alkyl group, or a C11 to C20 higher alkyl group.

For example, a C1 to C4 alkyl group may include 1 to 4 carbon in an alkyl chain and may be selected from the group of methyl, ethyl, propyl, iso-propyl, n-butyl, iso-butyl, sec-butyl, and t-butyl.

Examples of an alkyl group may include a methyl group, an ethyl group, a propyl group, an isopropyl group, a butyl group, an isobutyl group, a t-butyl group, a pentyl group, a hexyl group, an ethenyl group, a propenyl group, a butenyl group, a cyclopropyl group, a cyclobutyl group, a cyclopentyl group, a cyclohexyl group, and the like.

The term "aromatic group" may refer to a cyclic functional group where all elements have conjugated p-orbitals. Examples of the aromatic group include an aryl group and a heteroaryl group.

The term "aryl" group may refer to a monocyclic or fused cyclic substituent where adjacent pairs of carbon atoms are shared.

The term "heteroaryl group" may refer to an aryl group including 1 to 3 heteroatoms selected from N, O, S, and P, and remaining carbon. When the heteroaryl group is a fused ring, each ring may include 1 to 3 heteroatoms.

The term "spiro structure" may refer to a cyclic structure having a common carbon contact point. The term Spiro structure may refer to a compound or substituent having a spiro structure.

An embodiment provides a compound for an organic photoelectric device, the compound being represented by the following Chemical Formula 1 or Chemical Formula A-1.

[Chemical Formula 1]

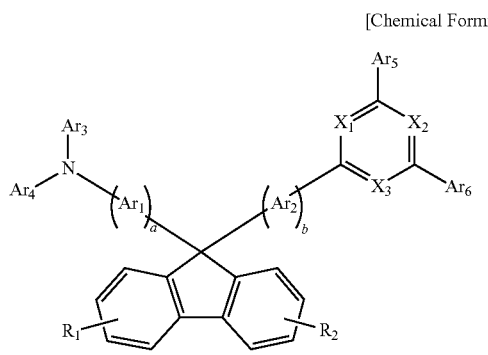

In Chemical Formula 1, $X_1$ to $X_3$ may each independently be N or CR, in which R may be hydrogen or a C1 to C10 alkyl group. In an implementation, at least one of $X_1$ to $X_3$ is N.

$Ar_1$ and $Ar_2$ may each independently be a substituted or unsubstituted C6 to C18 arylene group.

$Ar_3$ and $Ar_4$ may each independently be a substituted or unsubstituted C1 to C30 alkyl group, a substituted or unsubstituted C1 to C30 alkylene group, a substituted or unsubstituted C6 to C30 aryl group, a substituted or unsubstituted C6 to C30 arylene group, a substituted or unsubstituted C2 to C30 heteroaryl group, a substituted or unsubstituted C2 to C30 heteroarylene group, or a combination thereof. In an implementation, $Ar_3$ and $Ar_4$ may be fused to each other to provide a fused ring. For example, $Ar_3$ and $Ar_4$ may be fused to each other to form a carbazolyl group with the N (see, e.g., Chemical Formula 29, below)

$Ar_5$ and $Ar_6$ may each independently be a substituted or unsubstituted C1 to C30 alkyl group, a substituted or unsubstituted C6 to C30 aryl group, a substituted or unsubstituted C2 to C30 heteroaryl group, or a combination thereof.

$R_1$ and $R_2$ may each independently be hydrogen or a C1 to C10 alkyl group.

a and b may each independently be 1 or 2.

[Chemical Formula A-1]

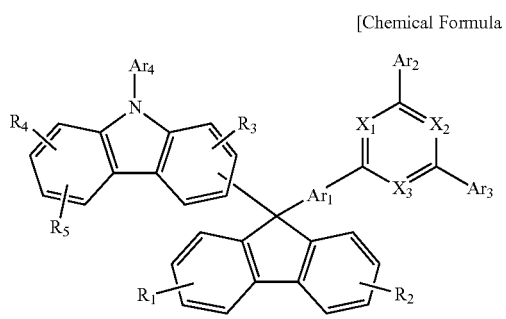

In Chemical Formula A-1, $X_1$ to $X_3$ may each independently be N or CR, in which R may be hydrogen or a C1 to C10 alkyl group. In an implementation, at least one of $X_1$ to $X_3$ is N.

$Ar_1$ may be a single bond or a substituted or unsubstituted C6 to C18 arylene group.

$Ar_2$ to $Ar_4$ may each independently be a substituted or unsubstituted C1 to C30 alkyl group, a substituted or unsubstituted C6 to C30 aryl group, a substituted or unsubstituted C2 to C30 heteroaryl group, or a combination thereof.

$R_1$ to $R_3$ may each independently be hydrogen or a C1 to C10 alkyl group.

$R_4$ and $R_5$ may each independently be hydrogen, a substituted or unsubstituted C1 to C30 alkyl group, a substituted or unsubstituted C6 to C30 aryl group, a substituted or unsubstituted C2 to C30 heteroaryl group, or a combination thereof. In an implementation, $R_4$ and $R_5$ may be fused to an adjacent ring to provide a fused ring.

The compound represented by the above Chemical Formula 1 or Chemical Formula A-1 may include a substituent represented by the following Chemical Formula 1a or a carbazolyl group; and a substituent represented by the following Chemical Formula 1b and thus, may have bipolar characteristic of effectively transporting both holes and electrons.

[Chemical Formula 1a]

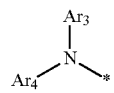

[Chemical Formula 1b]

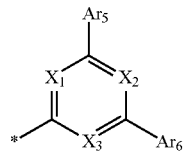

In Chemical Formulae 1a and 1b, $X_1$ to $X_3$ and $Ar_3$ to $Ar_6$ may be the same as defined in Chemical Formula 1.

For example, the substituent represented by the above Chemical Formula 1a or the carbazolyl group may play a role of a group for injecting and transporting a hole, while the substituent represented by the above Chemical Formula 1b may play a role of a group for injecting and transporting an electron. The group for injecting and transporting a hole may have a conductivity characteristic along a HOMO level and thus, may deliver and inject a hole produced from an anode into an emission layer. The group for injecting and transporting an electron may have a conductivity characteristic along a LUMO level and thus, may deliver and inject a hole produced from a cathode into an emission layer.

Accordingly, the compound for an organic photoelectric device according to an embodiment may have a bipolar characteristic. For example, the compound for an organic photoelectric device may be amphiphilic and thus, may exhibit excellent interface characteristics and charge transporting capability in an emission layer of the organic photoelectric device, in which holes are combined with electrons.

Furthermore, the substituent represented by the above Chemical Formula 1a or the carbazolyl group; and the other substituent represented by Chemical Formula 1b may not be conjugated with each other and thus, may have little or no influence on each other's inherent hole-injecting and transporting and electron-injecting and transporting characteristics, even when these substituents are included in a single compound. A compound with a long conjugated structure may have an energy level change, which may change hole and electron injection/transportation characteristics thereof. However, the compound for an organic photoelectric device according to an embodiment may include the substituent represented by the above Chemical Formula 1a or the carbazolyl group; as well as the other substituent represented by Chemical Formula 1b (which are not conjugated) and thus, may exhibit excellent bipolar characteristics.

In addition, the compound that simultaneously includes the substituent represented by the above Chemical Formula 1a or the carbazolyl group and the substituent represented by Chemical Formula 1b may have an asymmetrical structure, thereby helping prevent crystallization thereof. For example, the compound for an organic photoelectric device according to an embodiment may be usefully applied as a host material, hole transport material, or an electron transport material, with excellent thermal stability.

As noted above, in Chemical Formula 1 and Chemical Formula A-1, $X_1$ to $X_3$ may each independently be N or CR, in which R may be hydrogen or a C1 to C10 lower alkyl group. In an implementation, at least one of $X_1$ to $X_3$ may be N. Herein, when all of the $X_1$ to $X_3$ are N, the compound may more effectively transport electrons.

In an implementation, the C6 to C18 arylene group of $Ar_1$ and $Ar_2$ of Chemical Formula 1 and $Ar_1$ of Chemical Formula A-1 may be, e.g., a phenylene group, a naphthylene group, an anthracenylene group, or a combination thereof. However, the C6 to C18 arylene group is not limited thereto.

When $Ar_3$ to $Ar_6$ in the above Chemical Formula 1 and $Ar_2$ to $Ar_4$ in the above Chemical Formula A-1 are each independently an aryl group, the compound according to an embodiment may include a C1 to C10 alkyl group, a C6 to C18 aryl group, or a combination thereof as a substituent and thus, may maintain solubility properties in a solvent as well as stable bipolar characteristics.

In an implementation, the aryl group of $Ar_3$ to $Ar_6$ of Chemical Formula 1 and $Ar_2$ to $Ar_4$ of Chemical Formula A-1 may be, e.g., a phenyl group, a naphthyl group, an anthracenyl group, a phenanthrenyl group, a tetracenyl group, a pyrenyl group, a fluorenyl group, or a combination thereof. However, the aryl group is not limited thereto.

In another implementation, the aryl group of $Ar_3$ to $Ar_6$ of Chemical Formula 1 and $Ar_2$ to $Ar_4$ of Chemical Formula A-1 may include a substituent represented by one of the following Chemical Formulae 2a to 2c, or a combination thereof.

[Chemical Formula 2a]

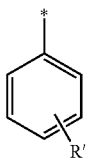

[Chemical Formula 2b]

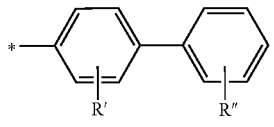

[Chemical Formula 2c]

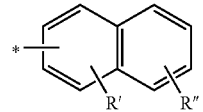

In Chemical Formulae 2a to 2c, R' and R" may each independently be hydrogen, a C1 to C10 alkyl group, a C6 to C18 aryl group, or a combination thereof.

In an implementation, R' in the above Chemical Formula 2a may be bound at a para-position.

In an implementation, a heteroaryl group of $Ar_5$ and $Ar_6$ in Chemical Formula 1 and a heteroaryl group of $Ar_2$ and $Ar_3$ in Chemical Formula A-1 may include 1 to 3 hetero atoms of N, O, S, P, or a combination thereof in each cyclic group, and a remaining carbon. However, the heteroaryl group is not limited thereto. In an implementation, the heteroaryl group may include N and thus, may help the substituent represented by Chemical Formula 1b to better transport electrons. Examples of the heteroaryl group of $Ar_5$ and $Ar_6$ in Chemical Formula 1 may include furanyl, pyrrolyl, imidazolyl, thiazolyl, oxazolyl, oxadiazolyl, thiadiazolyl, triazolyl, triazinyl, pyridinyl, pyrimidinyl, pyridazinyl, pyrazinyl, quinolinyl, isoquinolinyl, or a combination thereof. However, the heteroaryl group is not limited thereto.

The compound for an organic photoelectric device represented by Chemical Formula 1 may be represented by one of the following Chemical Formula 3a or Chemical Formula 3b.

[Chemical Formula 3a]

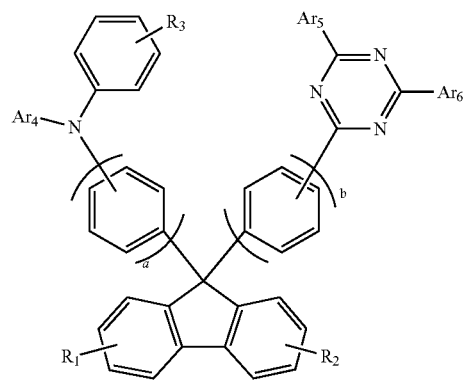

[Chemical Formula 3b]

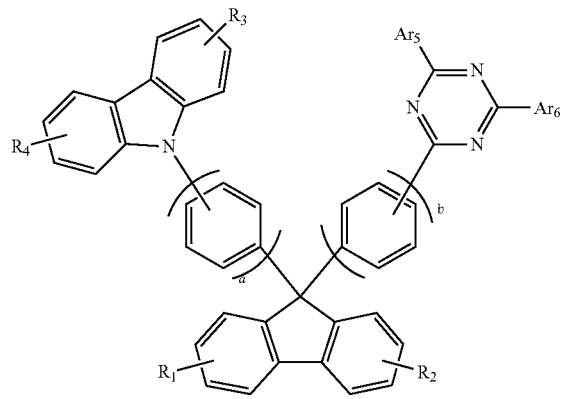

In Chemical Formulae 3a and 3b, $Ar_4$ to $Ar_6$ may each independently be a substituted or unsubstituted C1 to C30 alkyl group, a substituted or unsubstituted C6 to C30 aryl group, a substituted or unsubstituted C2 to C30 heteroaryl group, or a combination thereof.

$R_1$ and $R_2$ may each independently be hydrogen or a C1 to C10 alkyl group.

$R_3$ and $R_4$ may each independently be hydrogen, a C1 to C10 alkyl group, a C6 to C18 aryl group, or a combination thereof.

a and b may each independently be 1 or 2.

The compound for an organic photoelectric device represented by Chemical Formula 1 may be represented by one of Chemical Formulae 4 to 35 and Chemical Formulae ad-1 to ad-4, below. However, the embodiments are not limited thereto.

[Chemical Formula 4]
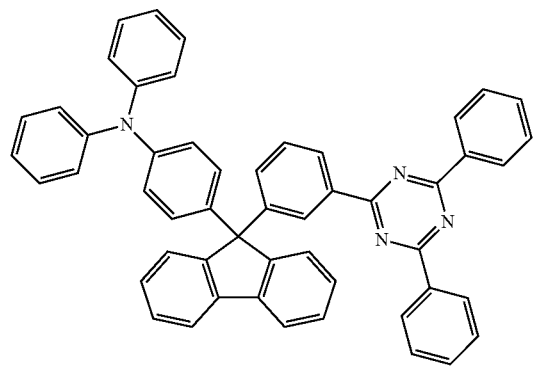
[Chemical Formula 5]
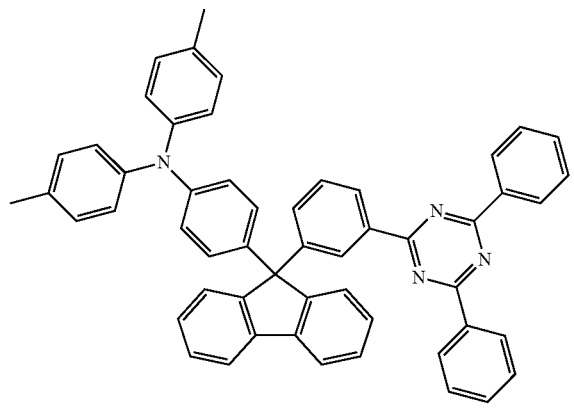
[Chemical Formula 6]
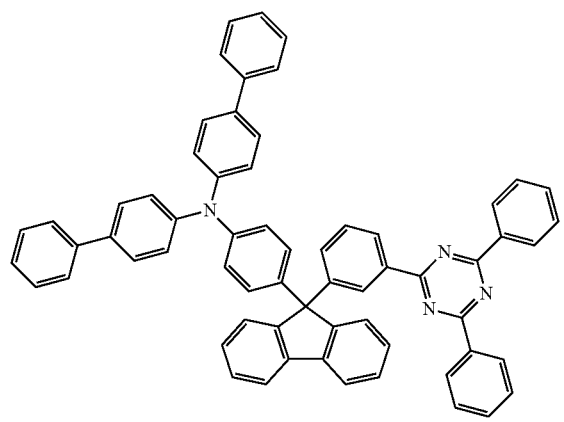
[Chemical Formula 7]
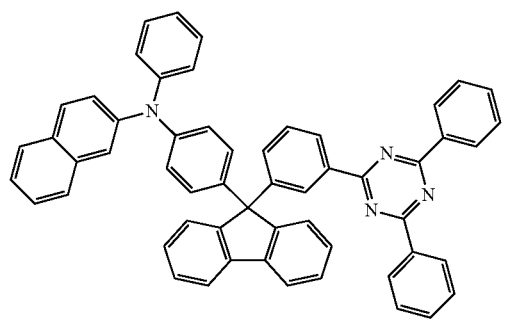
[Chemical Formula 8]
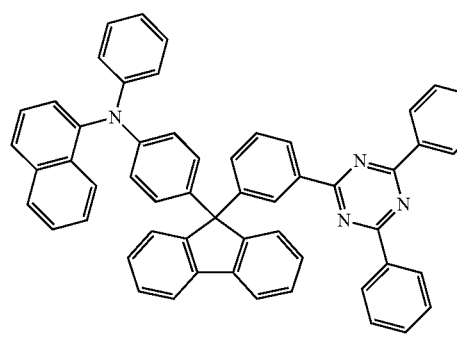
[Chemical Formula 9]
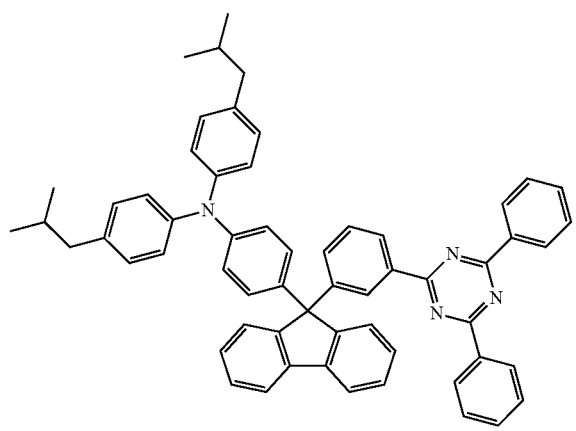

-continued
[Chemical Formula 10]
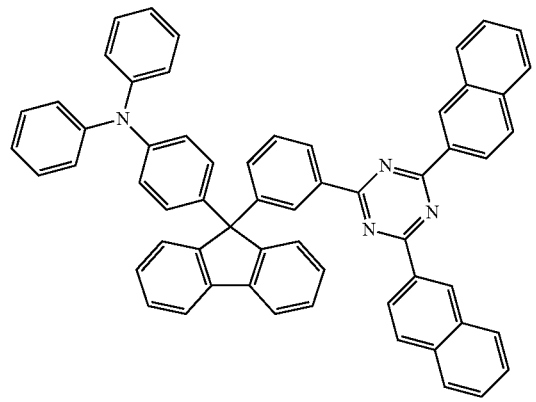
[Chemical Formula 11]
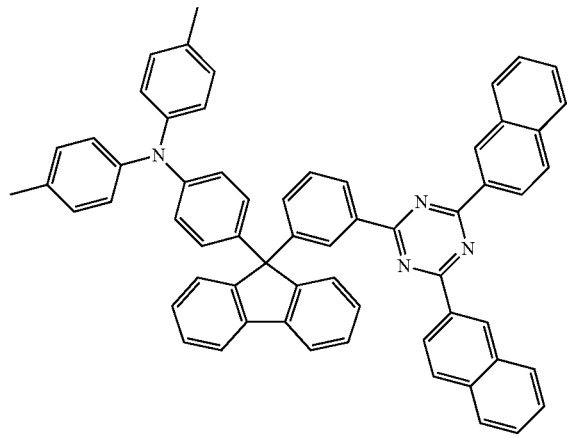
[Chemical Formula 12]
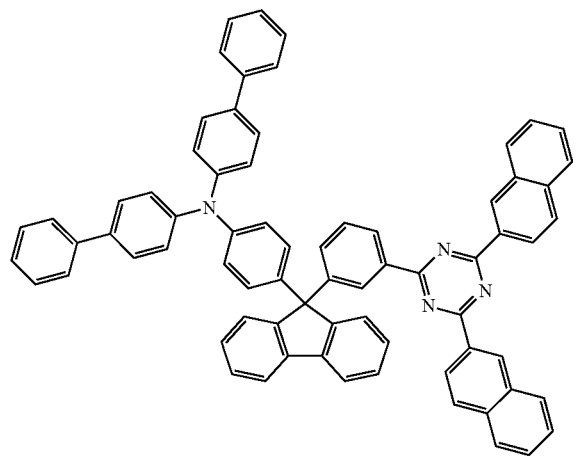
[Chemical Formula 13]
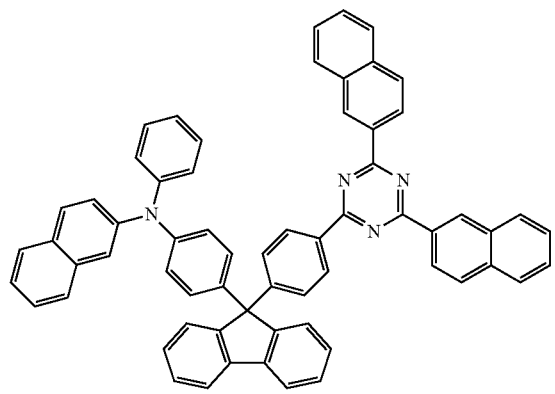
[Chemical Formula 14]
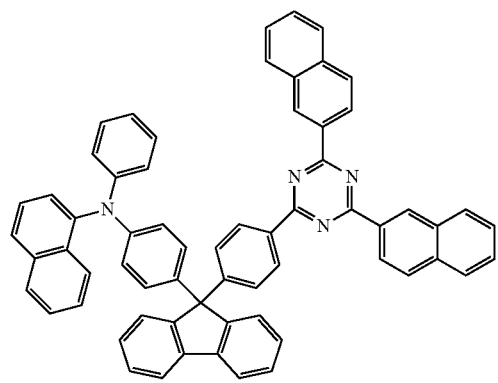
[Chemical Formula 15]
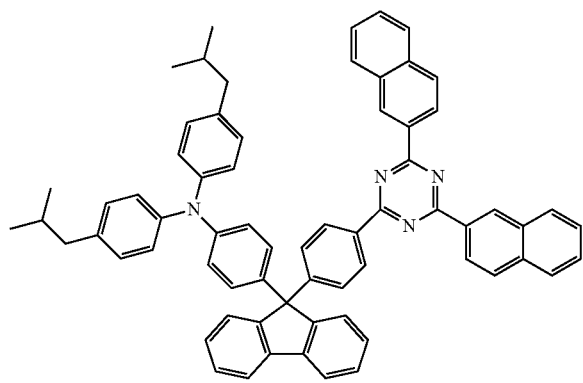

-continued
[Chemical Formula 16]
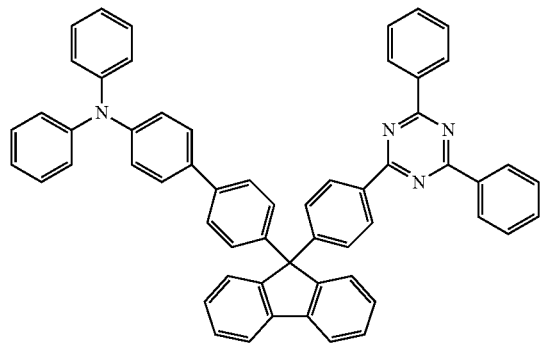
[Chemical Formula 17]
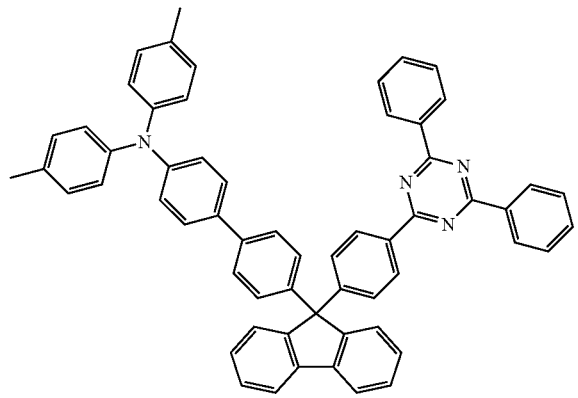
[Chemical Formula 18]
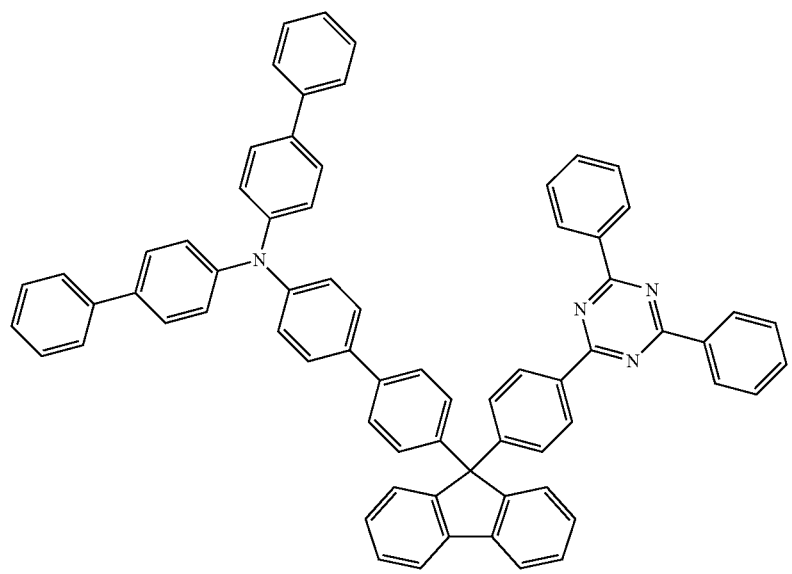
[Chemical Formula 19]
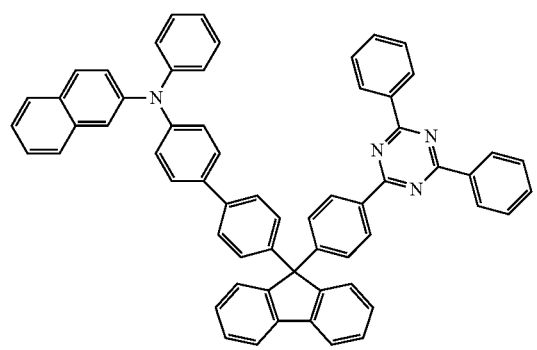
[Chemical Formula 20]
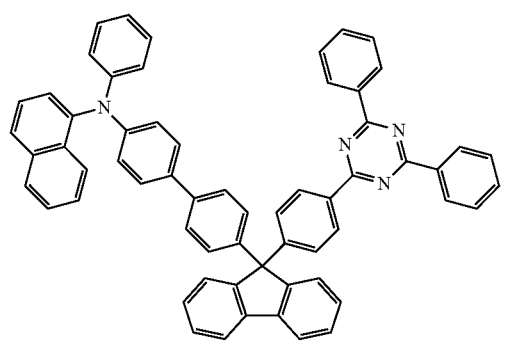

[Chemical Formula 21]
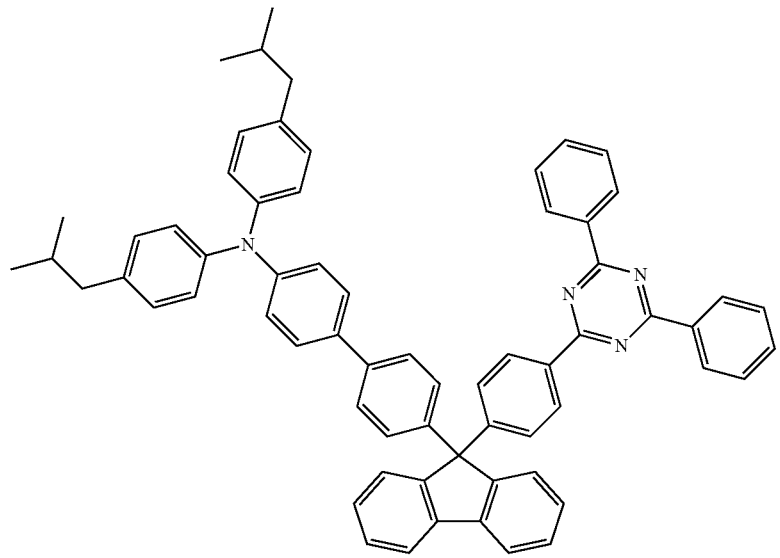
[Chemical Formula 22]
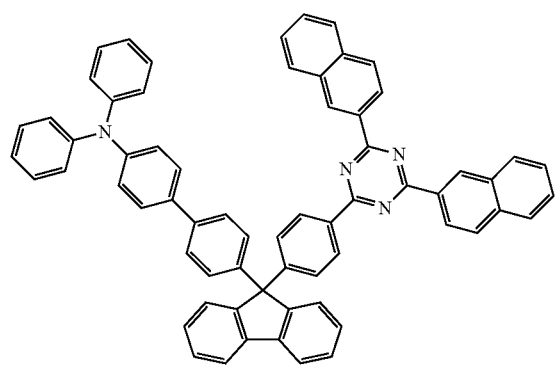
[Chemical Formula 23]
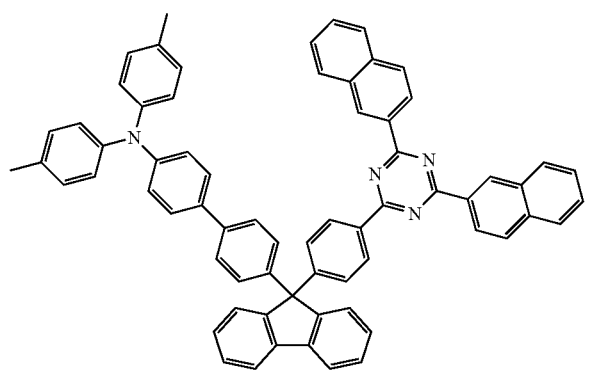
[Chemical Formula 24]
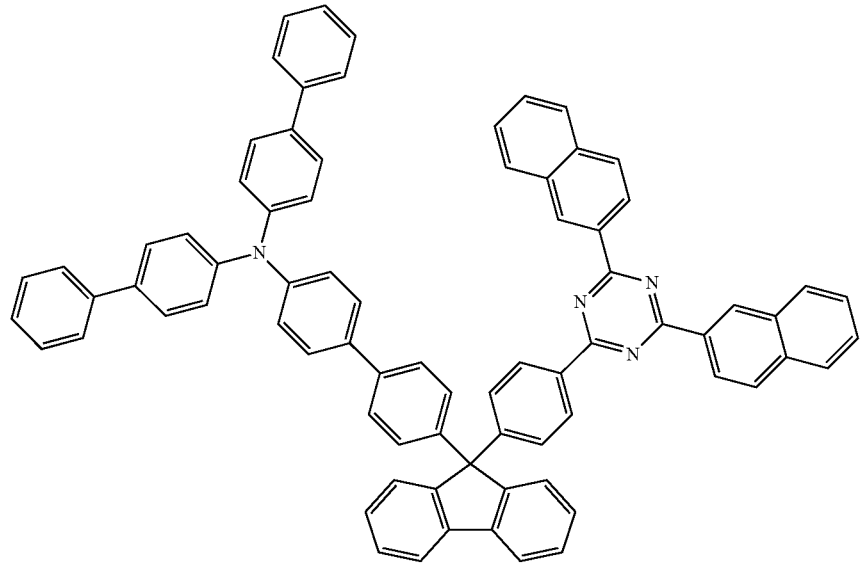

[Chemical Formula 25]
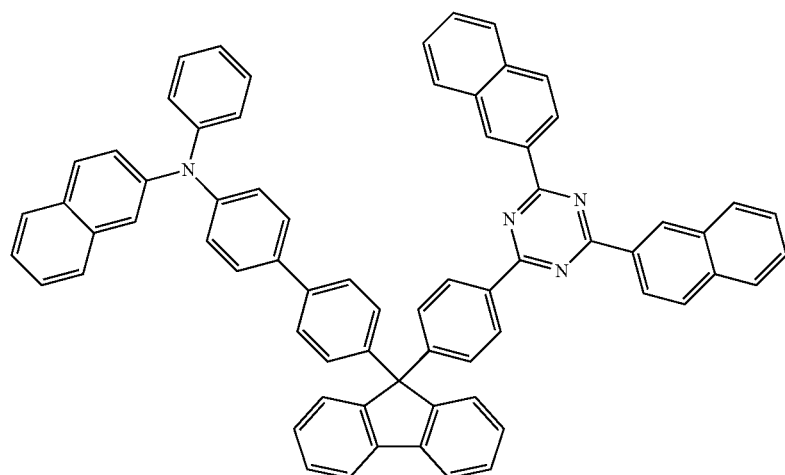
[Chemical Formula 26]
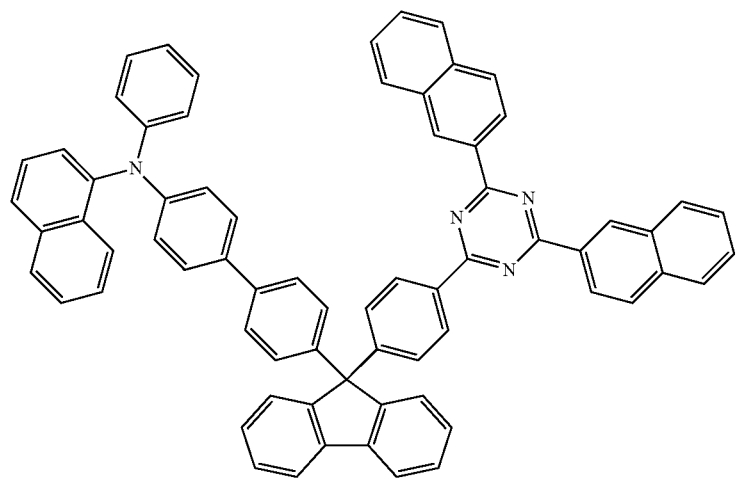
[Chemical Formula 27]
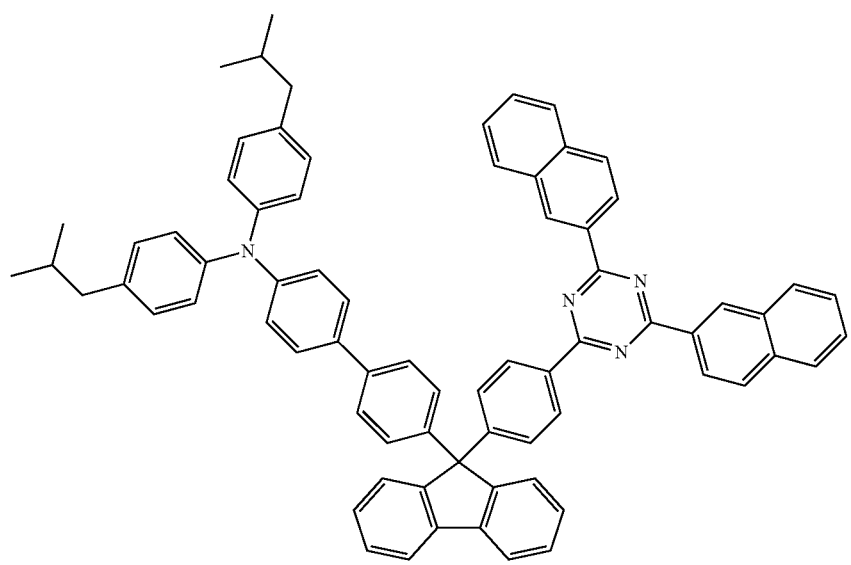

[Chemical Formula 28]
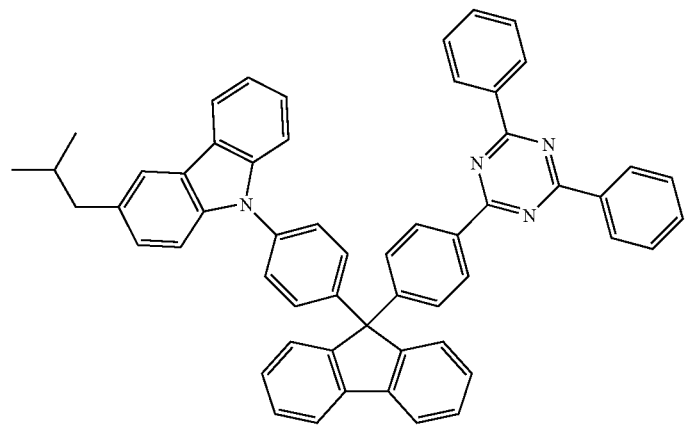
[Chemical Formula 29]
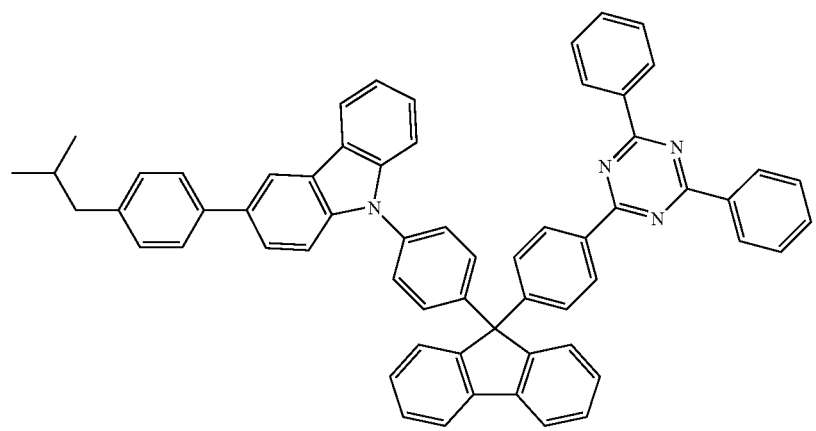
[Chemical Formula 30]
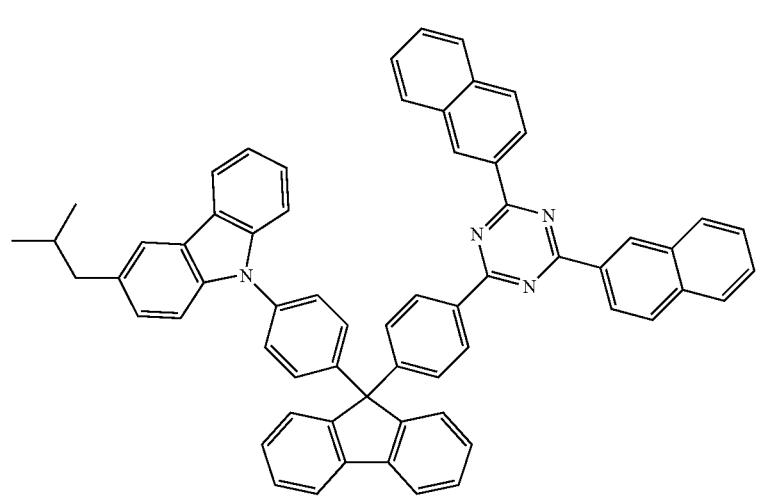

[Chemical Formula 31]
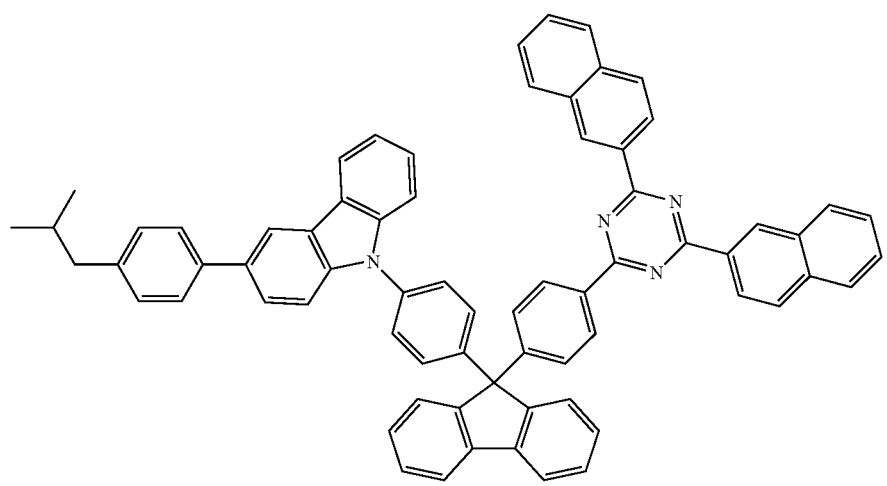
[Chemical Formula 32]
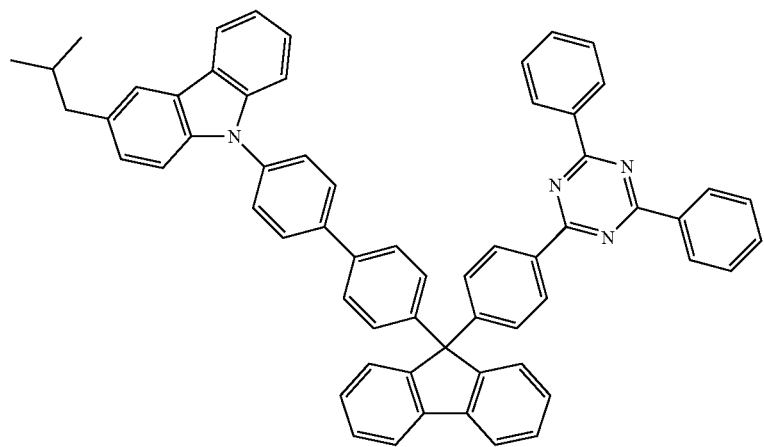
[Chemical Formula 33]
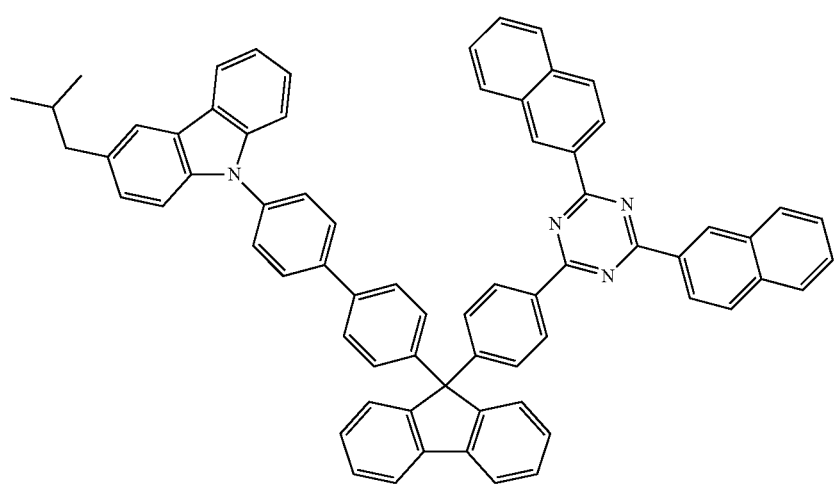

[Chemical Formula 34]
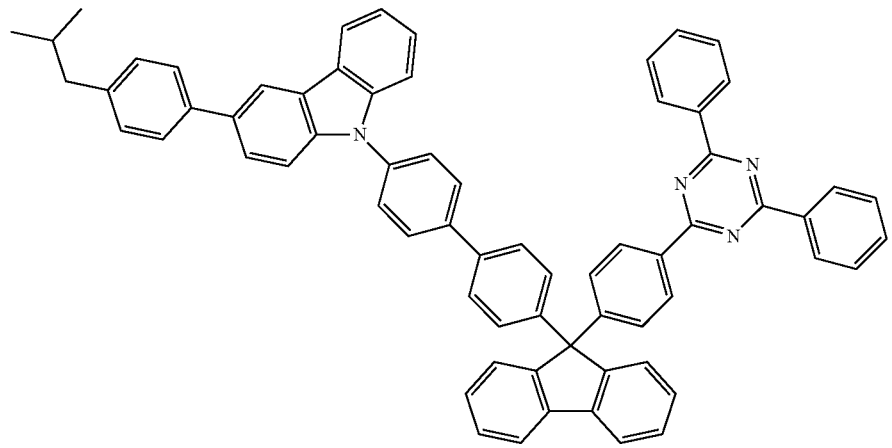
[Chemical Formula 35]
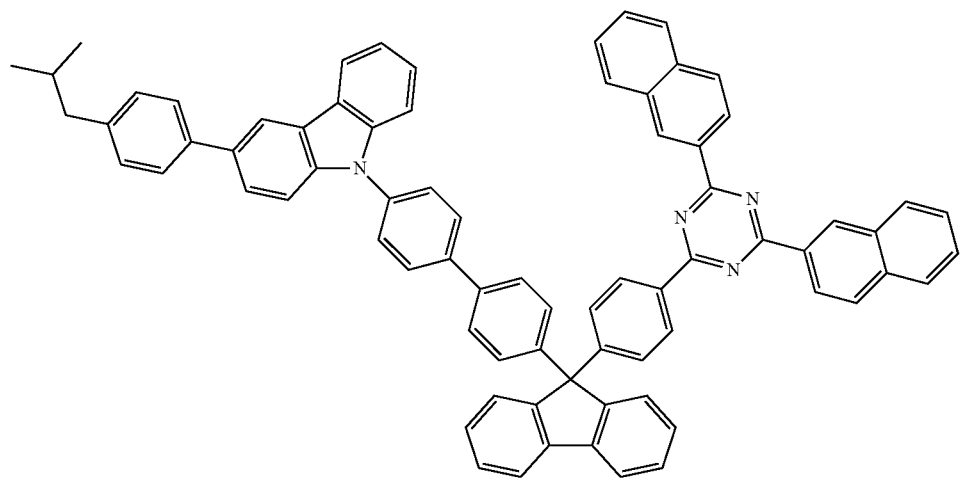
[Chemical Formula ad-1]
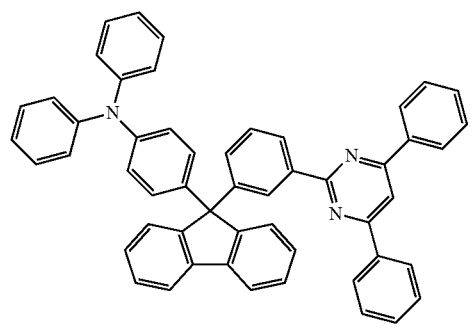
[Chemical Formula ad-2]
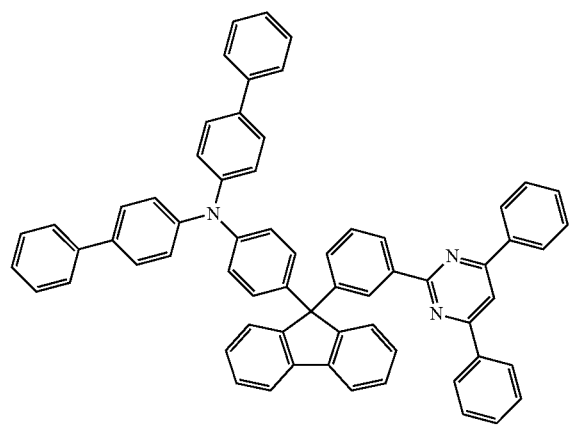

[Chemical Formula ad-3]
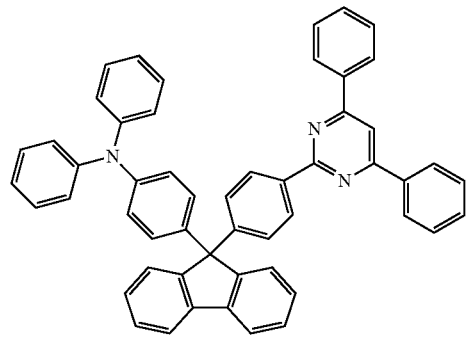
[Chemical Formula ad-4]
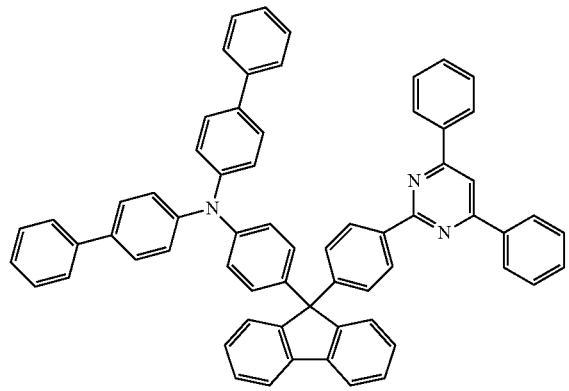
The compound for an organic photoelectric device represented by Chemical Formula A-1 may be represented by one of Chemical Formulae ad-5 to ad-24, below. However, the embodiments are not limited thereto.
[Chemical Formula ad-5]
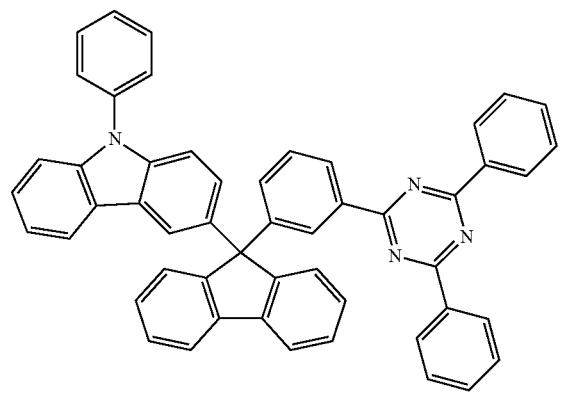
[Chemical Formula ad-7]
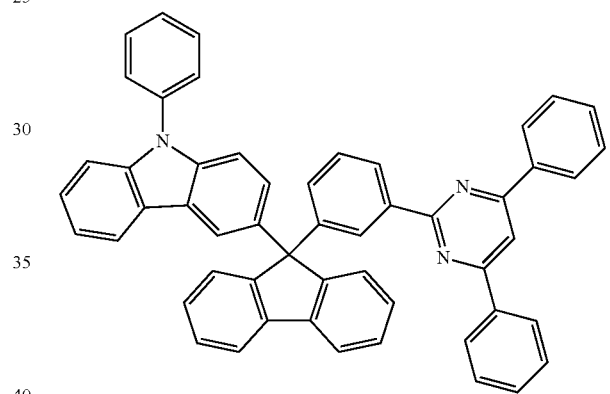
[Chemical Formula ad-6]
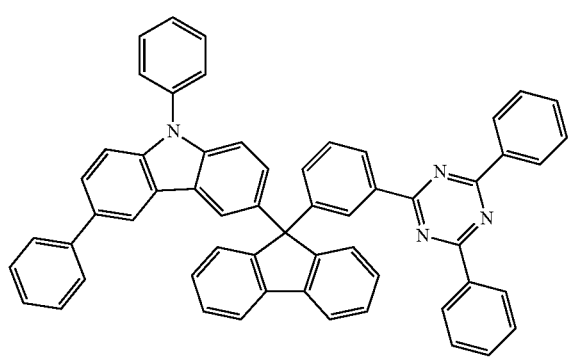
[Chemical Formula ad-8]
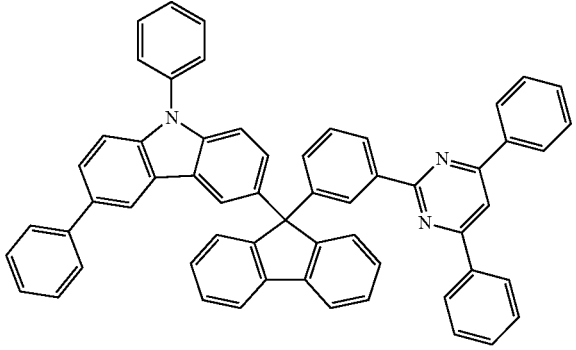

[Chemical Formula ad-9]
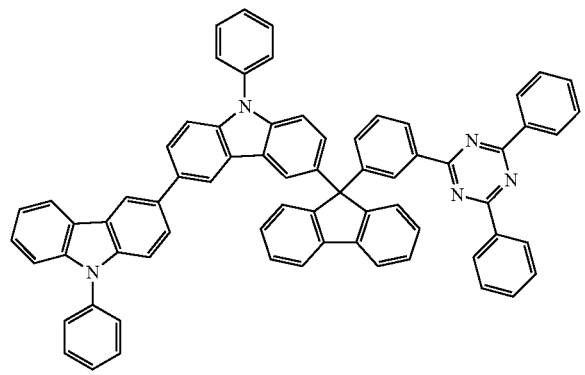
[Chemical Formula ad-10]
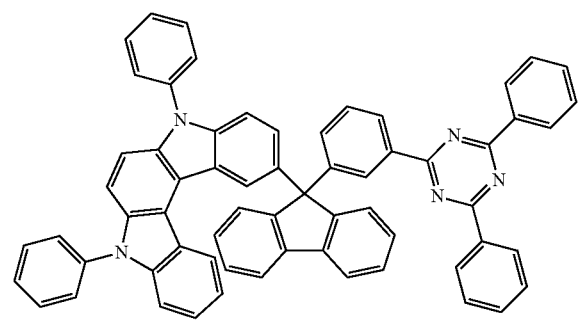
[Chemical Formula ad-11]
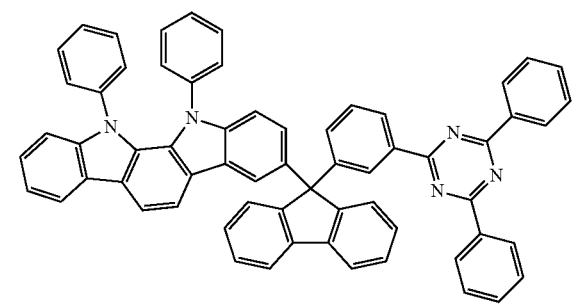
[Chemical Formula ad-12]
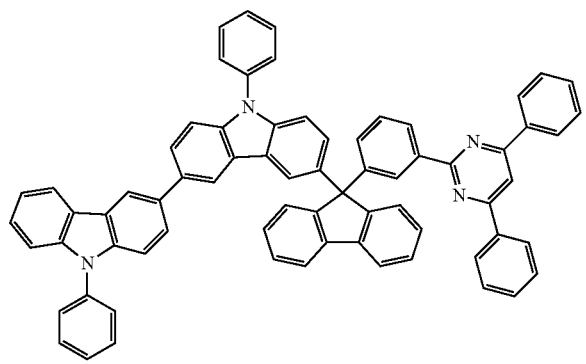
[Chemical Formula ad-13]
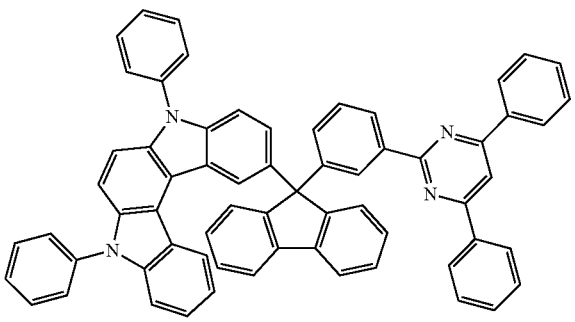
[Chemical Formula ad-14]
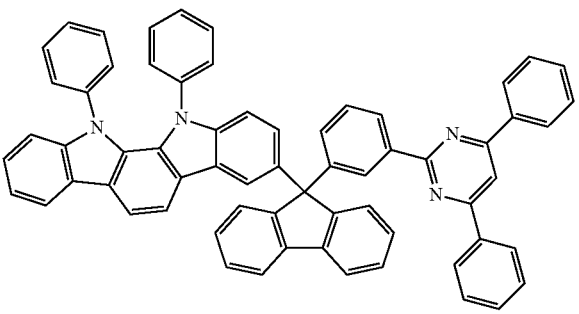
[Chemical Formula ad-15]
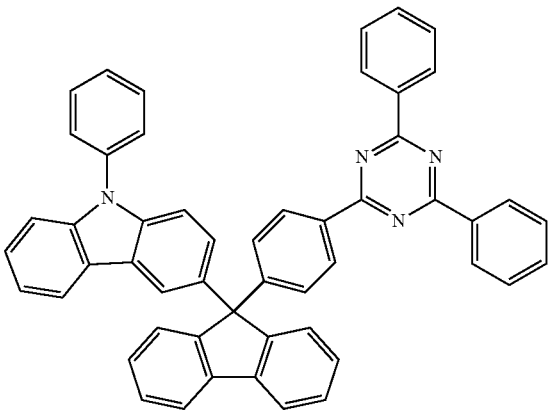
[Chemical Formula ad-16]
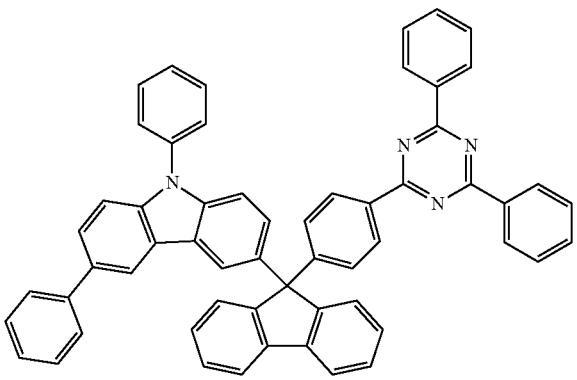

[Chemical Formula ad-17]
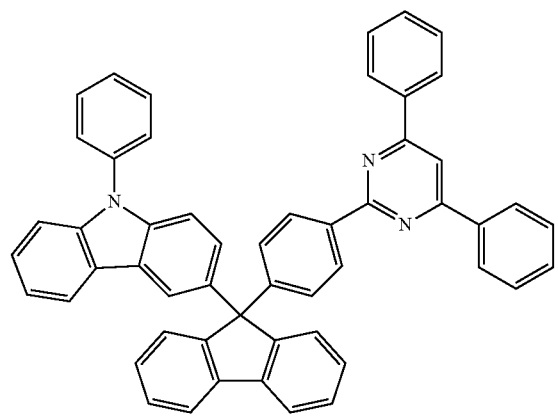
[Chemical Formula ad-18]
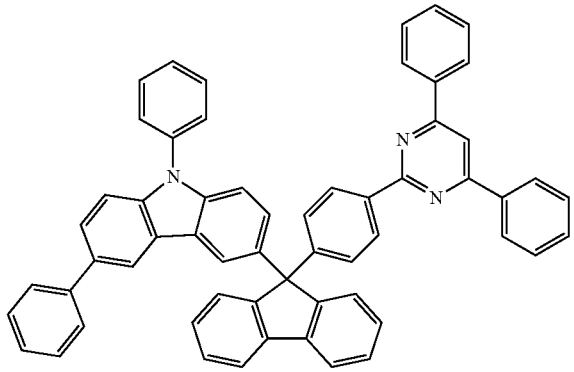
[Chemical Formula ad-19]
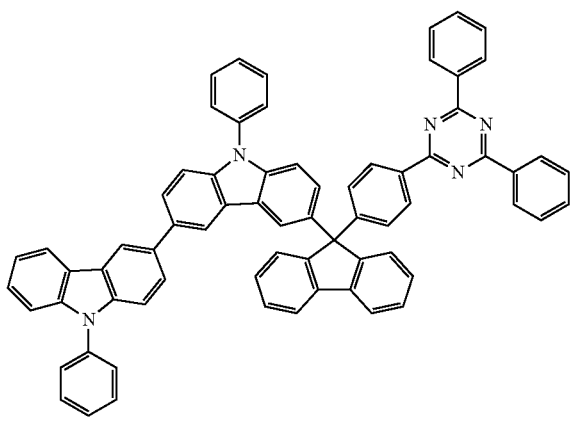
[Chemical Formula ad-20]
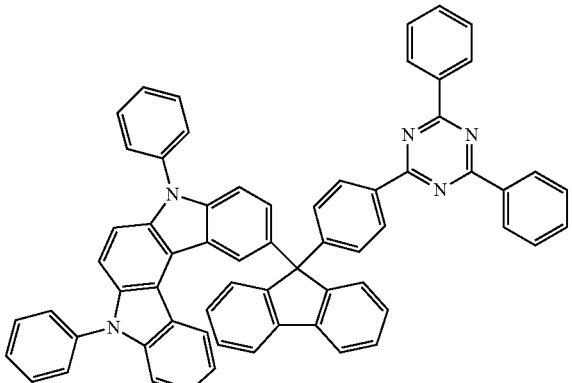
[Chemical Formula ad-21]
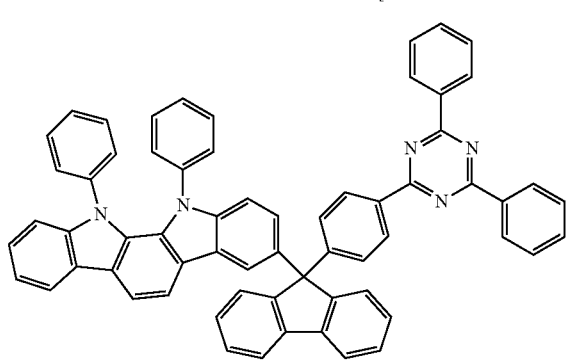
[Chemical Formula ad-22]
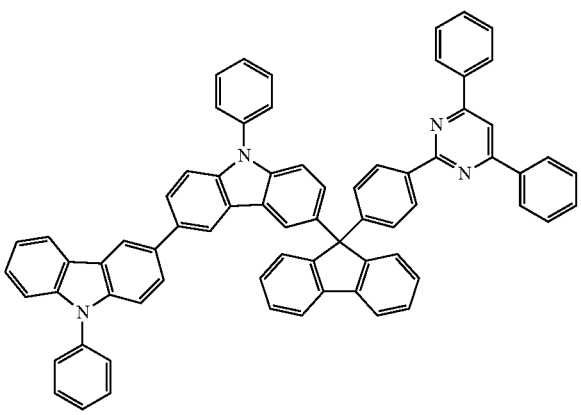
[Chemical Formula ad-23]
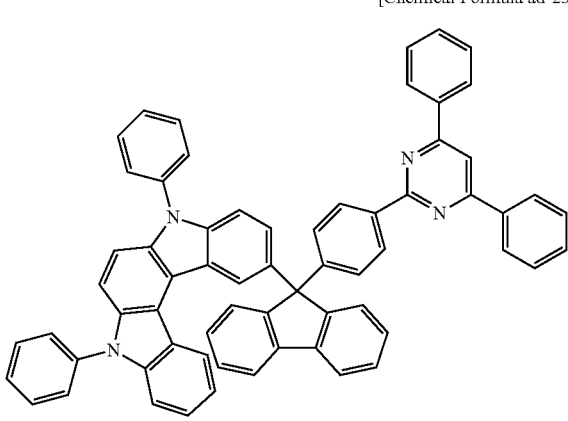

-continued

[Chemical Formula ad-24]

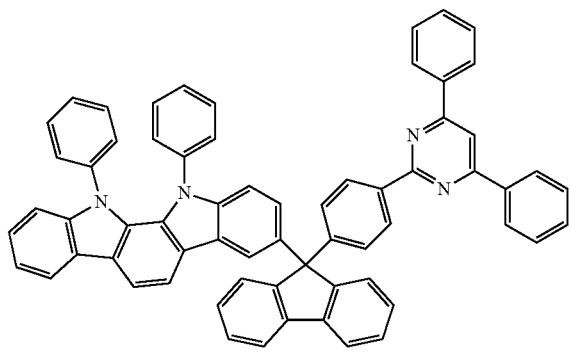

The compound for an organic photoelectric device according to an embodiment may be used for an organic thin layer, may generate phosphorescence in a wide wavelength region and thus, may help improve efficiency characteristics of the organic photoelectric device as well as help lower a driving voltage thereof. In addition, the compound may help improve life-span characteristic of the organic photoelectric device.

The compound for an organic photoelectric device may be a charge transporting material having excellent hole and electron transportation capability. In an implementation, the compound for an organic photoelectric device may be used singularly or as a host material together with a dopant.

The dopant may be a compound having a high emission property, by itself. In an implementation, the dopant may be added to a host in a minor amount, so it may also be called a guest. The dopant may be a light-emitting material while being doped on a host material. The dopant may include a material, e.g., a metal complex capable of light-emitting by multiplet excitation such as triplet excitation or more. Such a dopant may include any suitable red (R), green (G), blue (B), or white (W) fluorescent or phosphorescent dopant. In an implementation, a red, green, blue, and/or white phosphorescent dopant may be used. For example, a material that has high luminous efficiency, is not agglomerated, and is uniformly distributed in a host material may be used.

The phosphorescent dopant may include an organic metal compound including an element, e.g., Ir, Pt, Os, Ti, Zr, Hf, Eu, Tb, Tm, Fe, Co, Ni, Ru, Rh, Pd, or a combination thereof. For example, a red phosphorescent dopant may include platinum-octaethylporphyrin complex (PtOEP), Ir(Piq)$_3$, RD61 (UDC), and the like, a green phosphorescent dopant may include Ir(PPy)$_2$(acac), Ir(PPy)$_3$, Ir(mppy)$_3$, GD48 (UDC), and the like, and a blue phosphorescent dopant may include (4,6-F$_2$PPy)$_2$Irpic (Appl. Phys. Lett., 79, 2082-2084, 2001), and the like. "Piq" denotes 1-phenylisoquinoline, "acac" denotes acetylacetonate, PPy denotes 2-phenylpyridine, pic denotes picolinate, and mppy denotes 2-(4-methylphenyl)pyridine.

The compound for an organic photoelectric device according to an embodiment may have a glass transition temperature ($T_g$) of about 110° C. or higher and/or a thermal decomposition temperature (Td) of about 400° C. or higher. In an implementation, the glass transition temperature may be about 110 to about 200° C. and/or the thermal decomposition temperature may be about 400 to about 600° C. Thus, the compound for an organic photoelectric device according to an embodiment may exhibit excellent thermal stability and may be used as a host material or a charge transport material.

Another embodiment provides an organic photoelectric device including the compound for an organic photoelectric device. The organic photoelectric device may include an organic light emitting diode, an organic solar cell, an organic transistor, an organic photo conductor drum, an organic memory device, or the like. In case of an organic solar cell, the compound for an organic photoelectric device according to an embodiment may be applied to an electrode or an electrode buffer layer of the organic solar cell to help improve quantum efficiency. Alternatively, the compound for an organic photoelectric device may be applied to an electrode material of a gate, source-drain electrodes, and the like of an organic transistor.

Hereinafter, an organic photoelectric device is illustrated in more detail.

An organic photoelectric device according to an embodiment may include an anode, a cathode, and at least one organic thin layer between the anode and the cathode. The organic thin layer may include the compound for an organic photoelectric device according to an embodiment.

The organic thin layer including the compound for an organic photoelectric device may include an emission layer, a hole transport layer (HTL), a hole injection layer (HIL), a hole blocking layer, an electron transport layer (ETL), an electron injection layer (EIL), an electron blocking layer, or a combination thereof. At least one of these layers may include the compound for an organic photoelectric device according to an embodiment. For example, the emission layer, the hole transport layer (HTL), the hole injection layer (HIL), the electron transport layer (ETL), the electron injection layer (EIL), or a combination thereof may include the compound for an organic photoelectric device according to an embodiment.

FIGS. 1 to 5 illustrate cross-sectional views of organic photoelectric devices including the compound for an organic photoelectric device according to an embodiment.

Referring to FIGS. 1 to 5, the organic photoelectric devices 100, 200, 300, 400, and 500 according to an embodiment may include at least one organic thin layer 105 interposed between an anode 120 and a cathode 110.

A substrate of the organic photoelectric device is not particularly limited. In an implementation, the substrate may include a glass substrate or a transparent plastic substrate having excellent transparency, surface smoothness, handling ease, and water repellency.

The anode 120 may include an anode material laving a large work function to facilitate hole injection into an organic thin layer. The anode material may include a metal (such as nickel, platinum, vanadium, chromium, copper, zinc, gold, and the like or an alloy of the foregoing metals); a metal oxide (such as zinc oxide, indium oxide, indium tin oxide (ITO), indium zinc oxide (IZO), and the like); a combined metal and oxide (such as ZnO/Al, SnO$_2$/Sb, and the like); a conductive polymer (such as poly (3-methylthiophene), poly[3,4-(ehtylene-1,2-dioxy)thiophene]: (PEDOT or PEDT), polypyrrole, polyaniline, and the like). However, the anode material is not limited thereto. In an implementation, the anode material may be a transparent electrode including ITO.

The cathode 110 may include a cathode material having a small work function to facilitate electron injection into an organic thin layer. The cathode material may include a metal (such as magnesium, calcium, sodium, potassium, titanium, indium, yttrium, lithium, gadolinium, aluminum, silver, tin, lead, cesium, barium, and the like or alloys thereof); and/or a multi-layered material (such as LiF/Al, LiO$_2$/Al, LiF/Ca, LiF/Al, BaF$_2$/Ca, and the like). However, the cathode material is not limited to the above materials. In an implementation, the cathode material may be a metal electrode such as aluminum.

Referring to FIG. 1, the organic photoelectric device 100 may include an organic thin layer 105 including only an emission layer 130.

Figure 2:
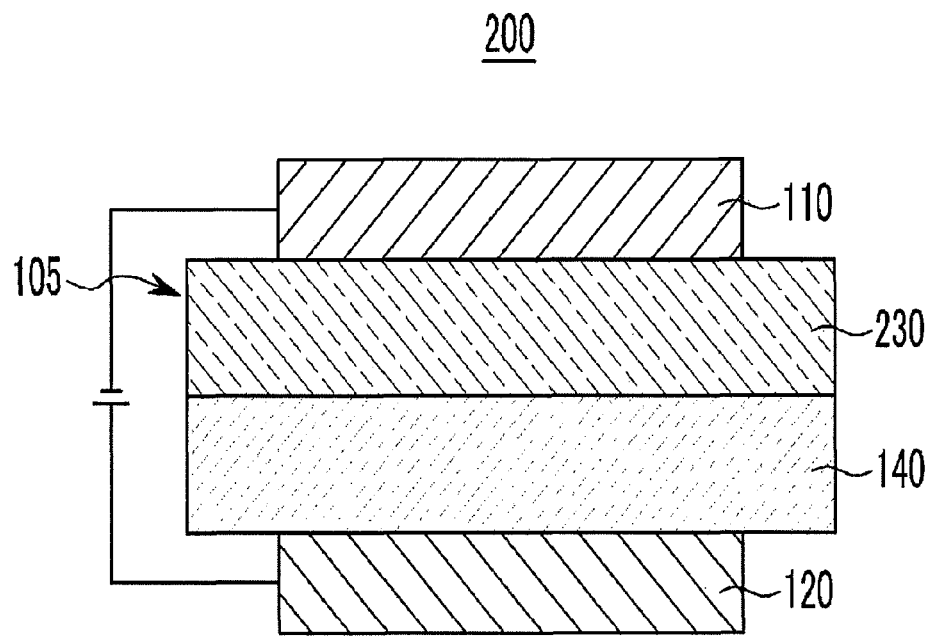

Referring to FIG. 2, a double-layered organic photoelectric device 200 may include an organic thin layer 105 including an emission layer 230 (including an electron transport layer (ETL)) and a hole transport layer (HTL) 140. The emission layer 230 may also function as an electron transport layer (ETL), and the hole transport layer (HTL) 140 layer may have an excellent binding property with a transparent electrode (such as ITO) and/or may have an excellent hole transporting property.

In an implementation, the hole transport layer (HTL) 140 may include any suitable hole transport material, e.g., poly (3,4-ethylenedioxy-thiophene) (PEDOT) doped with poly (styrenesulfonate) (PSS) (PEDOT:PSS), N,N'-bis (3-methylphenyl)-N,N-diphenyl-[1,1'-biphenyl]-4,4'-diamine (TPD), N,N'-di (1-naphthyl)-N,N'-diphenylbenzidine (NPB) and the like, along with the compound for an organic photoelectric device according to an embodiment.

Figure 3:
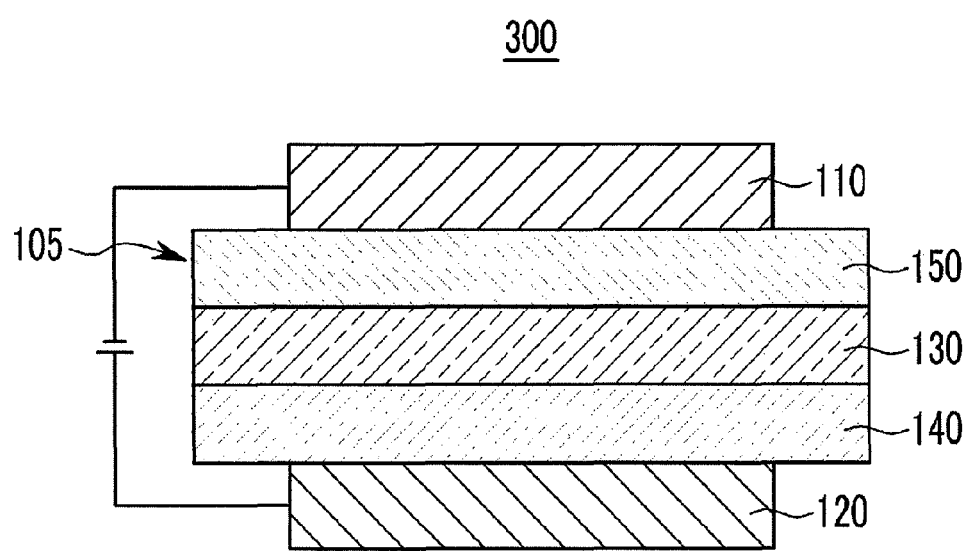

Referring to FIG. 3, a three-layered organic photoelectric device 300 may include an organic thin layer 105 including an electron transport layer (ETL) 150, an emission layer 130, and a hole transport layer (HTL) 140. For example, the emission layer 130 may be independently installed, and layers having an excellent electron transporting property or an excellent hole transporting property may be separately stacked.

In an implementation, the electron transport layer (ETL) 150 may include any suitable electron transport material, e.g., aluminum tris(8-hydroxyquinoline) (Alq$_3$); a 1,3,4-oxadiazole derivative such as 2-(4-biphenyl-5-phenyl-1,3,4-oxadiazole (PBD); a quinoxalin derivative such as 1,3,4-tris[(3-phenyl-6-trifluoromethyl) quinoxalin-2-yl]benzene (TPQ); and/or a triazole derivative, along with the compound for an organic photoelectric device according to an embodiment.

Figure 4:
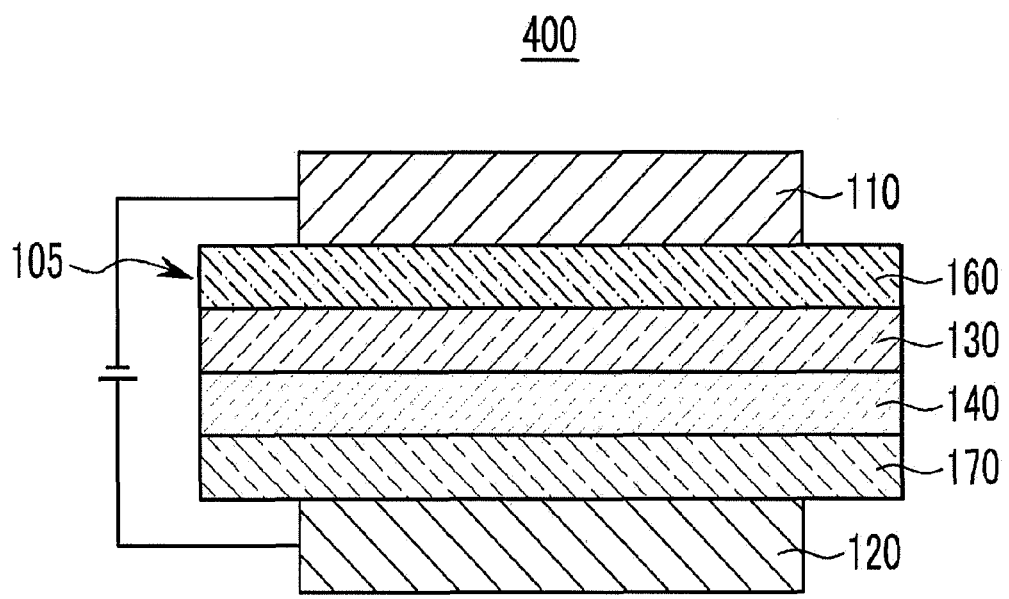

Referring to FIG. 4, a four-layered organic photoelectric device 400 may include an organic thin layer 105 including an electron injection layer (EIL) 160, an emission layer 130, a hole transport layer (HTL) 140, and a hole injection layer (HIL) 170 for binding with the, e.g., ITO, anode 120.

Figure 5:
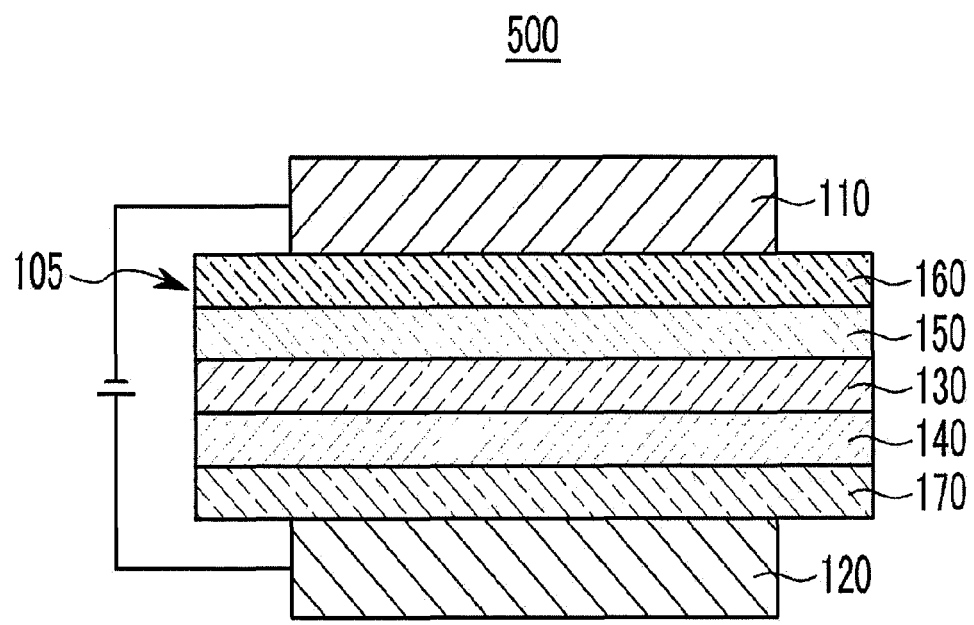

Referring to FIG. 5, a five layered organic photoelectric device 500 may include an organic thin layer 105 including an electron transport layer (ETL) 150, an emission layer 130, a hole transport layer (HTL) 140, and a hole injection layer (HIL) 170, and may further include an electron injection layer (EIL) 160 to achieve a low voltage.

The emission layers 130 and 230 may have a thickness of about 5 to about 1,000 nm, and the hole transport layer (HTL) 140 and electron transport layer (ETL) 150 may have a thickness of about 10 to about 10,000 Å, respectively. However, the thicknesses are not limited to the above range.

In FIGS. 1 to 5, the organic thin layer 105 including, e.g., the electron transport layer (ETL) 150, electron injection layer (EIL) 160, emission layer 130 and 230, hole transport layer (HTL) 140, hole injection layer (HIL) 170, and/or a combination thereof, may include the compound for an organic photoelectric device according to an embodiment. In an implementation, the compound for an organic photoelectric device may be used for or included in, e.g., the hole transport layer (HTL) 140, the electron transport layer (ETL) b 150, or the electron injection layer (EIL) 160. When the compound is used for or included in the electron transport layer (ETL) 150, it is possible to provide an organic photo-electric device having a simpler structure because an additional hole blocking layer may not be required, e.g., may be omitted.

When the compound for an organic photoelectric device is included in the emission layer 130 and 230, the material for the organic photoelectric device may be included as a phosphorescent host, and the emission layer 130 and 230 may further include a dopant. The dopant may be a red, green, blue, and/or white phosphorescent dopant.

The organic photoelectric device may be fabricated by, e.g., forming an anode on a substrate, forming an organic thin layer in accordance with a dry coating method such as evaporation, sputtering, plasma plating, and ion plating, or a wet coating method such as spin coating, dipping, and flow coating; and providing a cathode thereon.

Another embodiment provides a display device including the organic photoelectric device.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

Synthesis of Compound for Organic Photoelectric Device

EXAMPLE 1

Synthesis of Compound represented by Chemical Formula 4

A compound represented by the above Chemical Formula 4 (presented as a specific example of a compound for an organic photoelectric device according to an embodiment) was synthesized according to Reaction Scheme 1, below.

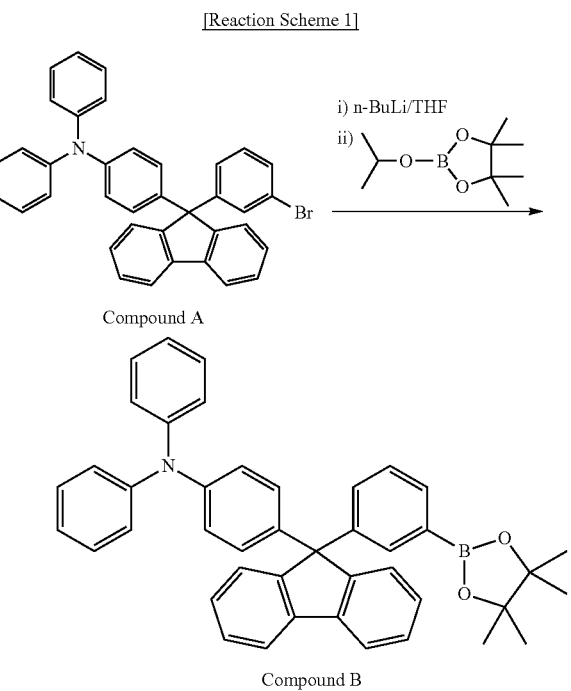

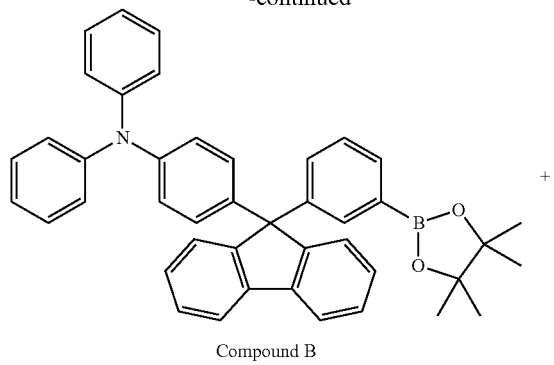

Compound B

Compound C

Chemical Formula 4

First Step: Synthesis of Compound B 5 g (8.86 mmol) of Compound A was mixed with 150 mL of tetrahydrofuran in a 250 mL round-bottomed flask with an agitator under a nitrogen atmosphere and cooled down using dry ice and acetone. Next, 6.64 mL (10.6 mmol) of 1.6 M n-butyllithium (n-BuLi) was slowly injected to the reactor to remove the dry ice, and then, the resulting product was agitated for 30 minutes. Then, the reactor was cooled down, and 2.47 g (13.3 mmol) of 2-isopropoxy-4,4,5,5-tetramethyl-1,3,2-dioxaborane was slowly injected thereto. The reactor was agitated at a room temperature for 8 hours.

The reactant was poured into water to complete the reaction. The reactant was extracted with ethyl acetate and treated with anhydrous magnesium sulfate to remove moisture and a solvent therefrom. The residue was purified through silica gel chromatography, obtaining 4.11 g of an intermediate product represented by Compound B (yield: 76%).

Second Step: Synthesis of Chemical Formula 4

4 g (6.5 mmol) of intermediate Compound B and 2.1 g (7.85 mmol) of Compound C were mixed with 100 mL of tetrahydrofuran in a 250 mL round flask. Next, 80 mL of a 2M potassium carbonate aqueous solution and 0.15 g (0.13 mmol) of tetrakis(triphenylphosphine)palladium (0) were added to the mixture. The resulting mixture was heated and refluxed under a nitrogen gas flow for 12 hours.

The liquid reactant was separated into two layers. The organic layer was cleaned with a sodium chloride saturated aqueous solution and dried with anhydrous sodium sulfate. Then, the organic solvent therein was distilled and removed under a reduced pressure. The residue was purified through silica gel chromatography, obtaining 3.38 g of a compound represented by Chemical Formula 4 (yield: 72%).

Atomic analysis of the compound represented by Chemical Formula 4 was performed. The result is provided as follows.

calcd. $C_{52}H_{36}N_4$: C, 87.12; H, 5.06; N, 7.82; found: C, 87.02; H, 5.11; N, 7.32.

EXAMPLE 2

Synthesis of Compound represented by Chemical Formula 23

A compound represented by the above Chemical Formula 23 (as a specific example of a compound for an organic photoelectric device according to an embodiment) was synthesized according to the following Reaction Scheme 2.

[Reaction Scheme 2]

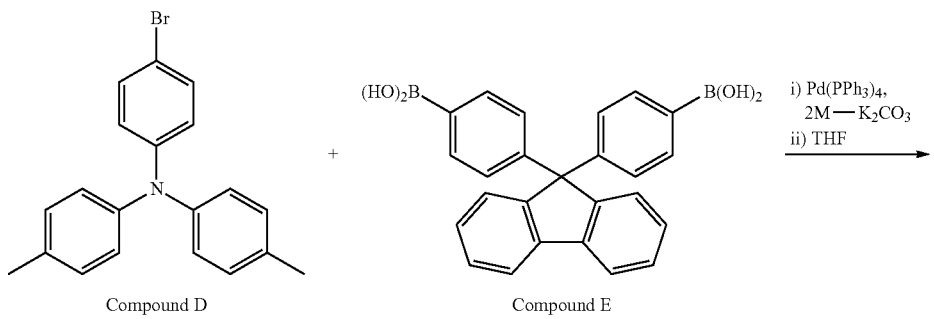

Compound D

Compound E

-continued

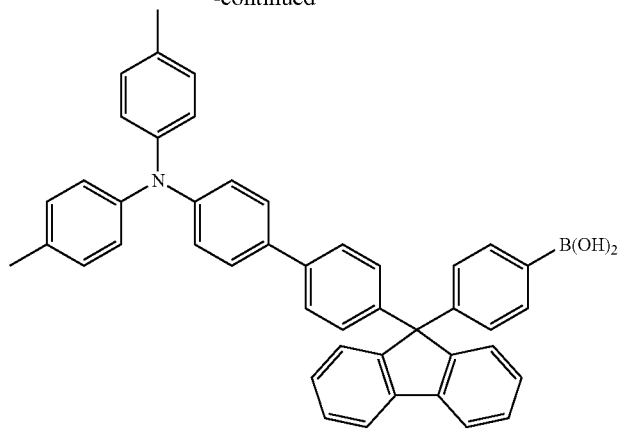
Compound F

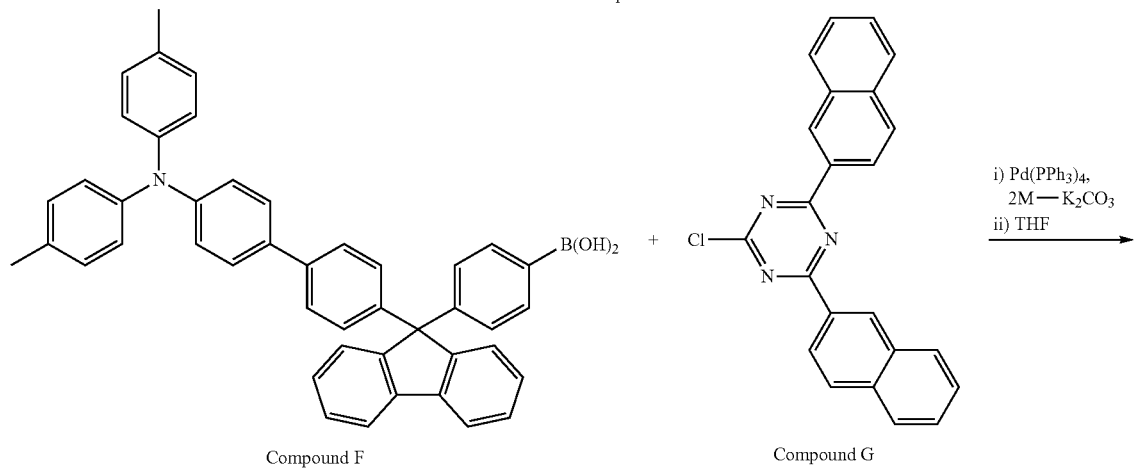
Compound F    Compound G

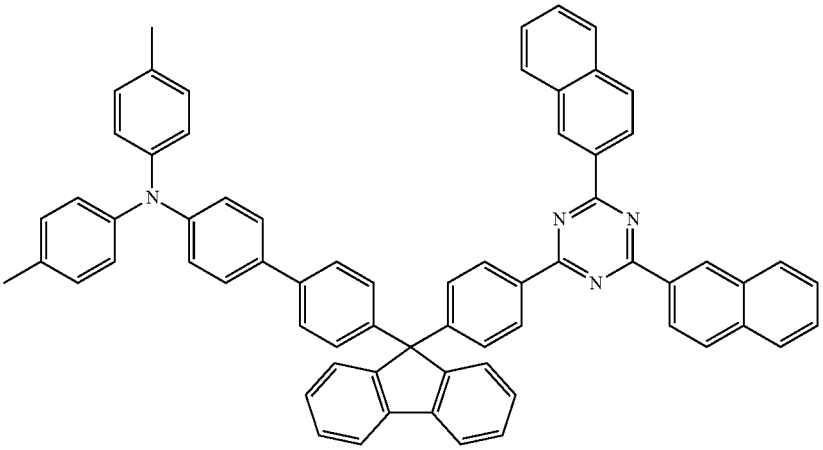
Chemical Formula 23

First Step: Synthesis of Compound F 5 g (12.3 mmol) of Compound E and 4.34 g (12.3 mmol) of Compound D were mixed with 100 mL of tetrahydrofuran in a 250 mL round flask. Next, 80 mL of a 2M potassium carbonate aqueous solution and 0.28 g (0.2 mmol) of tetrakis (triphenylphosphine)palladium (0) were added to the mixture. The resulting mixture was heated under a nitrogen gas flow for 12 hours.

The liquid reactant was separated into two layers, and the organic layer was dried with anhydrous sodium sulfate. Then, the organic solvent was distilled and removed under a reduced pressure. The residue was purified through silica gel chromatography, obtaining 3 g of an intermediate compound represented by Compound F (yield: 40%).

Second Step: Synthesis of Chemical Formula 23

3 g (4.7 mmol) of intermediate Compound F (synthesized in the first step) and 2.1 g (5.7 mmol) of Compound G were mixed with 80 mL of tetrahydrofuran in a 250 mL round flask. Next, 60 mL of a 2M potassium carbonate aqueous solution and 0.11 g (0.1 mmol) of tetrakis(triphenylphosphine)palladium (0) were added to the mixture. The resulting mixture was heated and refluxed under a nitrogen gas flow for 12 hours.

Then, the reactant was dried using anhydrous sodium sulfate to separate an organic layer, and the organic solvent therein was distilled and removed under a reduced pressure. The resulting reactant was purified through silica gel chromatography, obtaining 3.1 g of a compound represented by Chemical Formula 23 (yield: 70%).

Atomic analysis of the obtained compound represented by Chemical Formula 23 was performed. The result is provided as follows;

calcd. $C_{52}H_{36}N_4$: C, 88.67; H, 5.25; N, 6.08; found: C, 88.52; H, 5.01; N, 6.03.

EXAMPLE 3

Synthesis of Compound represented by Chemical Formula 29

A compound represented by the above Chemical Formula 29 (as a specific example of a compound for an organic photoelectric device according to an embodiment) was synthesized according to the following Reaction Scheme 3.

[Reaction Scheme 3]

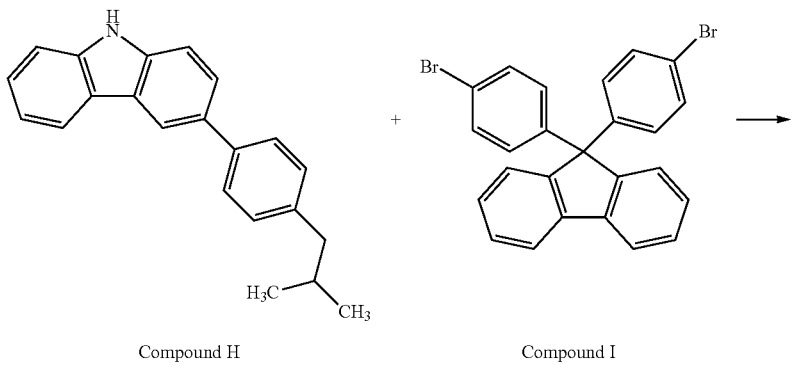

Compound H + Compound I →

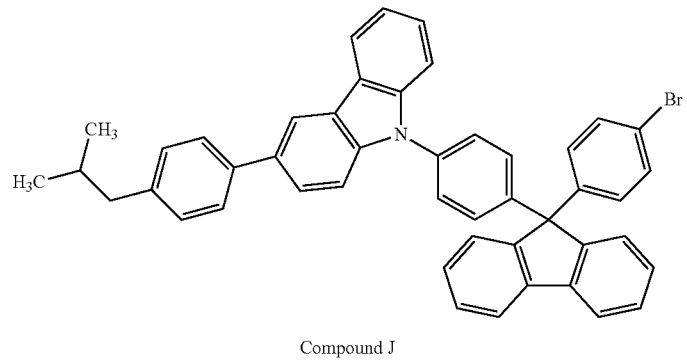

Compound J

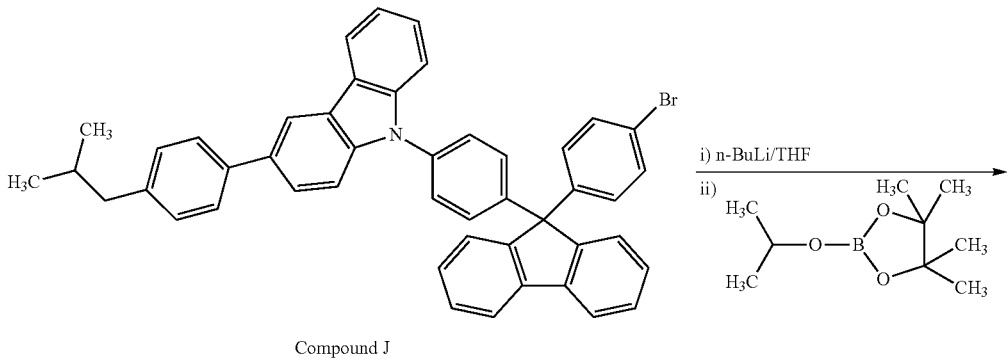

Compound J i) n-BuLi/THF
ii)

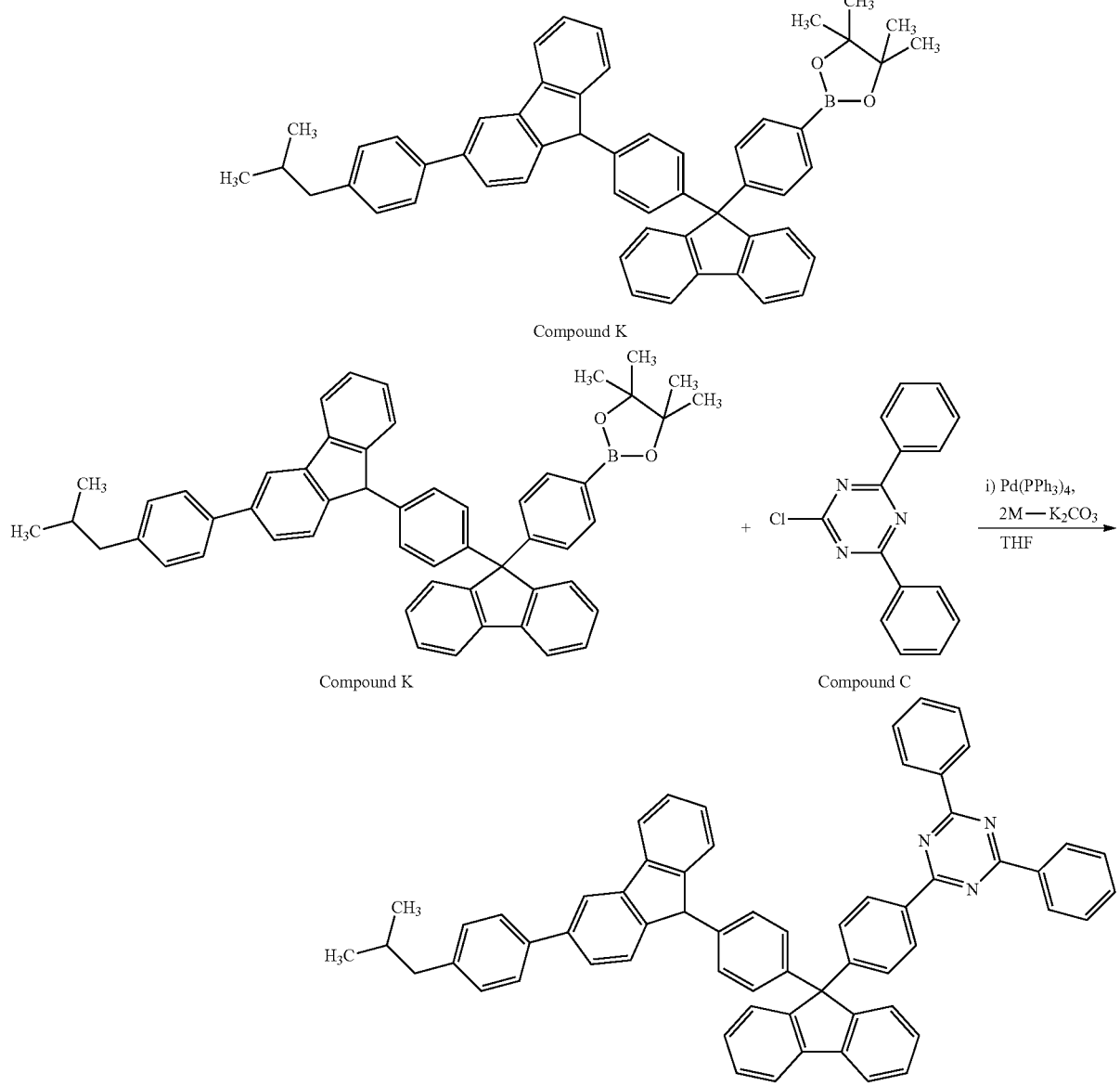

Compound K

Compound K

Compound C

Chemical Formula 29

First Step: Synthesis of Compound J 6.36 g (13.4 mmol) of Compound 1, 4 g (13.4 mmol) of Compound H, 0.66 g (6.7 mmol) of copper(I) chloride, and 5.5 g (40.1 mmol) of potassium carbonate were mixed with 100 mL of dimethylsulfoxide (DMSO) in a 250 mL round flask. The reactants were heated and agitated under a nitrogen gas flow at 180° C. for 24 hours. When the reaction was complete, the solvent was vacuum-distilled and removed. The residue was purified through silica gel chromatography, obtaining 5.9 g of Compound J (yield: 64%).

Second Step: Synthesis of Compound K 5 g (7.2 mmol) of Compound J was mixed with 150 mL of tetrahydrofuran in a 250 mL round-bottomed flask with an agitator under a nitrogen atmosphere and cooled down using dry ice and acetone. Next, 5.4 mL (8.64 mmol) of 1.6 M n-butyllithium (n-BuLi) was slowly injected to the reactor, and dry ice for cooling was agitated for 30 minutes. Then, the reactor was cooled down, and 2 g (10.8 mmol) of 2-isopropoxy-4,4,5,5-tetramethyl-1,3,2-dioxaborane was slowly injected to the reactor. The reactor was agitated at a room temperature for 8 hours. The resulting reactant was poured into water to complete the reaction. Then, the reactant was extracted with ethyl acetate and treated with anhydrous magnesium sulfate to remove moisture and a solvent therefrom. The residue was purified through silica gel chromatography, obtaining 4 g of an intermediate Compound K (yield: 75%).

Third Step: Synthesis of Chemical Formula 29

4 g (5.39 mmol) of Compound K (prepared in the second step) and 1.73 g (6.5 mmol) of Compound C were mixed with 80 mL of tetrahydrofuran in a 250 mL round-bottomed flask. Next, 60 mL of a 2 M potassium carbonate aqueous solution and 0.12 g (0.1 mmol) of tetrakis(triphenylphosphine)palladium (0) were added to the mixture. The resulting mixture was heated and refluxed under a nitrogen gas flow for 12 hours.

Then, an organic layer was separated from the reactant and dried with anhydrous sodium sulfate, and then, the organic solvent was distilled and removed under a reduced pressure. The resulting reactant was purified through silica gel chromatography, obtaining 3.21 g of a compound represented by Chemical Formula 29 (yield: 70%).

Atomic analysis of the compound represented by Chemical Formula 29 was performed. The result is provided as follows;
calcd. $C_{52}H_{36}N_4$: C, 87.91; H, 5.47; N, 6.61; found: C, 87.52; H, 5.04; 6.32.

EXPERIMENTAL EXAMPLE 1

Thermal Property Evaluation

The compounds synthesized according to Examples 1 to 3 were measured regarding a glass transition temperature and a thermal decomposition temperature by respectively using a differential scanning calorimetry (DSC) and a thermogravimetric analysis (TGA). The results are provided in the following Table 1 and FIG. 6.

TABLE 1

|  | Glass transition temperature (° C.) | Thermal decomposition temperature (° C.) |
| --- | --- | --- |
| Example 1 | 132 | 414 |
| Example 2 | 154 | 452 |
| Example 3 | 146 | 487 |

Figure 6:
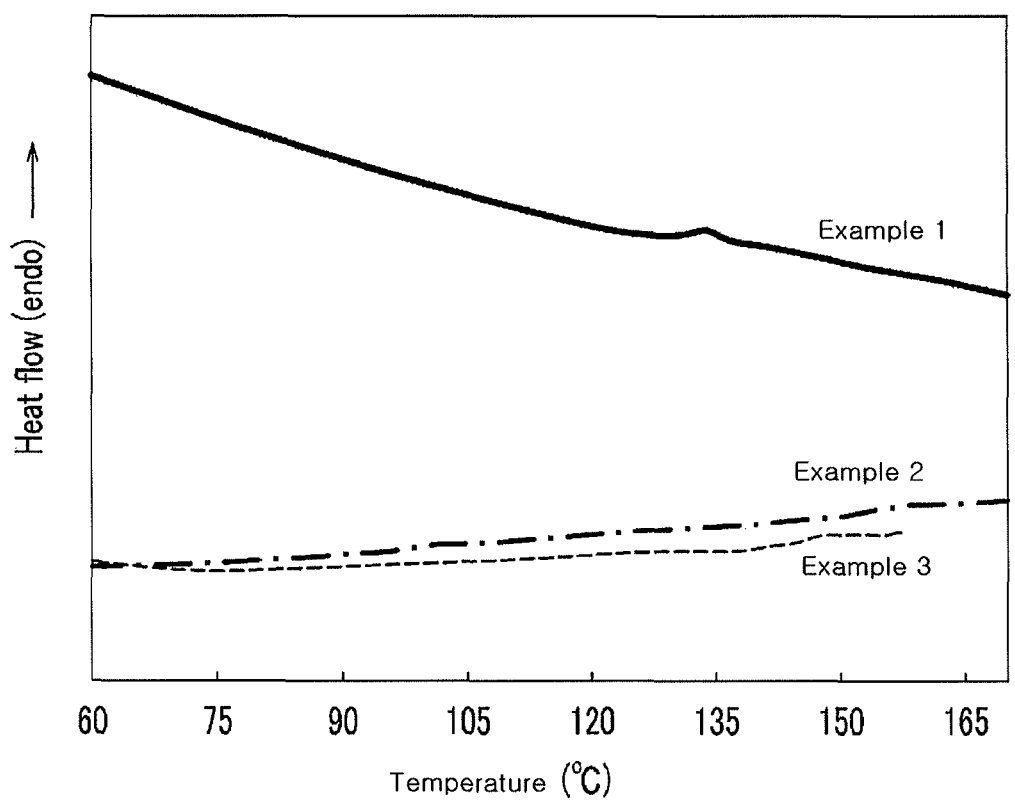
FIG. 6 illustrates a graph showing DSC (differential scanning calorimetry) analysis results of compounds for an organic photoelectric device according to Examples 1 to 3.

Referring to Table 1 and FIG. 6, the compounds according to Examples 1 to 3 had no melting point peak based on the result of the DSC analysis. The compounds according to Examples 1 to 3 were in a stable amorphous state. Accordingly, it may be seen that the compound for an organic photoelectric device according to an embodiment was prevented from crystallizing by Joule heat during operation of an organic photoelectric device including the compound, and the device would have improved life-span characteristic.

Preparation of Organic light emitting diode

EXAMPLE 4

An organic light emitting diode was fabricated by using the compound represented by Chemical Formula 4 (synthesized according to Example 1) as a host and $Ir(PPy)_3$ as a dopant. A 1,000 Å-thick ITO layer was used as an anode, and a 1,000 Å-thick aluminum (Al) layer was used as a cathode.

Specifically, an ITO glass substrate having 15 $\Omega/cm^2$ of sheet resistance was cut to have a size of 50 mm×50 mm×0.7 mm and respectively cleaned using ultrasonic wave in acetone, isopropyl alcohol, and pure water for 15 minutes and then, using UV ozone for 30 minutes, preparing an anode.

Next, 70 nm of N,N'-di(1-naphthyl)-N,N'-diphenylbenzidine (NPB) and 10 nm of 4,4',4''-tri(N-carbazoleyl)triphenylamine (TCTA) were deposited on the substrate with a vacuum degree of $650 \times 10^{-7}$ Pa at a deposition speed ranging from 0.1 to 0.3 nm/s to form a 800 Å-thick hole transport layer (HTL).

Then, the compound synthesized according to Example 1 was used to form a 300 Å-thick emission layer under the same vacuum-deposition condition described above. A phosphorescent dopant, $Ir(PPy)_3$, was simultaneously deposited. The phosphorescent dopant was regulated regarding deposition speed to be 7 wt %, based on 100 wt % of the total weight of the emission layer.

On the emission layer, bis(8-hydroxy-2-methylquinolinolato)-aluminumbiphenoxide (BAlq) was deposited under the same vacuum deposition condition to form a 50 Å-thick hole blocking layer.

Next, $Alq_3$ was deposited under the same vacuum deposition condition described above to form a 200 Å-thick electron transport layer (ETL).

On the electron transport layer (ETL), LiF and Al were sequentially deposited to fabricate a cathode, thereby fabricating an organic light emitting diode.

The organic light emitting diode had a structure of ITO/NPB (70 nm)/TCTA (10 nm)/EML (30 nm, the compound of Example 1 (93 wt %)+$Ir(PPy)_3$ (7 wt %))/Balq (5 nm)/Alq (20 nm)/LiF (1 nm)/Al (100 nm).

EXAMPLE 5

An organic light emitting diode was fabricated according to the same method as Example 4 except that the BAlq hole blocking layer was not formed.

The organic light emitting diode of Example 5 had a structure of ITO/NPB (70 nm)/TCTA (10 nm)/EML (30 nm, the compound (93 wt %) of Example 1+$Ir(PPy)_3$ (7 wt %))/$Alq_3$ (20 nm)/LiF (1 nm)/Al (100 nm).

EXAMPLE 6

An ITO substrate was used as an anode, and poly(3,4-ethylenedioxy-thiophene) (PEDOT) was spin-coated on the substrate.

On the PEDOT, and emission layer was formed by a spin-coating method. In particular, the emission layer was formed by dissolving the compound of Example 1 in toluene as a host and $Ir(mppy)_3$ as a dopant. The $Ir(mppy)_3$ dopant was mixed in an amount of 13 wt %, based on 100 wt % of the total weight of the emission layer.

On the emission layer, BAlq was vacuum-deposited to form a 50 Å-thick hole blocking layer. In addition, $Alq_3$ was vacuum-deposited to form a 200-thick electron transport layer (ETL) on the hole blocking layer.

On the electron transport layer (ETL), a 10 Å-thick (1 nm) LiF layer and a 1,000 Å-thick Al layer were sequentially vacuum-deposited to fabricate a cathode, thereby fabricating an organic light emitting diode.

The organic light emitting diode of Example 6 had a structure of ITO/PEDOT (40 nm)/EML (50 nm, the compound of Example 1 (87 wt %)+$Ir(PPy)_3$ (13 wt %))/BAlq (5 nm)/$Alq_3$ (20 nm)/LiF (1 nm)/Al (100 nm).

COMPARATIVE EXAMPLE 1

An organic light emitting diode was fabricated according to the same method as Example 4 except for using 4,4-N,N-dicarbazolebiphenyl (CBP) as a host for an emission layer, instead of the compound synthesized in Example 1.

COMPARATIVE EXAMPLE 2

An organic light emitting diode was fabricated according to the same method as Example 6 except for using a mixture of 50 wt % of TCTA and 50 wt % of 1,3,5-tris(N-phenylbenzimidazole-2-yl)benzene (TPBI) as a host for an emission layer, instead of the compound synthesized in Example 1.

The organic light emitting diode of Comparative Example 2 had a structure of ITO/PEDOT (40 nm)/TCTA:TPBI (mixed in a weight ratio of 50:50, 87 wt %):Ir(mppy)₃ (13 wt %) (50 nm)/BAlq (5 nm)/Alq₃ (20 nm)/LiF (1 nm)/Al (100 nm).

EXPERIMENTAL EXAMPLE 2

Performance Evaluation of Organic Light Emitting Diode

Each organic light emitting diode according to Examples 4 to 6 and Comparative Examples 1 to 2 was measured regarding current density change and luminance change depending on voltage change and luminous efficiency. The measurement method was undertaken as follows, and the results are provided in the following Tables 2 and 3.

(1) Current density change depending on Voltage change

The organic light emitting diodes were measured regarding current using a current-voltage meter (Keithley 2400), while voltages were increased from 0 V to 10 V. The current was divided by an area, obtaining current density.

(2) Luminance change depending on Voltage change

The organic light emitting diodes were measured regarding current using a luminance meter (Minolta Cs-1000A), while voltages were increased from 0 V to 10 V.

(3) Luminous efficiency

The luminance and current density obtained from (1) and (2), above, and voltage were used to calculate current efficiency (cd/A) and electric power efficiency (1 m/W) at the same brightness (1000 cd/m²). The results are provided in the following Tables 2 and 3.

(4) Color Coordinate

The organic light emitting diodes were measure regarding color coordinate by using a luminance meter (Minolta Cs-100A). The result is provided in the following Tables 2 and 3.

TABLE 2

| | | At 1000 cd/m² | | | |
|---|---|---|---|---|---|
| Device | Host material of emission layer | Driving voltage (V) | Current efficiency (cd/A) | Electric power efficiency (lm/W) | Color coordinate (x, y) |
| Example 4 | Example 1 | 6 | 48.88 | 25.59 | 0.30, 0.62 |
| Example 5 | Example 1 | 5.4 | 46.70 | 27.17 | 0.30, 0.62 |
| Comparative Example 1 | CBP | 7.8 | 46.80 | 18.85 | 0.29, 0.62 |

Referring to Table 2, the organic light emitting diodes according to Examples 4 and 5 had a driving voltage of about 2 V or less than the organic light emitting diode according to Comparative Example 1 and had similar current efficiency to that of the organic light emitting diode according to Comparative Example 1. The organic light emitting diodes according to Examples 4 and 5 had much improved electric power efficiency in terms of performance due to decreased driving voltage. Particularly, the organic light emitting diode that did not include BAlq as a hole blocking layer (according to Example 5) had very high luminous efficiency. Accordingly, because a separate hole blocking layer may be omitted, a compound according to an embodiment may have an advantage of decreasing cost and time in a manufacturing process of an organic light emitting diode due to a decrease in a number of organic thin layers included therein.

TABLE 3

| | | At 1000 cd/m² | | | |
|---|---|---|---|---|---|
| Device | Host material of emission layer | Driving voltage (V) | Current efficiency (cd/A) | Electric power efficiency (lm/W) | Color coordinate (x, y) |
| Example 6 | Example 1 | 6.8 | 25.4 | 11.7 | 0.32, 0.62 |
| Comparative Example 2 | TCTA:TPBI | 7.51 | 14.5 | 6.13 | 0.31, 0.62 |

Referring to Table 3, the organic light emitting diode according to Example 6 had twice as high a luminous efficiency as the organic light emitting diode according to Comparative Example 2. TCTA is a host with excellent hole-transporting characteristic and TPBI is a host with electron-transporting characteristic. However, the organic light emitting diode using the compound of Example 1 had excellent bipolar characteristics, compared with the organic light emitting diode using a mixture of two compounds according to Comparative Example 2.

By way of summation and review, a dopant (along with a host material) may be included in an emission layer to increase efficiency and stability of organic light emitting diode.

4-N,N-dicarbazolebiphenyl (CBP) has been considered as a host material. However, CBP has high structural symmetry and may be easily crystallized. Due to low thermal stability, a short-circuit or a pixel defect may occur during heat resistance test of a device. Furthermore, host materials (such as CBP) may have faster hole transport speed than electron transport speed. Thus, an exciton may not be effectively formed in an emission layer, decreasing luminous efficiency of a device.

A low molecular weight host material may be deposited using a vacuum-deposition, which may cost more than a wet process. Further, low molecular weight host materials may have low solubility in an organic solvent. Thus, they may not be applied in a wet process and may not form an organic thin layer having excellent film characteristics.

Accordingly, in order to realize an organic photoelectric device with excellent efficiency and life-span, the embodiments provide a phosphorescent host material and a charge transport material having excellent electrical and thermal stability and bipolar characteristics (effectively transporting both holes and electrons) or a host material mixed with a material being capable of effectively transporting holes and electrons.

The embodiments provide a compound for an organic photoelectric device having excellent thermal stability, and being capable of effectively transporting holes and electrons.

The embodiments also provide an organic photoelectric device having excellent efficiency and a driving voltage by including the compound for an organic photoelectric device.

The compound for an organic photoelectric device according to an embodiment may have excellent thermal stability, and particularly, may be applied to an organic thin layer of an organic photoelectric device and thus may provide an organic photoelectric device and a display device having high luminous efficiency at a low voltage and improved life-span.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic photoelectric device, the compound being represented by the following Chemical Formula 1:

[Chemical Formula 1]

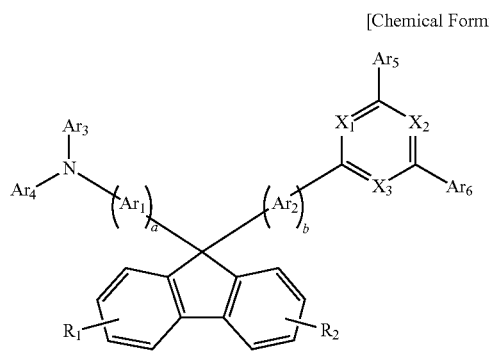

wherein, in Chemical Formula 1:
$X_1$ to $X_3$ are each independently N or CR, in which R is hydrogen or a C1 to C10 alkyl group and provided that at least one of $X_1$ to $X_3$ is N,
$Ar_1$ and $Ar_2$ are each independently a substituted or unsubstituted C6 to C18 arylene group,
$Ar_3$ and $Ar_4$ are each independently a substituted or unsubstituted C1 to C30 alkyl group, a substituted or unsubstituted C1 to C30 alkylene group, a substituted or unsubstituted C6 to C30 aryl group, a substituted or unsubstituted C6 to C30 arylene group, a substituted or unsubstituted C2 to C30 heteroaryl group, a substituted or unsubstituted C2 to C30 heteroarylene group, or a combination thereof, or $Ar_3$ and $Ar_4$ are fused to each other to provide a fused ring,
$Ar_5$ and $Ar_6$ are each independently a substituted or unsubstituted C1 to C30 alkyl group, a substituted or unsubstituted C6 to C30 aryl group, or a combination thereof,
$R_1$ and $R_2$ are each independently hydrogen or a C1 to C10 alkyl group, and
a and b are each independently 1 or 2.

2. The compound for an organic photoelectric device as claimed in claim 1, wherein all of $X_1$ to $X_3$ of Chemical Formula 1 are N.

3. The compound for an organic photoelectric device as claimed in claim 1, wherein $Ar_1$ and $Ar_2$ in Chemical Formula 1 are each independently a phenylene group, a naphthylene group, an anthracenylene group, or a combination thereof.

4. The compound for an organic photoelectric device as claimed in claim 1, wherein $Ar_3$ to $Ar_6$ of Chemical Formula 1 are each independently a phenyl group, a naphthyl group, an anthracenyl group, a phenanthrenyl group, a tetracenyl group, a pyrenyl group, a fluorenyl group, or a combination thereof.

5. The compound for an organic photoelectric device as claimed in claim 1, wherein $Ar_3$ to $Ar_6$ of Chemical Formula 1 are each independently represented by one of the following Chemical Formulae 2a to 2c, or a combination thereof:

[Chemical Formula 2a]
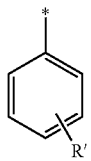

[Chemical Formula 2b]
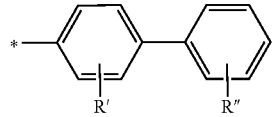

[Chemical Formula 2c]
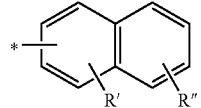

wherein, in Chemical Formulae 2a to 2c, R' and R" are each independently hydrogen, a C1 to C10 alkyl group, a C6 to C18 aryl group, or a combination thereof.

6. The compound for an organic photoelectric device as claimed in claim 1, wherein the compound for an organic photoelectric device represented by Chemical Formula 1 is represented by the following Chemical Formula 3a or Chemical Formula 3b:

[Chemical Formula 3a]
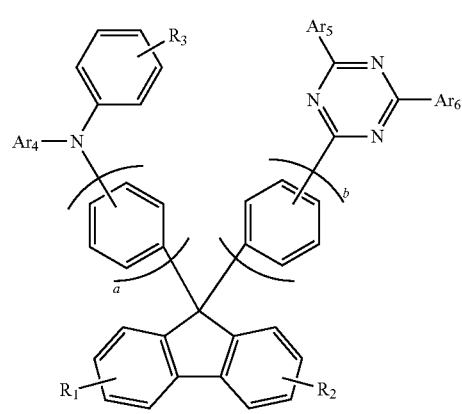

[Chemical Formula 3b]
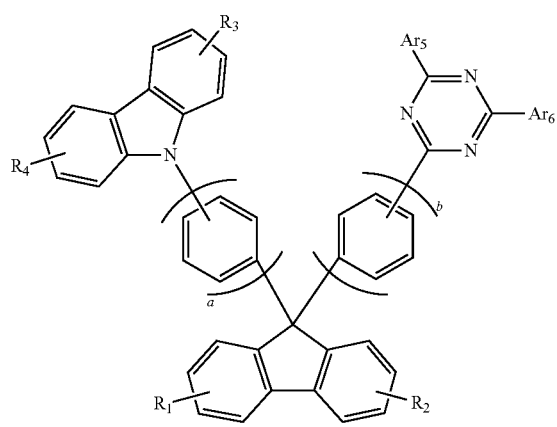

wherein, in Chemical Formulae 3a and 3b:
Ar$_4$ is a substituted or unsubstituted C1 to C30 alkyl group, a substituted or unsubstituted C6 to C30 aryl group, a substituted or unsubstituted C2 to C30 heteroaryl group, or a combination thereof,
Ar$_5$ and Ar$_6$ are each independently a substituted or unsubstituted C1 to C30 alkyl group, a substituted or unsubstituted C6 to C30 aryl group, or a combination thereof,
R$_1$ and R$_2$ are each independently hydrogen or a C1 to C10 alkyl group, R$_3$ and R$_4$ are each independently hydrogen, a C1 to C10 alkyl group, a C6 to C18 aryl group, or a combination thereof, and a and b are each independently 1 or 2.

7. The compound for an organic photoelectric device as claimed in claim 1, wherein the compound represented by Chemical Formula 1 is represented by one of the following Chemical Formulae 4 to 35 and ad-1 to ad-4:

[Chemical Formula 4]

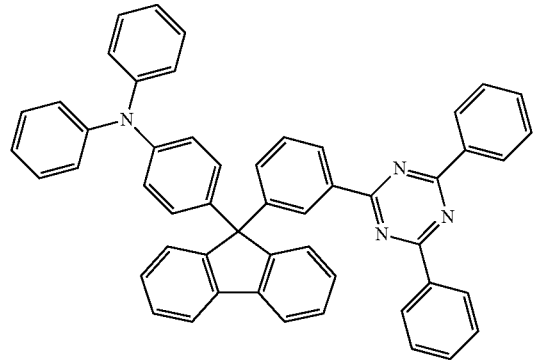

[Chemical Formula 5]

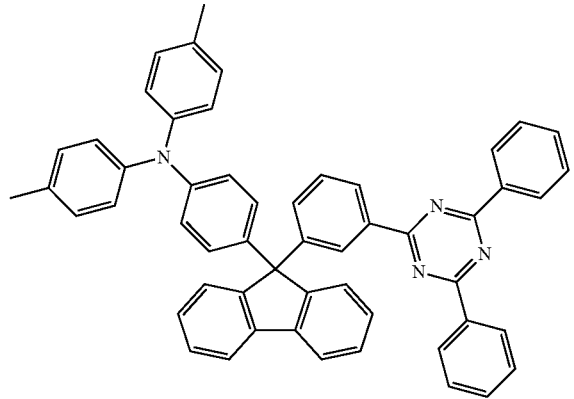

[Chemical Formula 6]

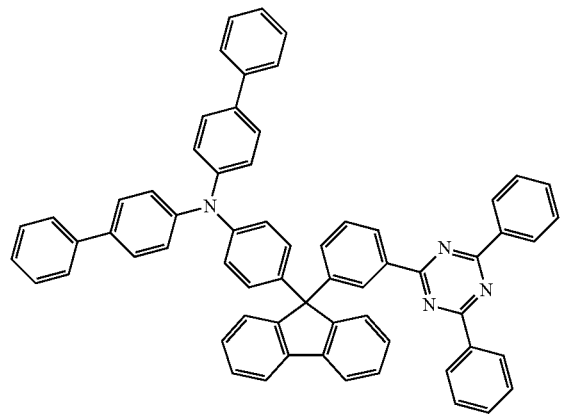

[Chemical Formula 7]

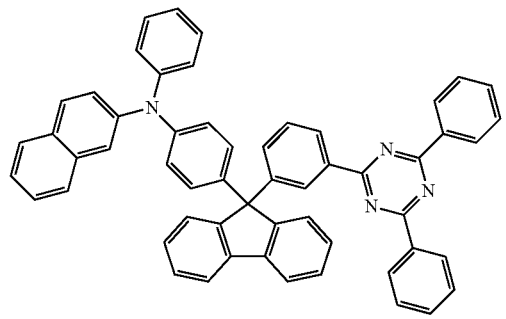

[Chemical Formula 8]

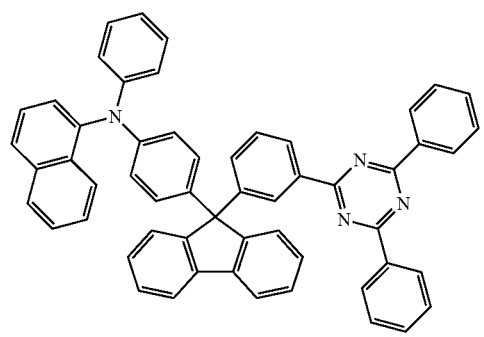

[Chemical Formula 9]

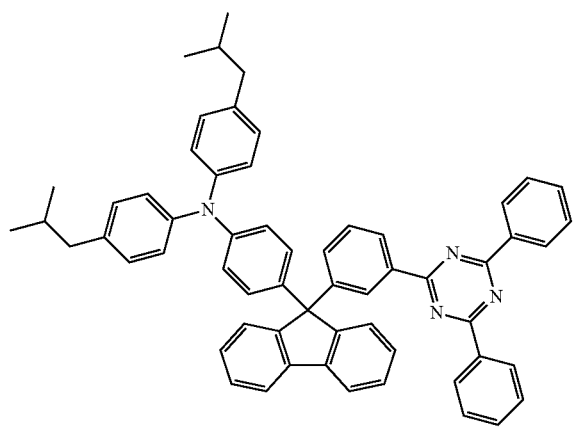

-continued
[Chemical Formula 10]
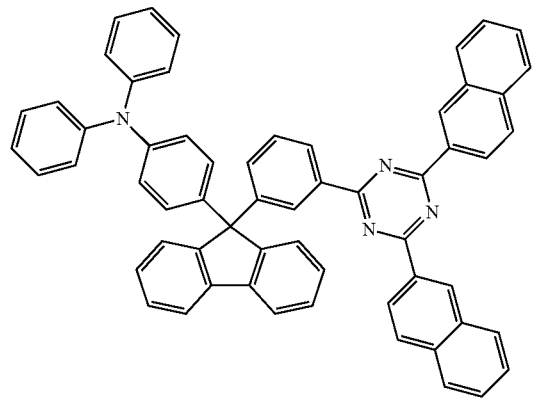
[Chemical Formula 11]
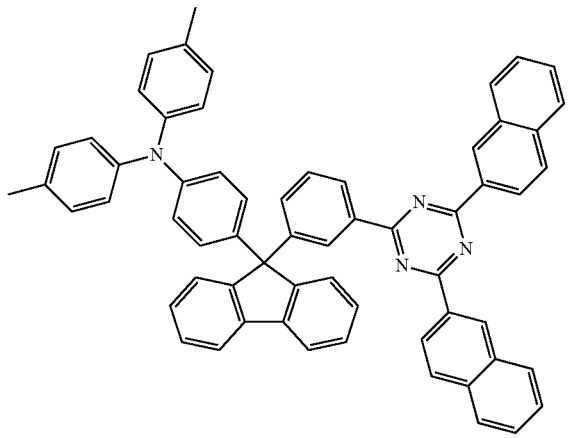
[Chemical Formula 12]
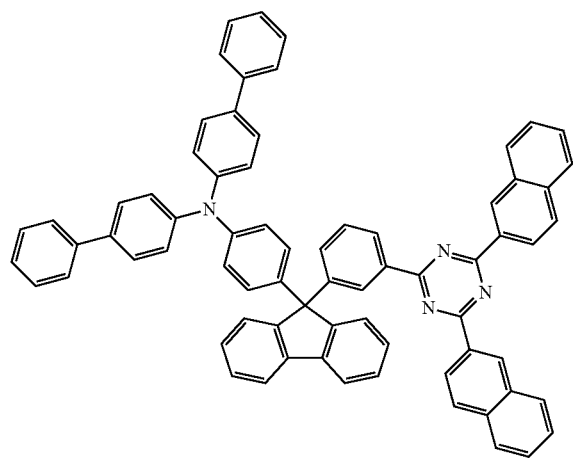
[Chemical Formula 13]
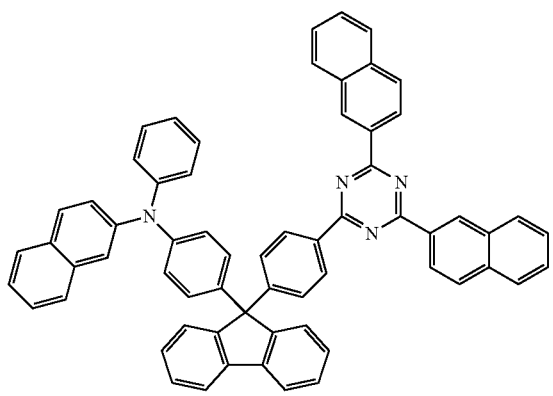
[Chemical Formula 14]
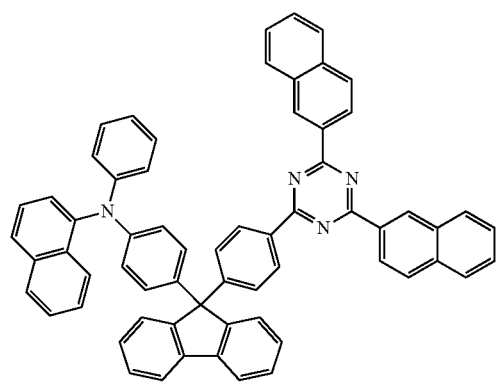
[Chemical Formula 15]
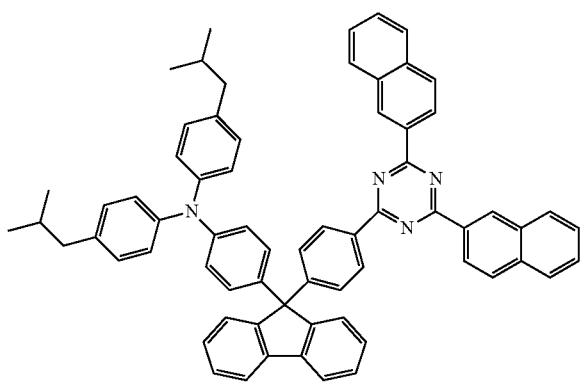

[Chemical Formula 16]
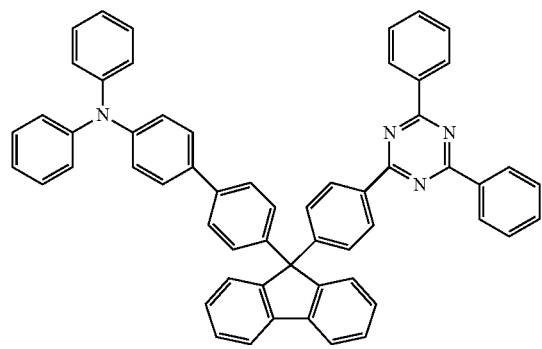
[Chemical Formula 17]
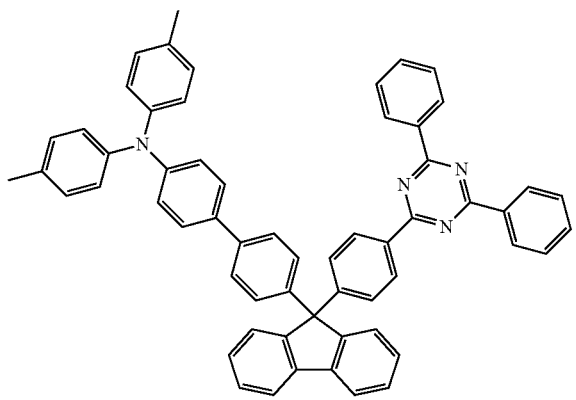
[Chemical Formula 18]
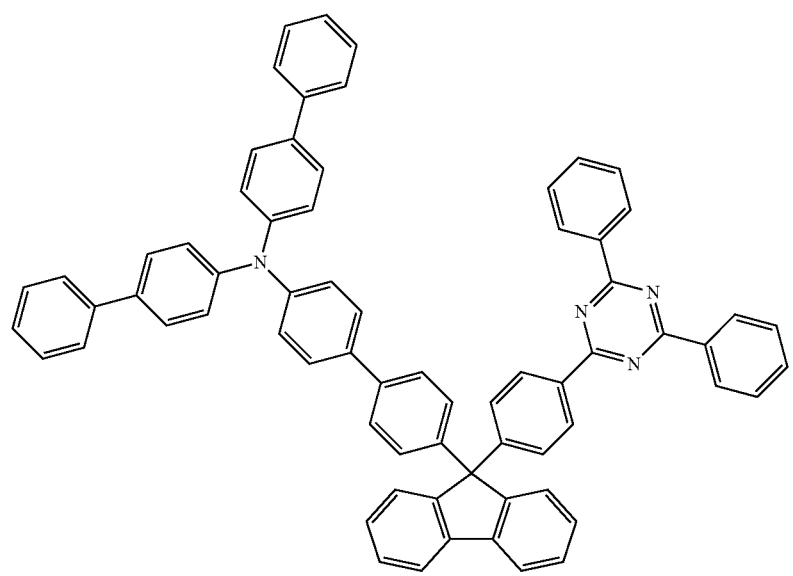
[Chemical Formula 19]
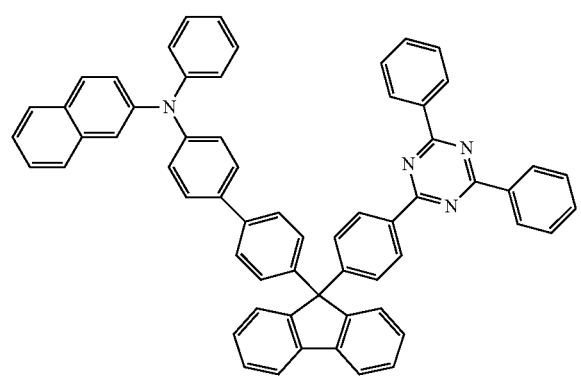
[Chemical Formula 20]
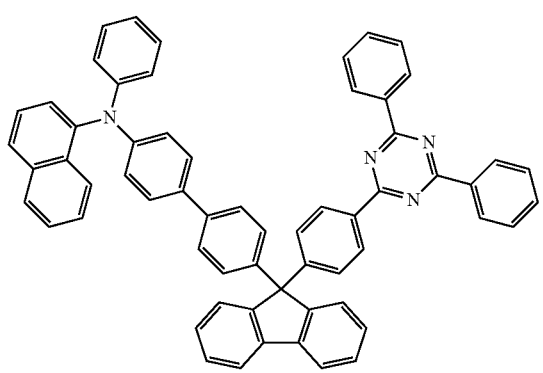

-continued
[Chemical Formula 21]
[Chemical Formula 22]
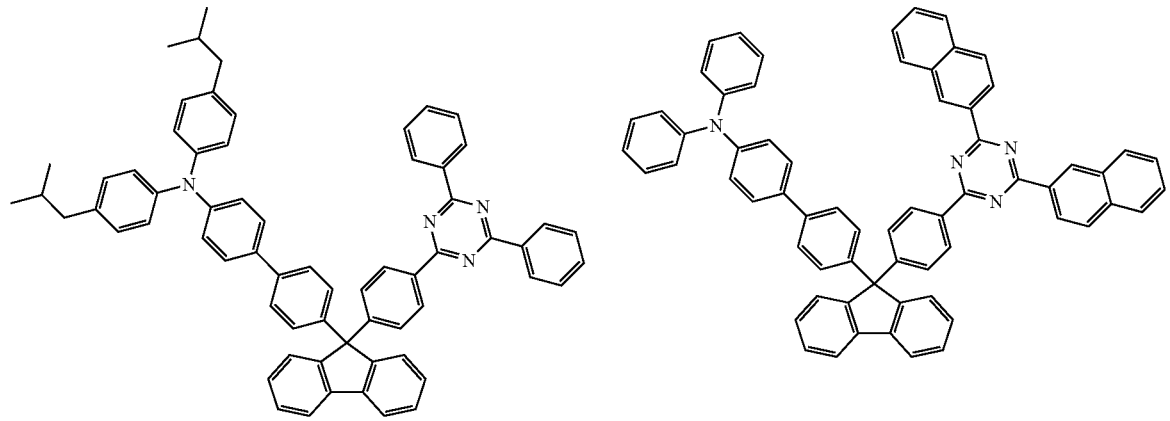
[Chemical Formula 23]
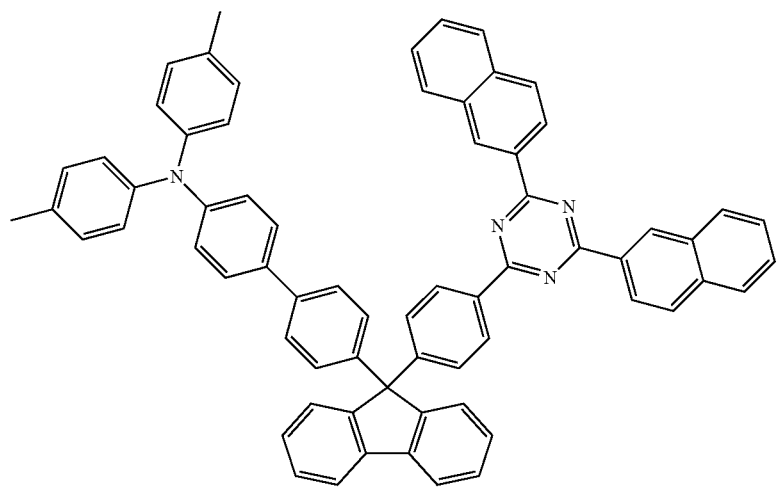
[Chemical Formula 24]
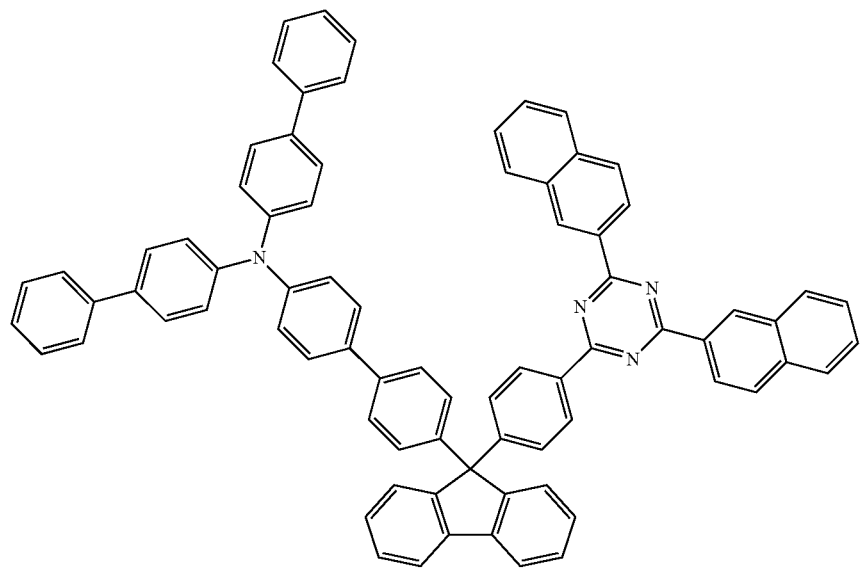

[Chemical Formula 25]
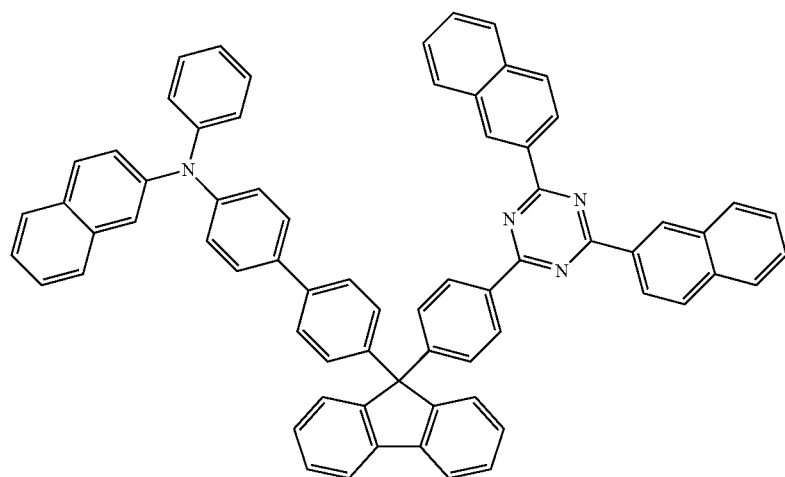
[Chemical Formula 26]
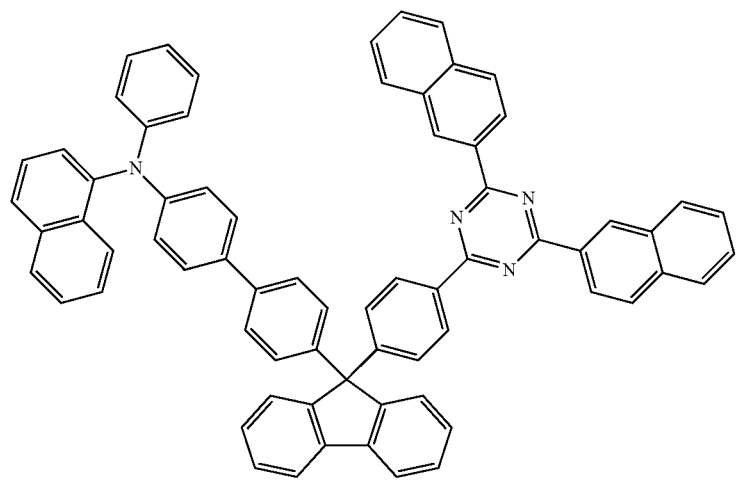
[Chemical Formula 27]
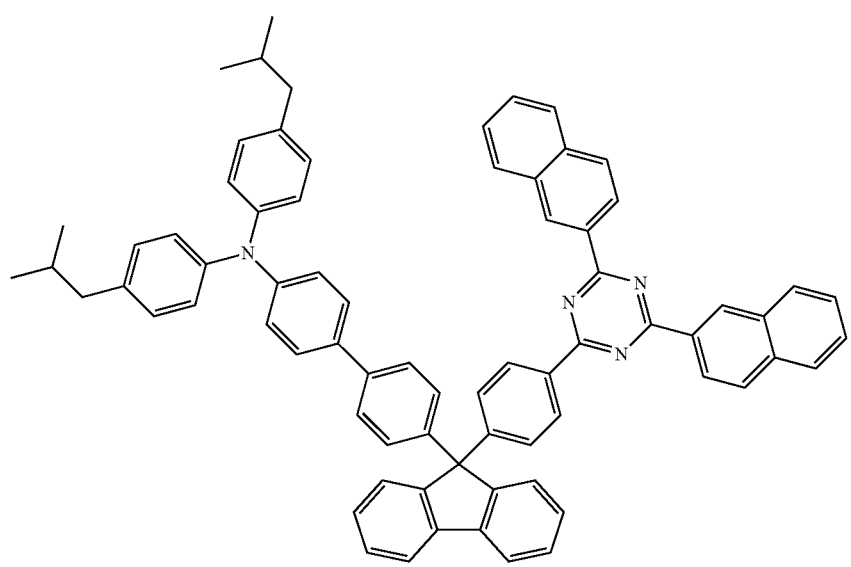

[Chemical Formula 28]
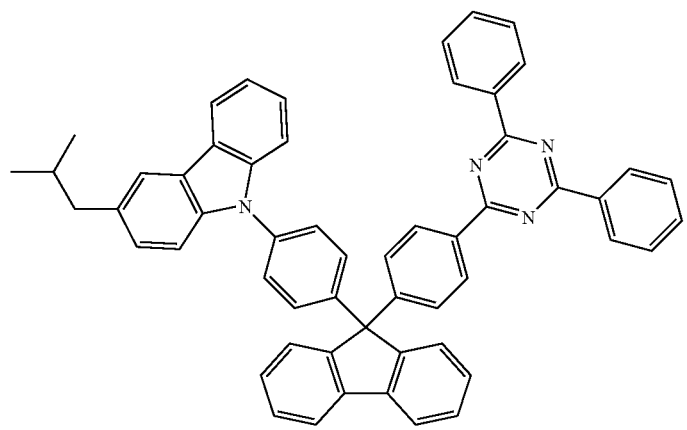
[Chemical Formula 29]
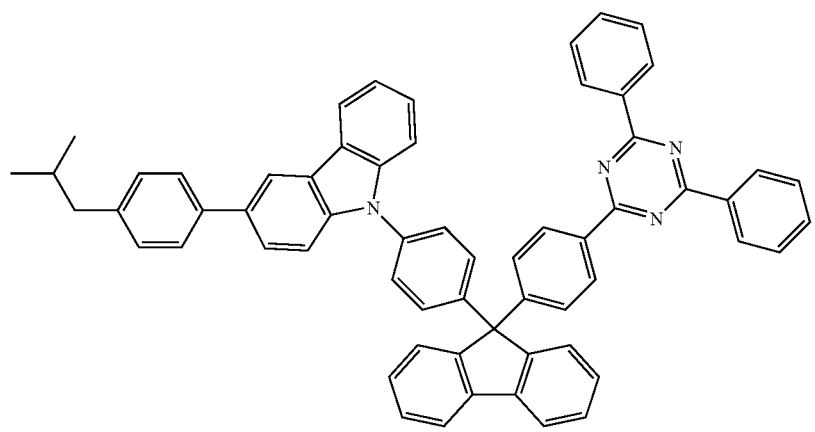
[Chemical Formula 30]
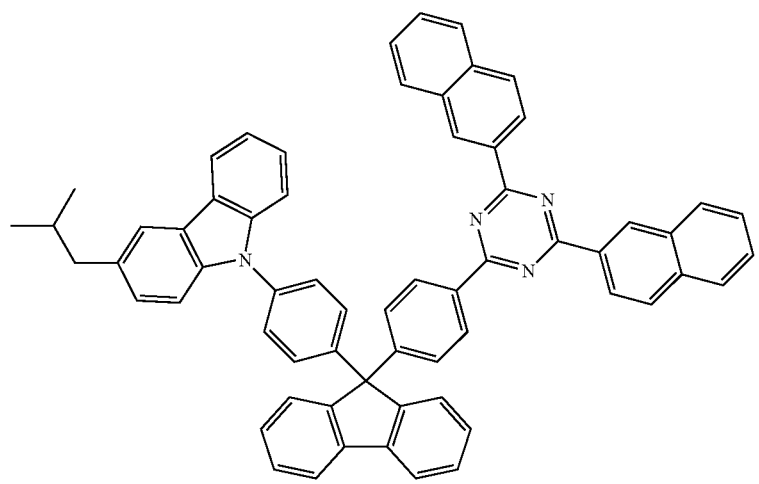

[Chemical Formula 31]
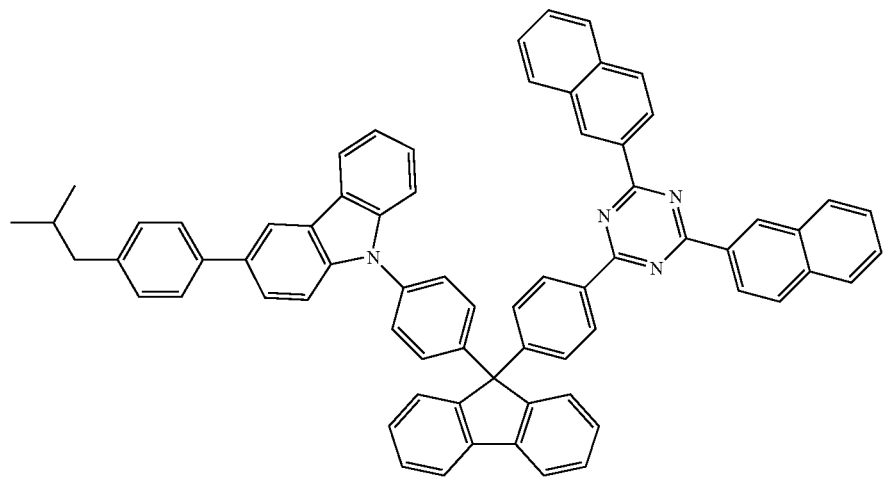
[Chemical Formula 32]
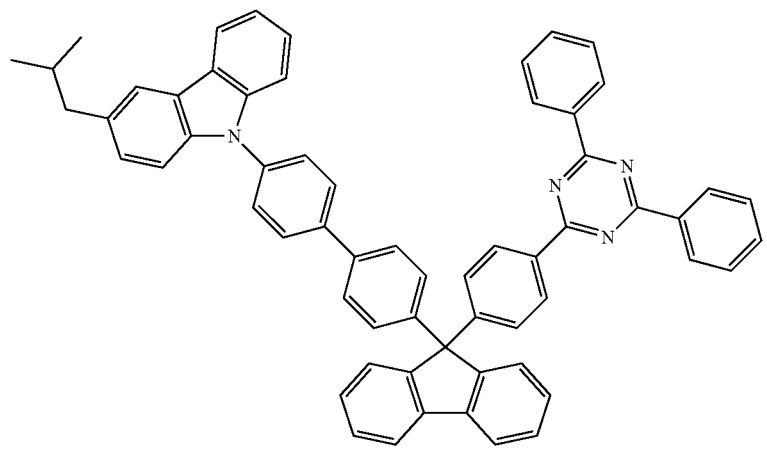
[Chemical Formula 33]
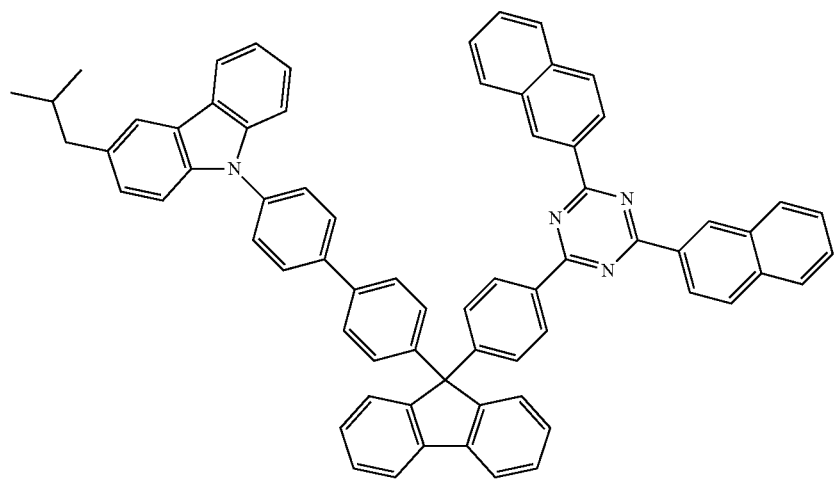

[Chemical Formula 34]
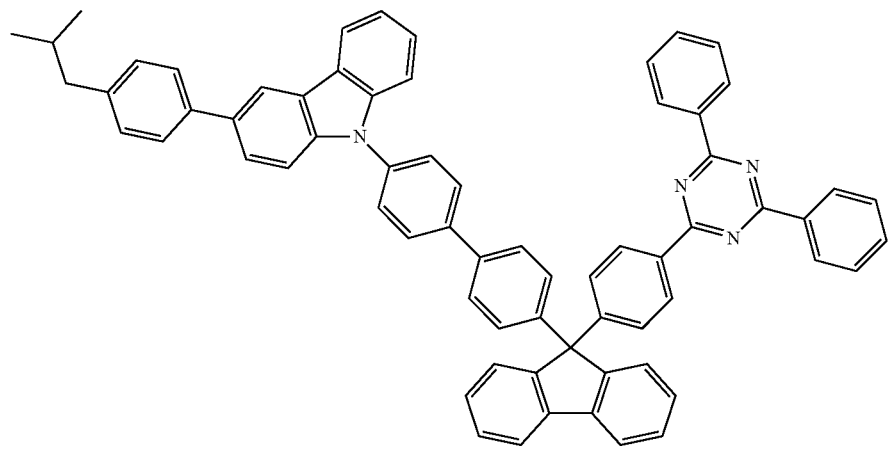
[Chemical Formula 35]
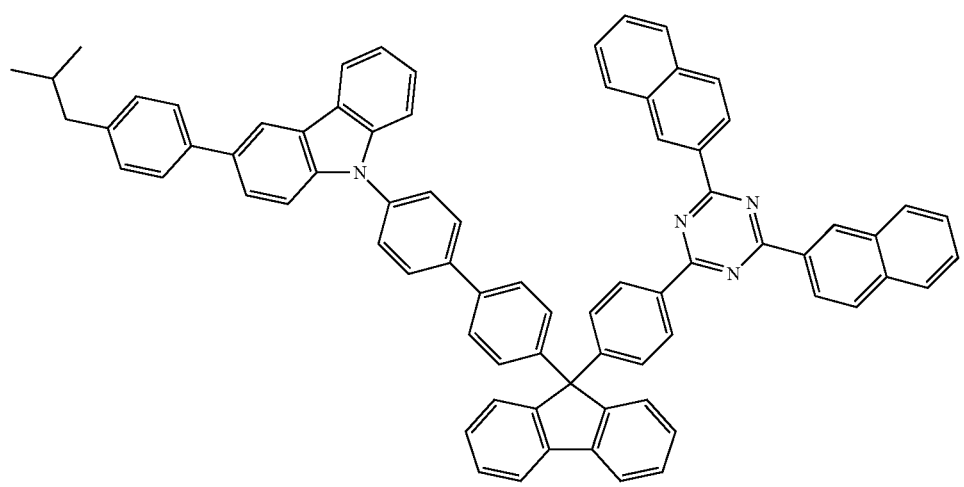
[Chemical Formula ad-1]
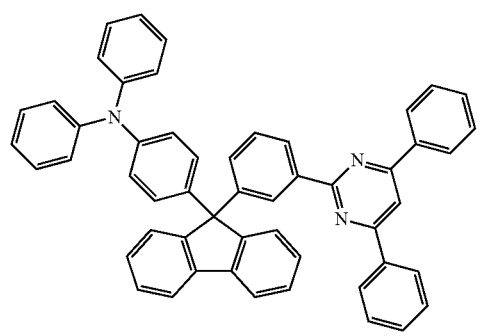
[Chemical Formula ad-2]
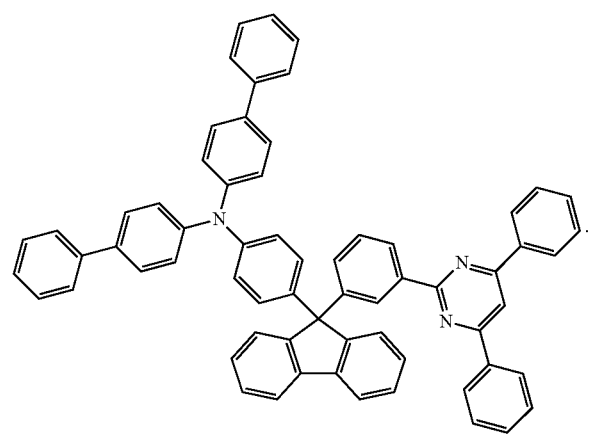

[Chemical Formula ad-3]

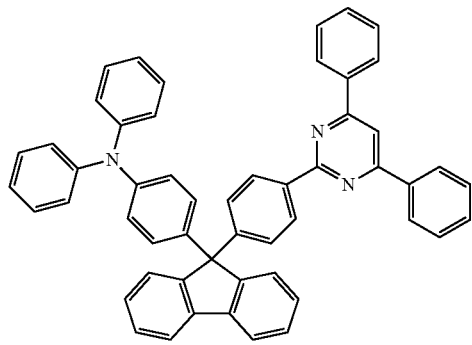

[Chemical Formula ad-4]

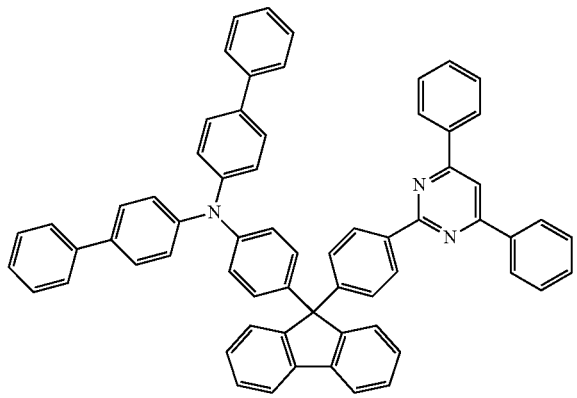

8. A compound for an organic photoelectric device, the compound being represented by the following Chemical Formula A-1:

[Chemical Formula A-1]

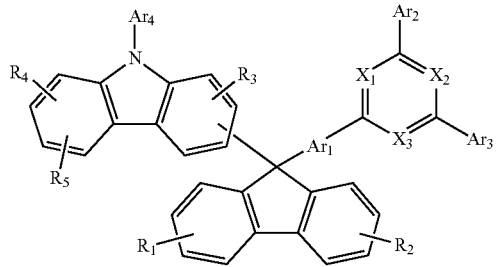

wherein, in Chemical Formula A-1:

$X_1$ to $X_3$ are each independently N or CR, in which R is hydrogen or a C1 to C10 alkyl and provided that at least one of $X_1$ to $X_3$ is N, $Ar_1$ is a single bond or a substituted or unsubstituted C6 to C18 arylene group, $Ar_2$ and $Ar_3$ are each independently a substituted or unsubstituted C1 to C30 alkyl group, a substituted or unsubstituted C6 to C30 aryl group, or a combination thereof, $Ar_4$ is a substituted or unsubstituted C1 to C30 alkyl group, a substituted or unsubstituted C6 to C30 aryl group, a substituted or unsubstituted C2 to C30 heteroaryl group, or a combination thereof, $R_1$ to $R_3$ are each independently hydrogen or a C1 to C10 alkyl group, and $R_4$ and $R_5$ are each independently hydrogen, a substituted or unsubstituted C1 to C30 alkyl group, a substituted or unsubstituted C6 to C30 aryl group, a substituted or unsubstituted C2 to C30 heteroaryl group, or a combination thereof, or $R_4$ and $R_5$ are fused to an adjacent ring to provide a fused ring.

9. The compound for an organic photoelectric device as claimed in claim 1, wherein the compound represented by Chemical Formula 1 is represented by one of the following Chemical Formulae 4, 6 to 10, 12 to 16, 18 to 22, 24 to 35, and ad-1 to ad-4:

[Chemical Formula 4]

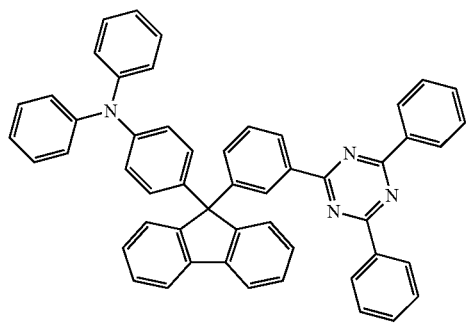

[Chemical Formula 6]

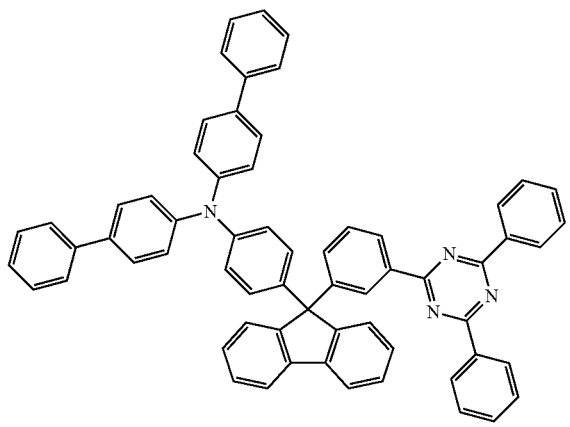

[Chemical Formula 7]
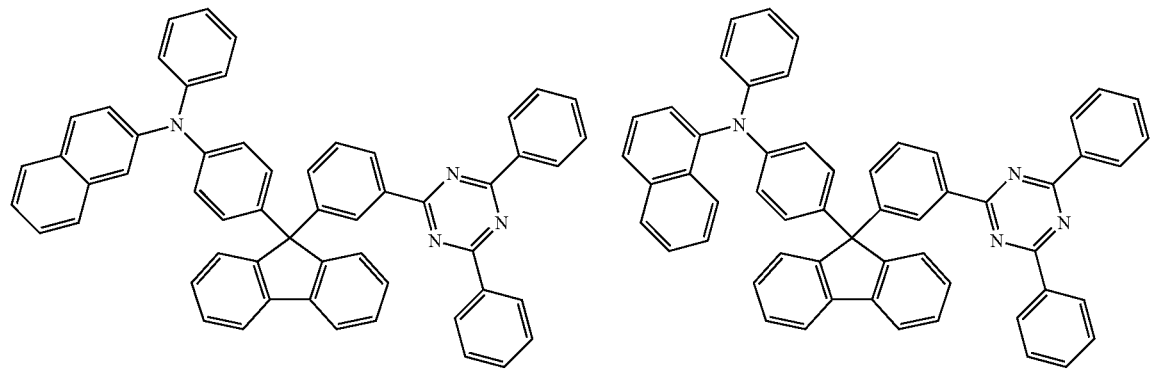
[Chemical Formula 8]
[Chemical Formula 9]
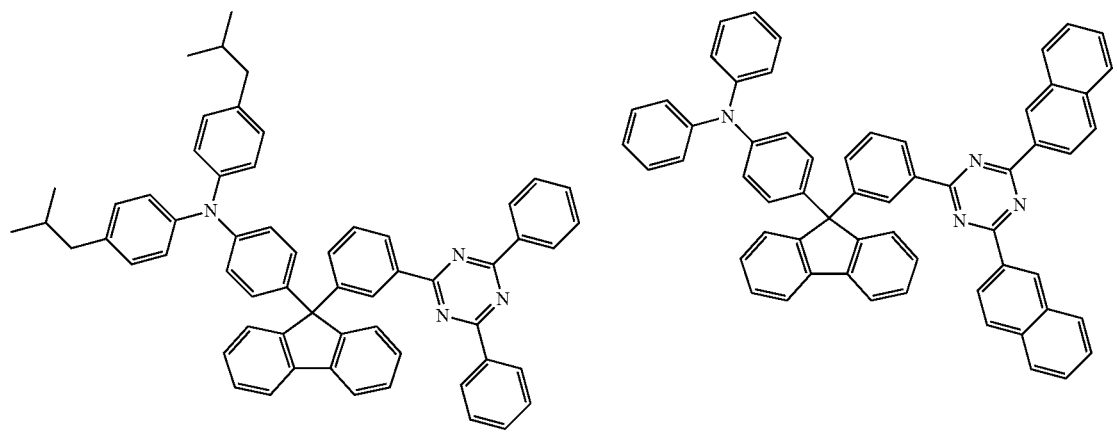
[Chemical Formula 10]
[Chemical Formula 12]
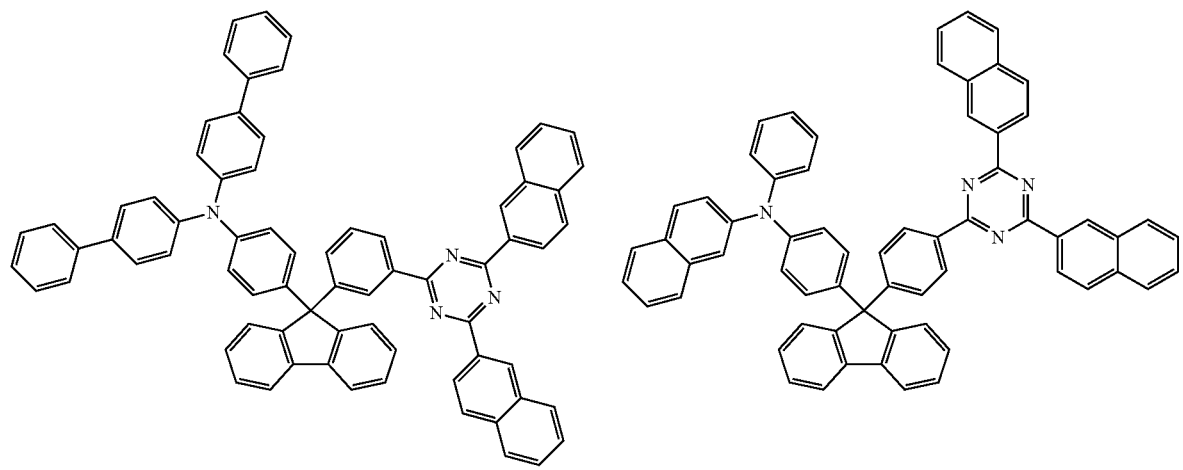
[Chemical Formula 13]

-continued
[Chemical Formula 14]
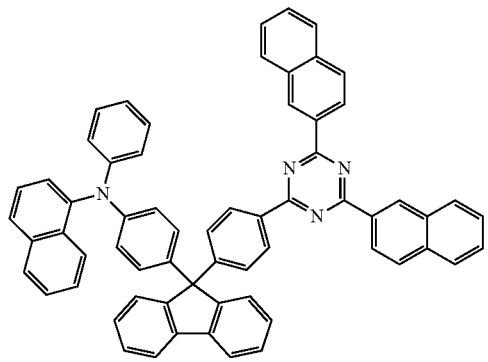
[Chemical Formula 15]
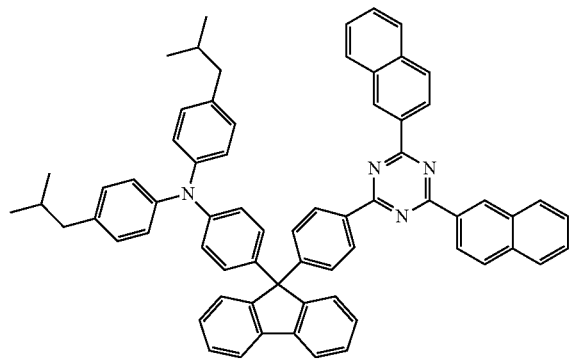
[Chemical Formula 16]
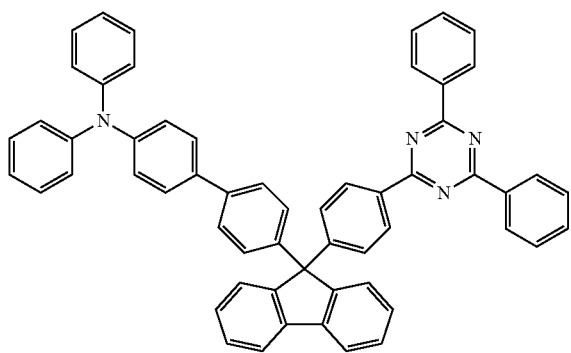
[Chemical Formula 18]
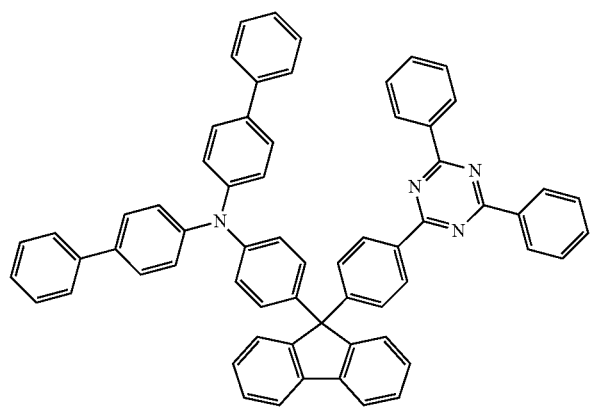
[Chemical Formula 19]
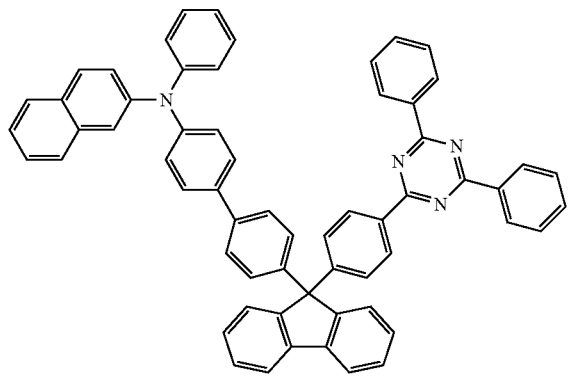
[Chemical Formula 20]
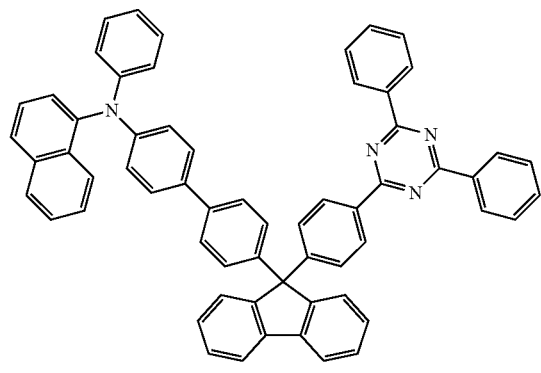
[Chemical Formula 21]
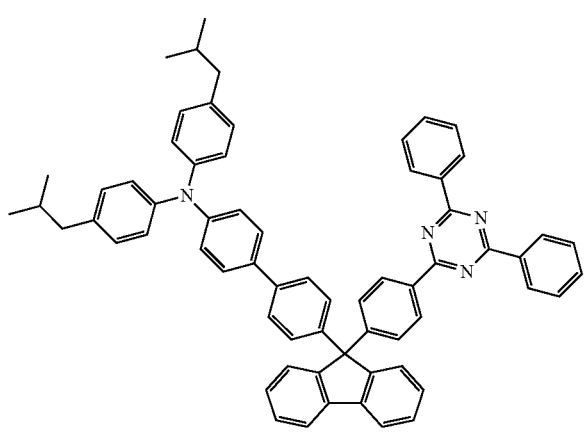
[Chemical Formula 22]
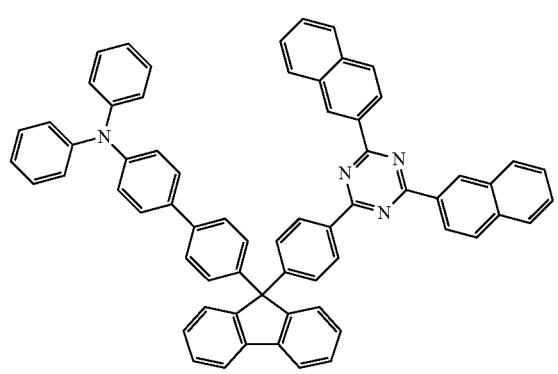

[Chemical Formula 24]
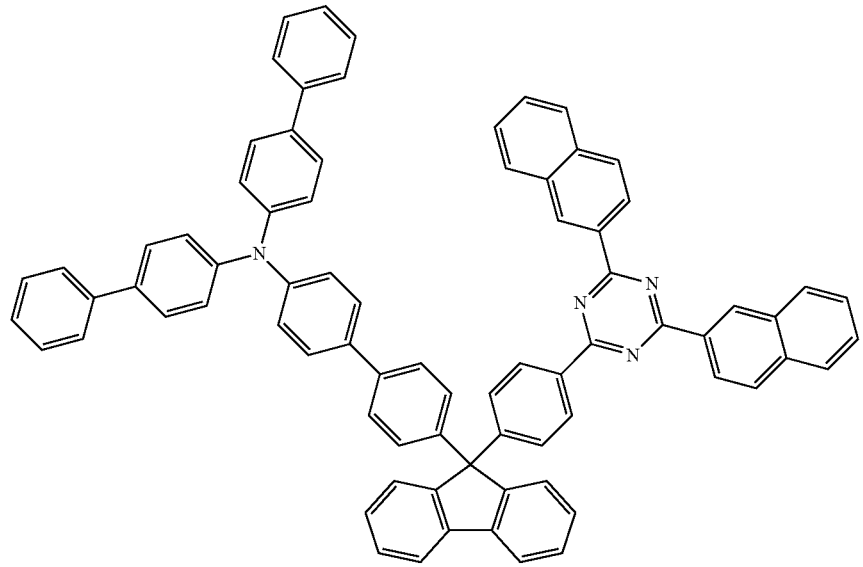
[Chemical Formula 25]
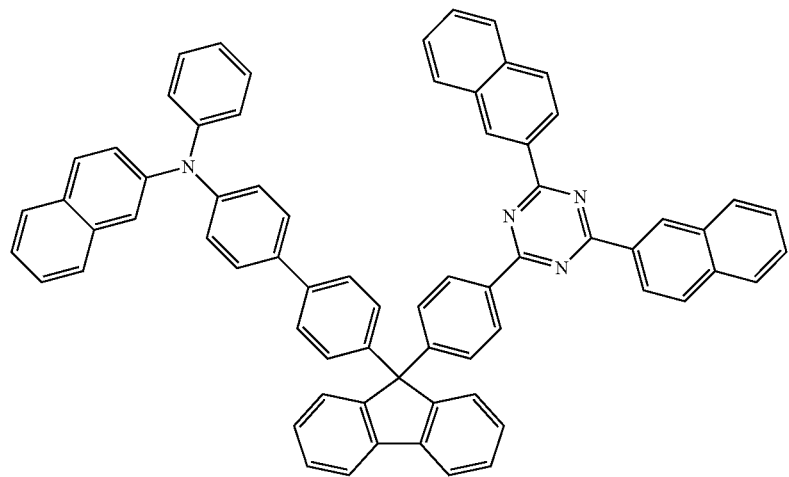
[Chemical Formula 26]
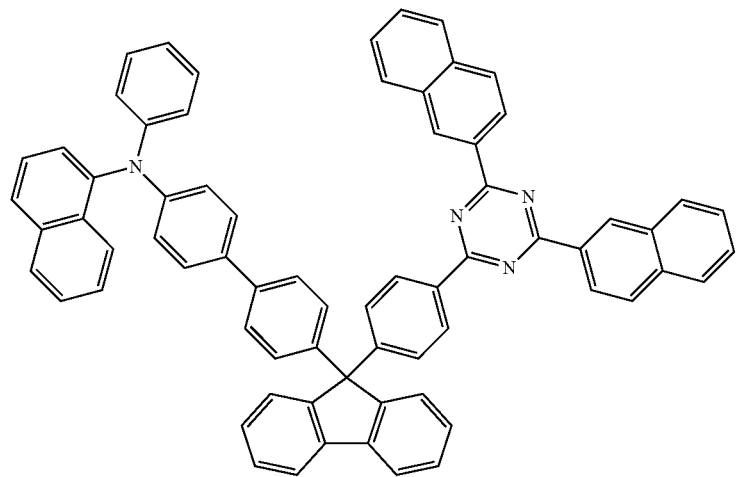

[Chemical Formula 27]
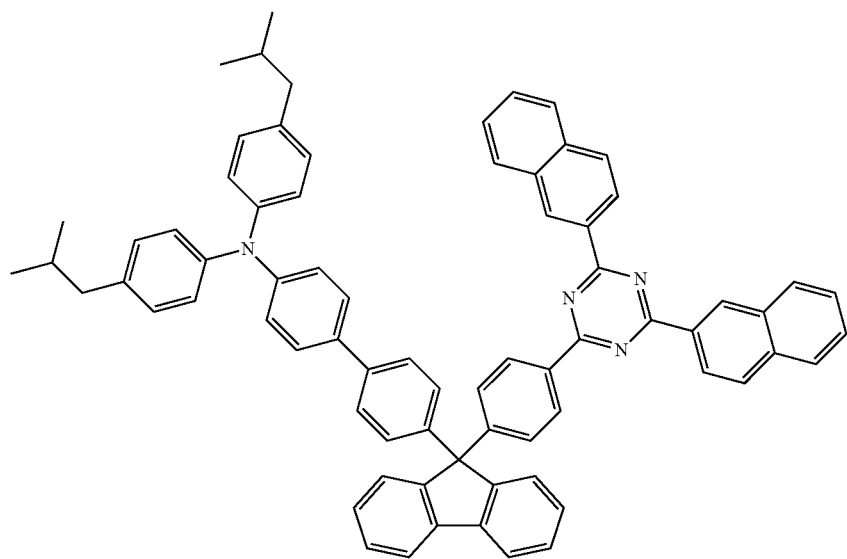
[Chemical Formula 28]
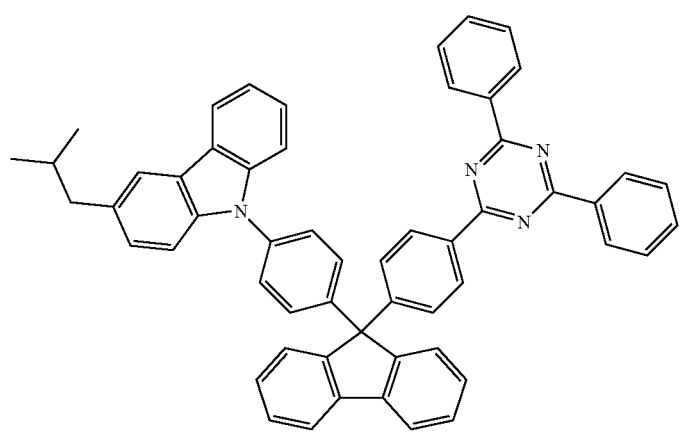
[Chemical Formula 29]
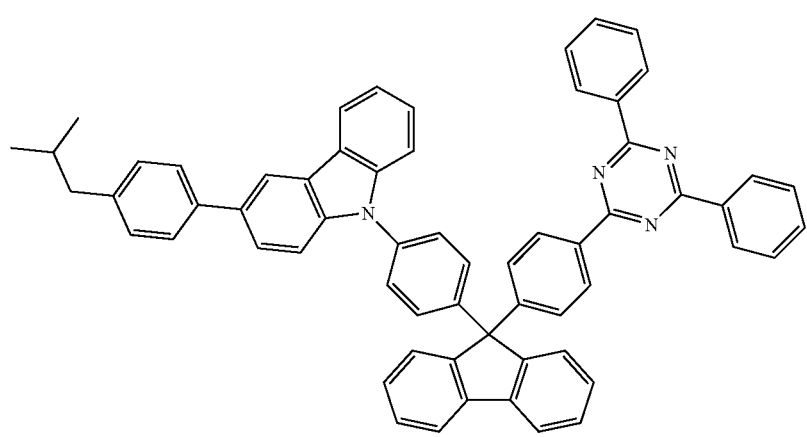

[Chemical Formula 30]
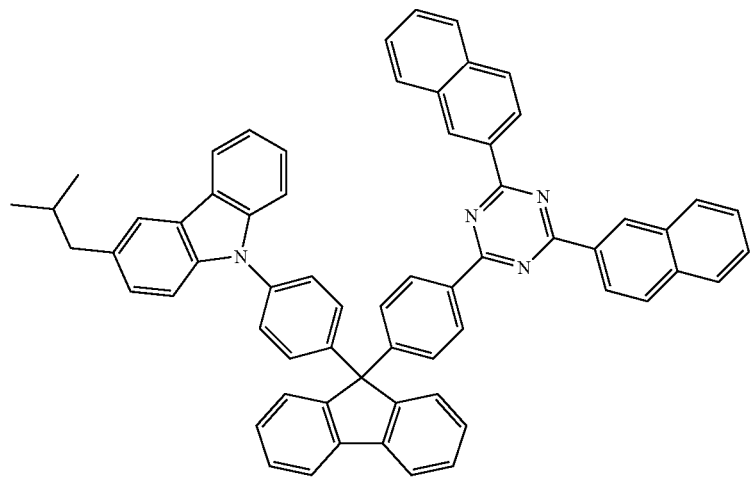
[Chemical Formula 31]
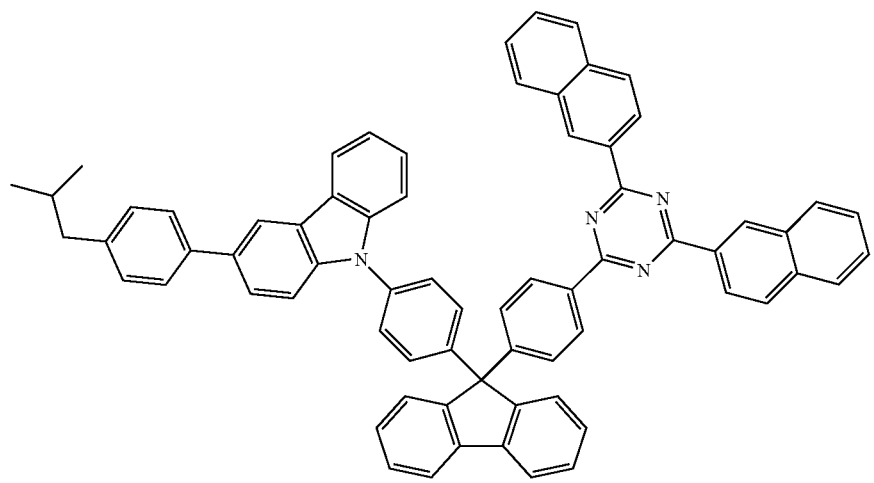
[Chemical Formula 32]
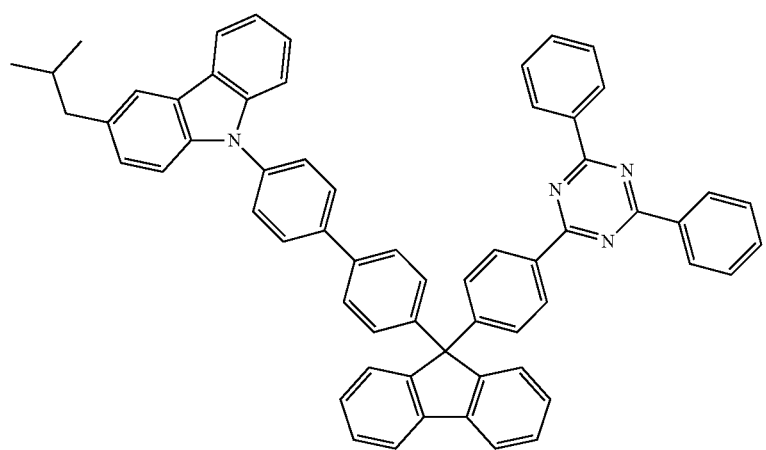

-continued
[Chemical Formula 33]
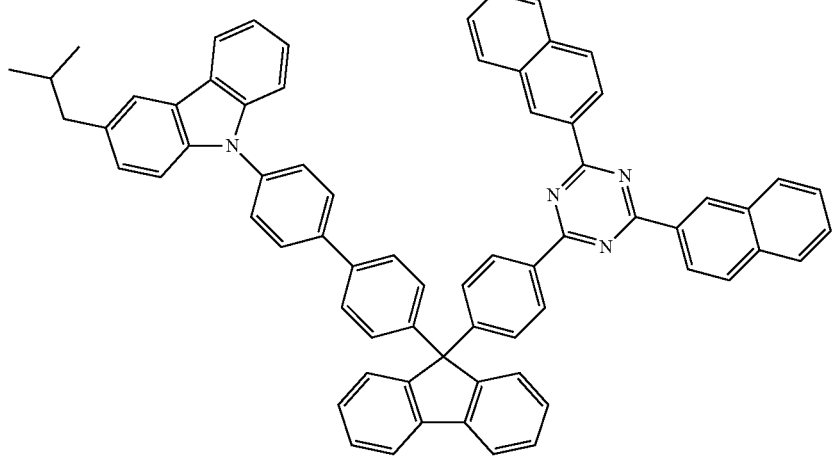
[Chemical Formula 34]
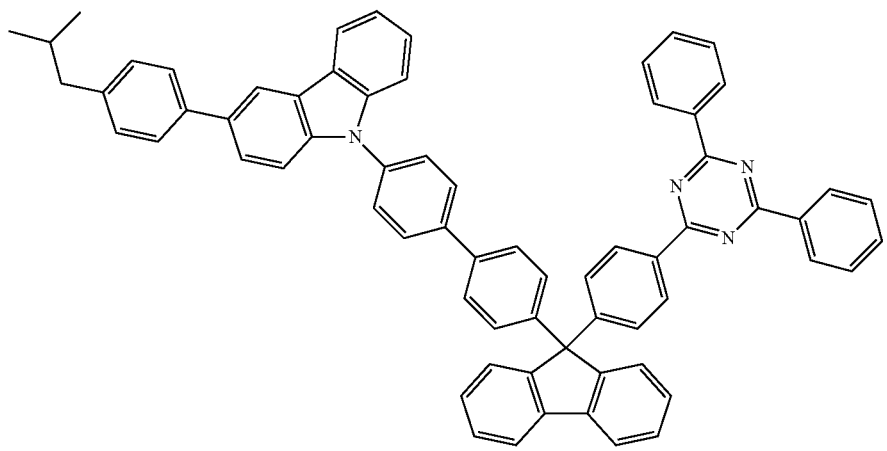
[Chemical Formula 35]
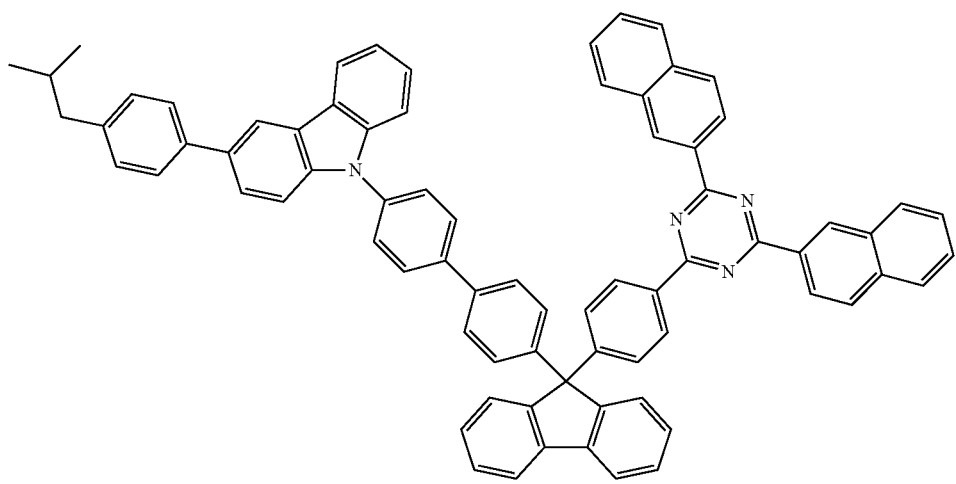

[Chemical Formula ad-1]
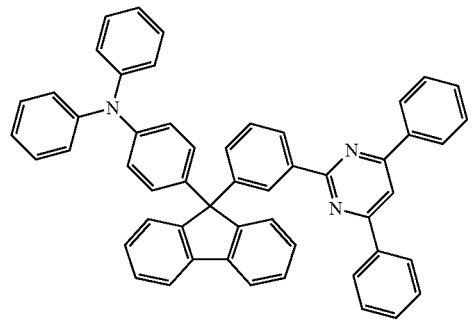
[Chemical Formula ad-2]
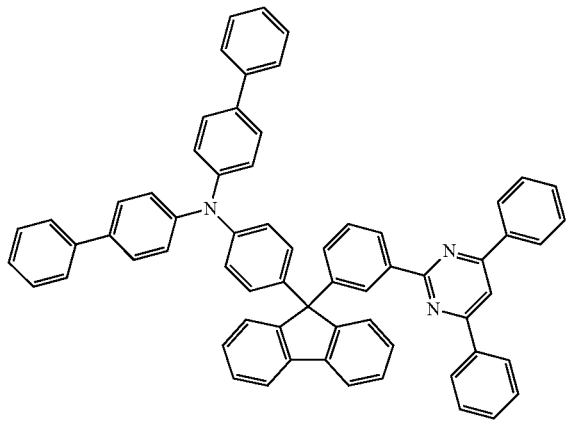
[Chemical Formula ad-3]
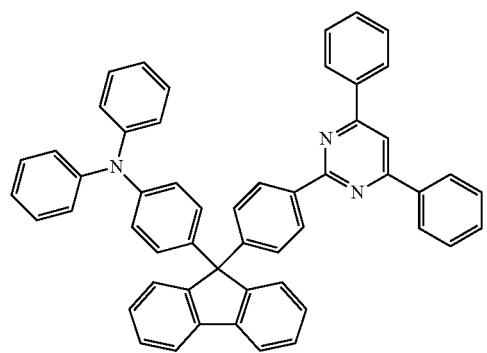
[Chemical Formula ad-4]
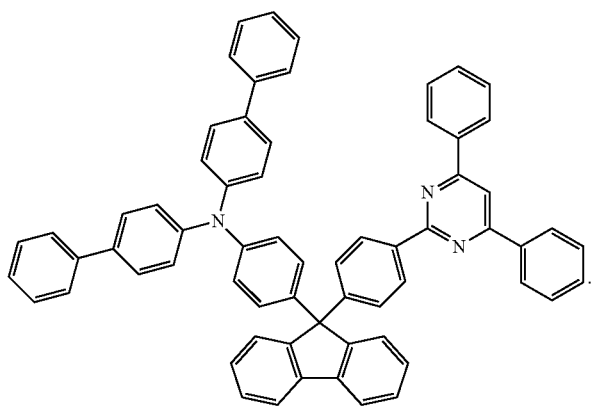
10. The compound for an organic photoelectric device as claimed in claim 8, wherein the compound represented by Chemical Formula A-1 is represented by one of the following Chemical Formulae ad-6 to ad-14, and ad-16 to ad-24:
[Chemical Formula ad-6]
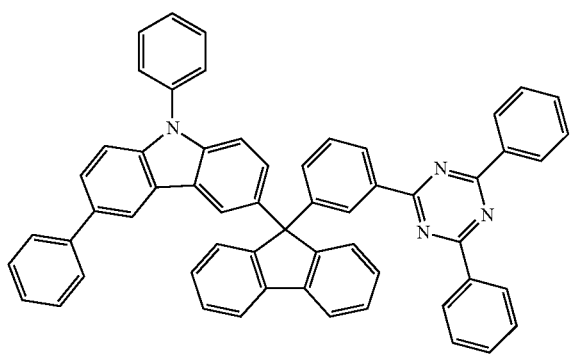
[Chemical Formula ad-7]
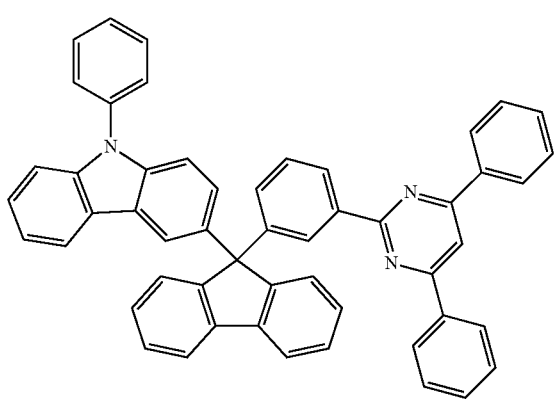

[Chemical Formula ad-8]
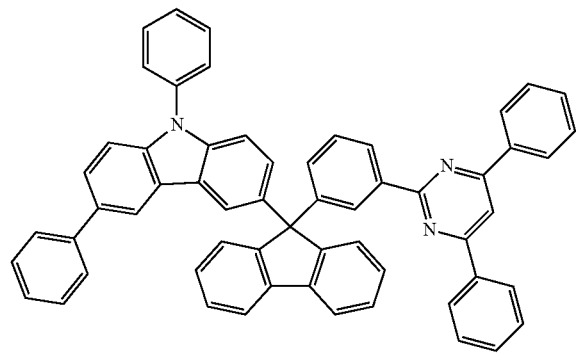
[Chemical Formula ad-12]
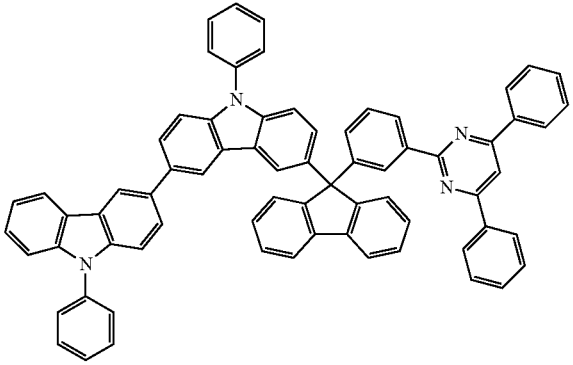
[Chemical Formula ad-9]
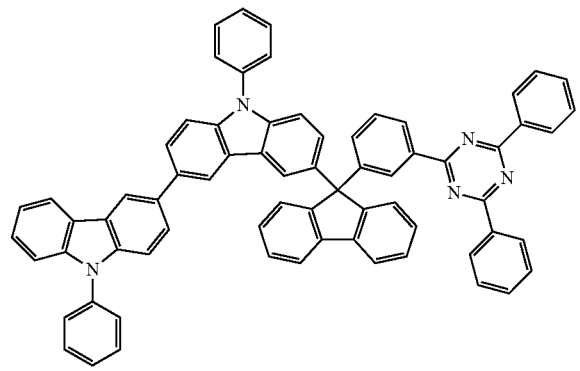
[Chemical Formula ad-13]
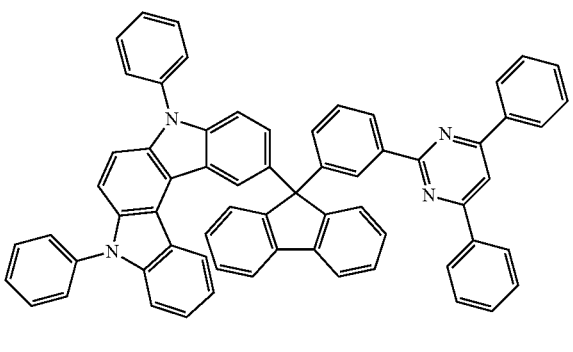
[Chemical Formula ad-10]
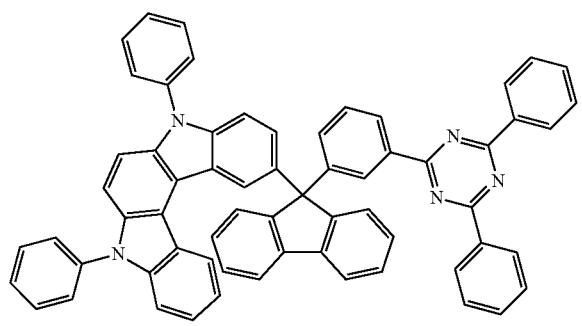
[Chemical Formula ad-14]
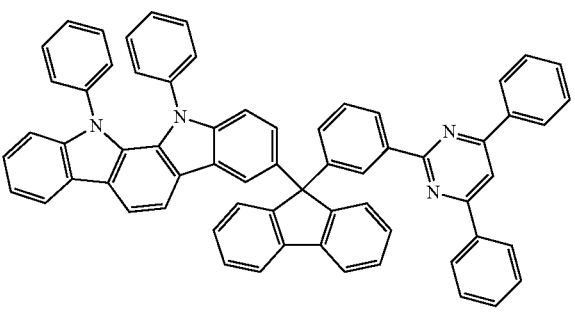
[Chemical Formula ad-11]
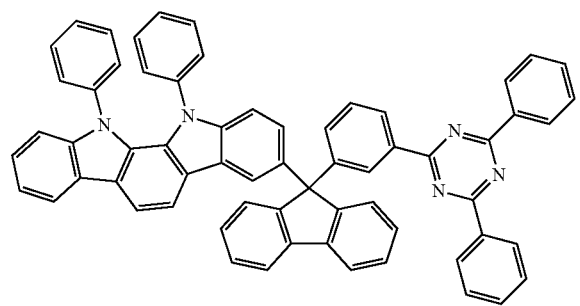
[Chemical Formula ad-16]
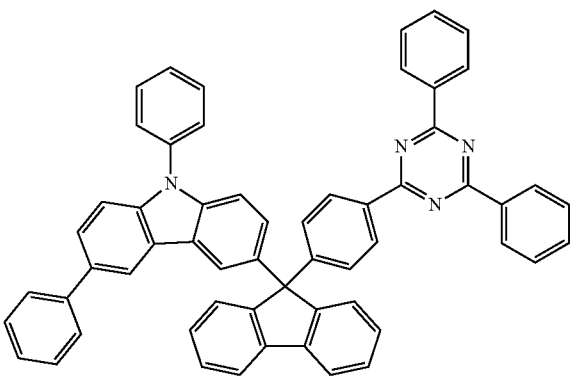

[Chemical Formula ad-17]
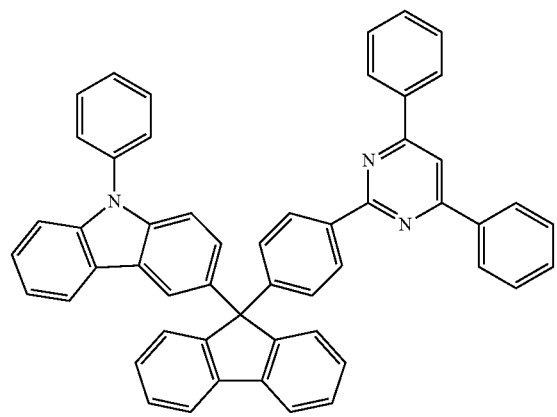
[Chemical Formula ad-18]
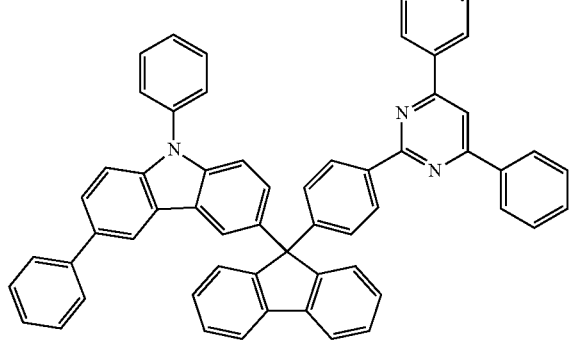
[Chemical Formula ad-19]
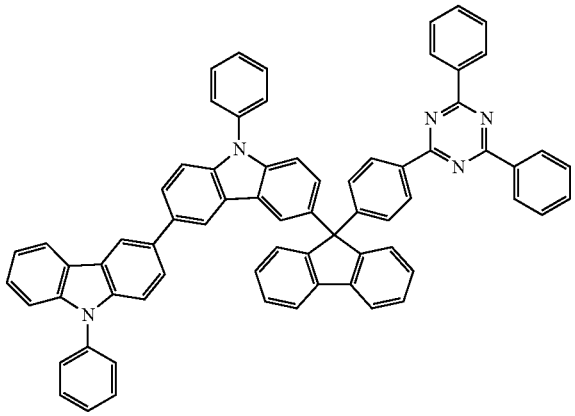
[Chemical Formula ad-20]
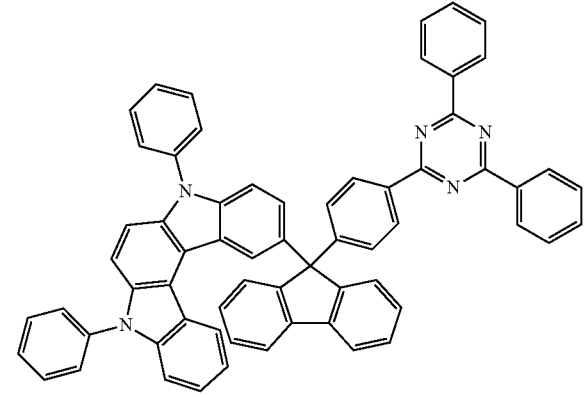
[Chemical Formula ad-21]
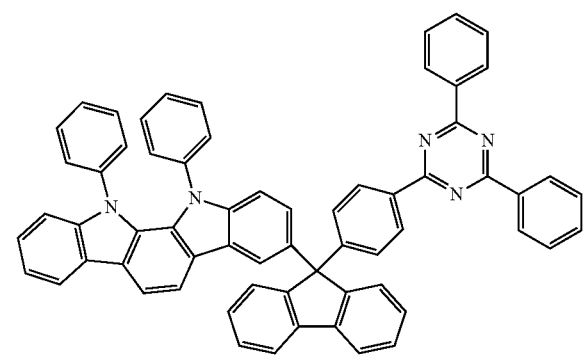
[Chemical Formula ad-22]
[Chemical Formula ad-23]
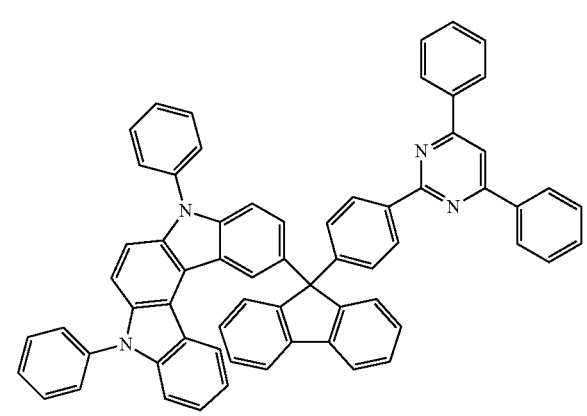

-continued

[Chemical Formula ad-24]

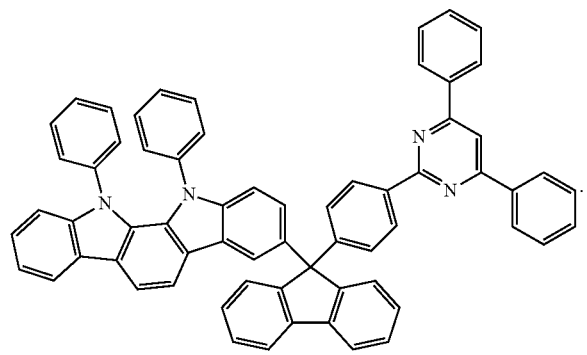

11. The compound for an organic photoelectric device as claimed in claim 1, wherein the compound for an organic photoelectric device is a charge transport material or a host material.

12. The compound for an organic photoelectric device as claimed in claim 1, wherein the compound for an organic photoelectric device has a glass transition temperature ($T_g$) of about 110° C. or higher and a thermal decomposition temperature (Td) of about 400° C. or higher.

13. The compound for an organic photoelectric device as claimed in claim 8, wherein the compound represented by Chemical Formula A-1 is represented by one of the following Chemical Formulae ad-5 to ad-24:

[Chemical Formula ad-5]

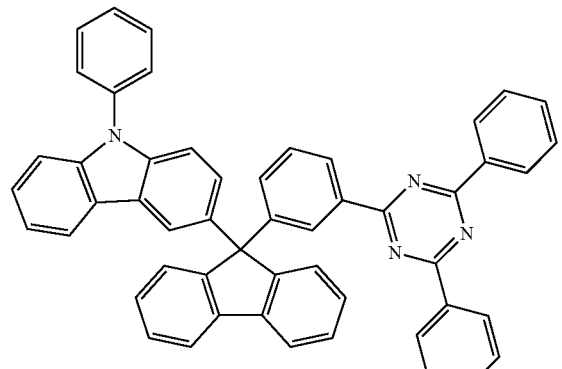

[Chemical Formula ad-6]

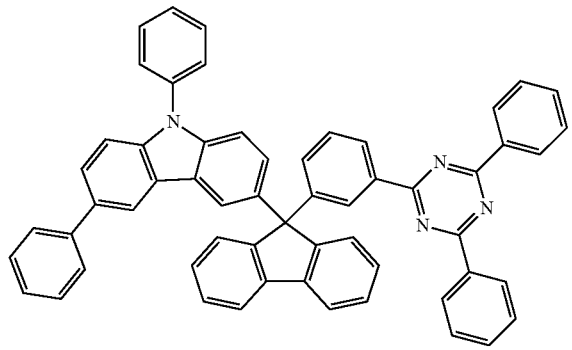

-continued

[Chemical Formula ad-7]

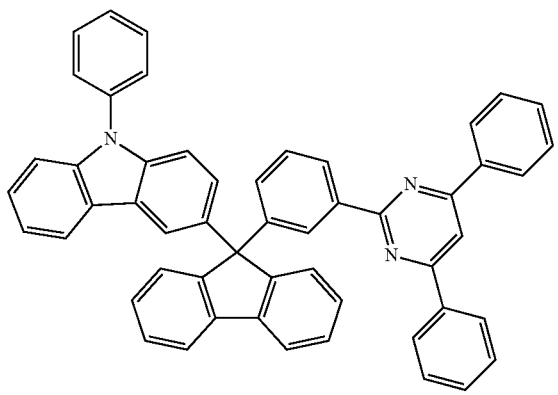

[Chemical Formula ad-8]

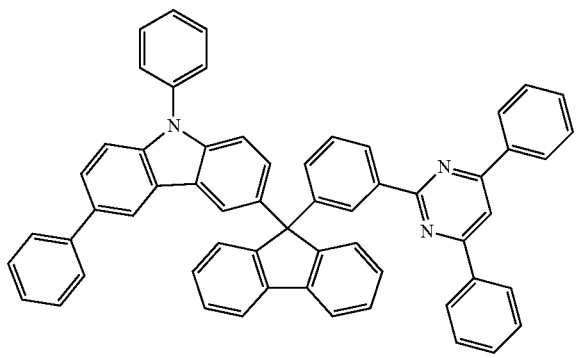

[Chemical Formula ad-9]

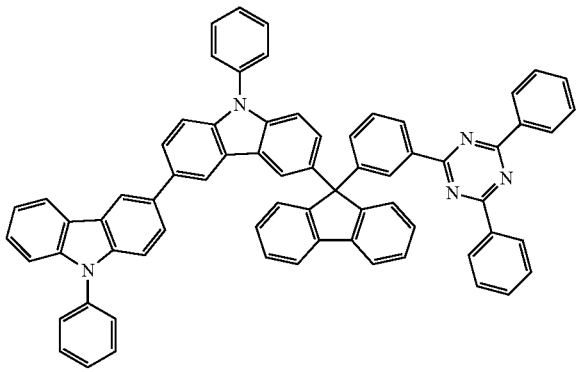

[Chemical Formula ad-10]

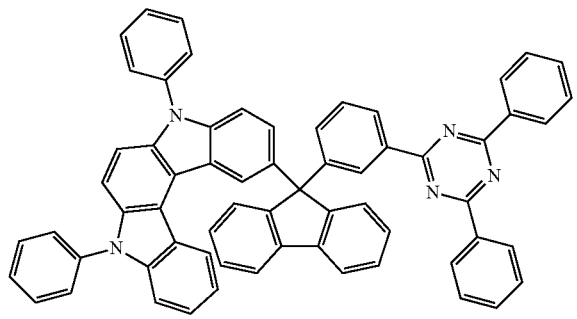

-continued
[Chemical Formula ad-11]
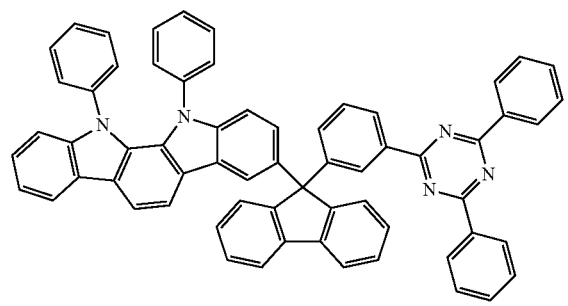
[Chemical Formula ad-12]
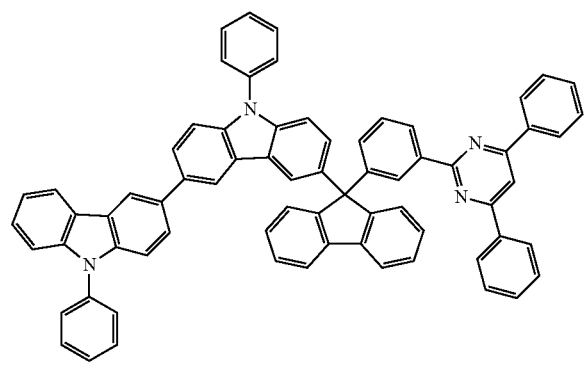
[Chemical Formula ad-13]
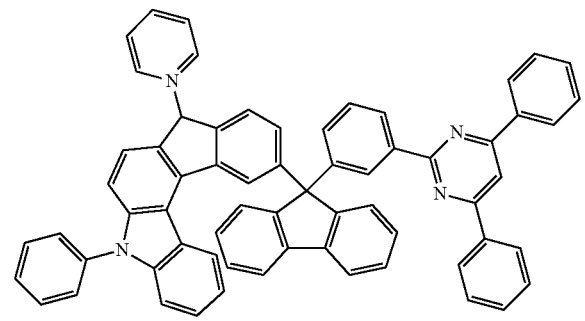
[Chemical Formula ad-14]
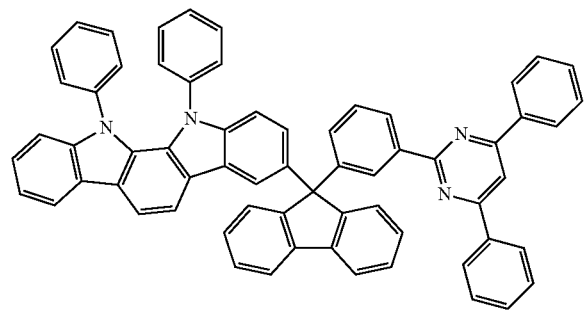
-continued
[Chemical Formula ad-15]
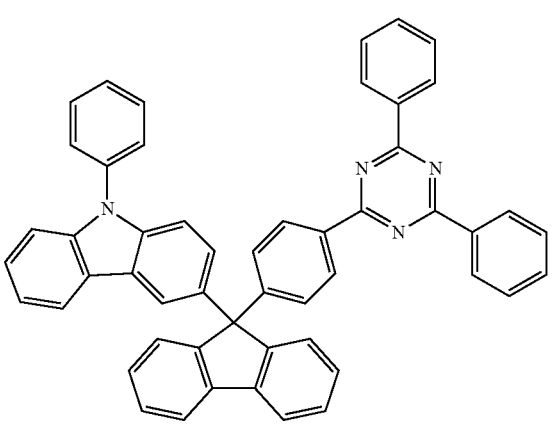
[Chemical Formula ad-16]
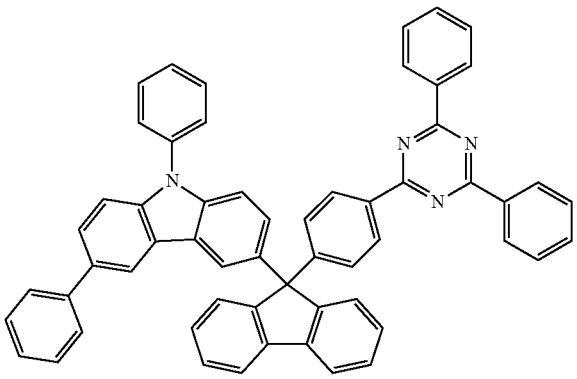
[Chemical Formula ad-17]
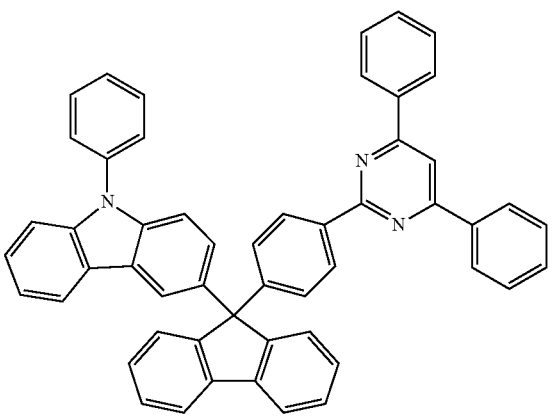

-continued

[Chemical Formula ad-18]

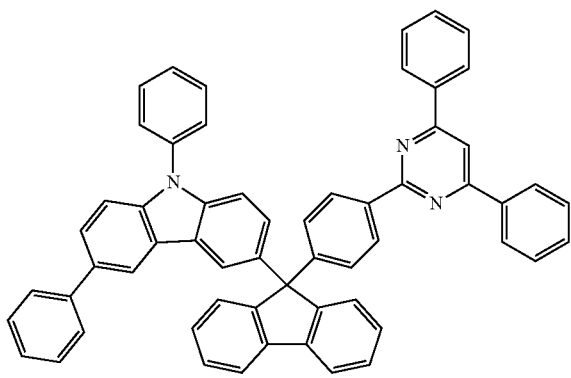

[Chemical Formula ad-19]

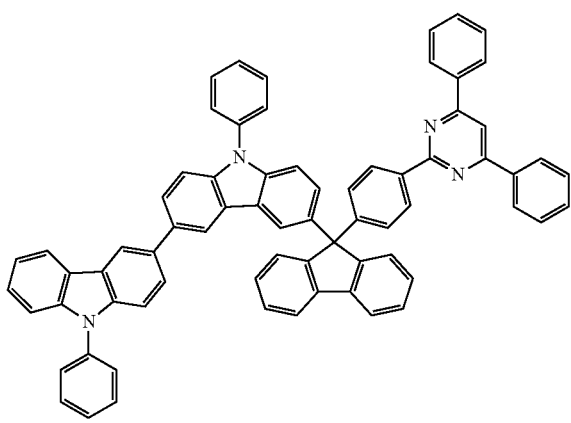

[Chemical Formula ad-20]

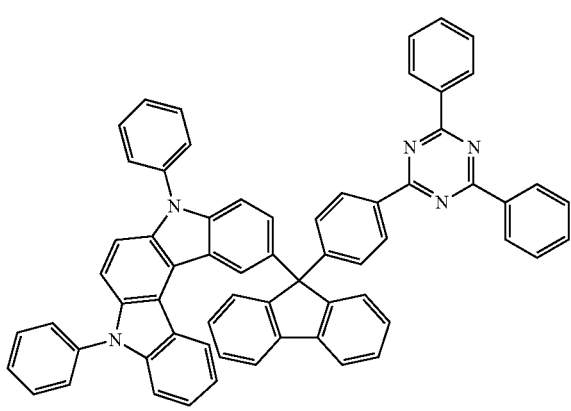

[Chemical Formula ad-21]

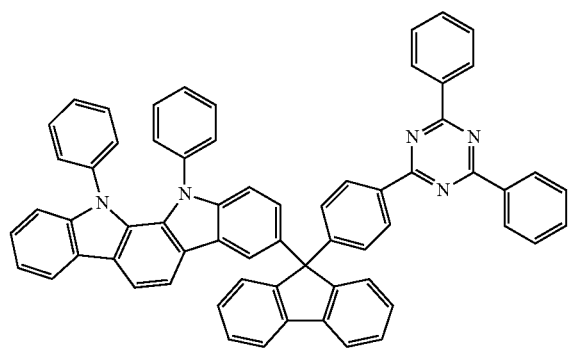

-continued

[Chemical Formula ad-22]

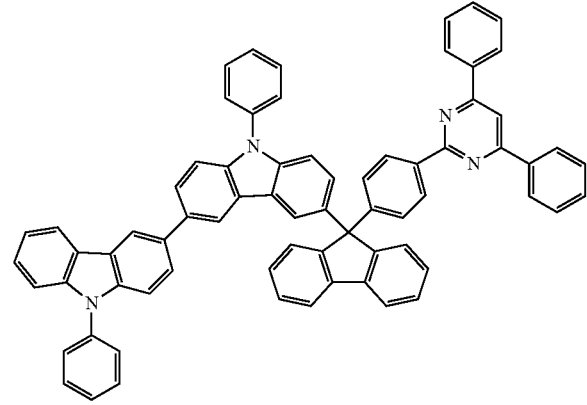

[Chemical Formula ad-23]

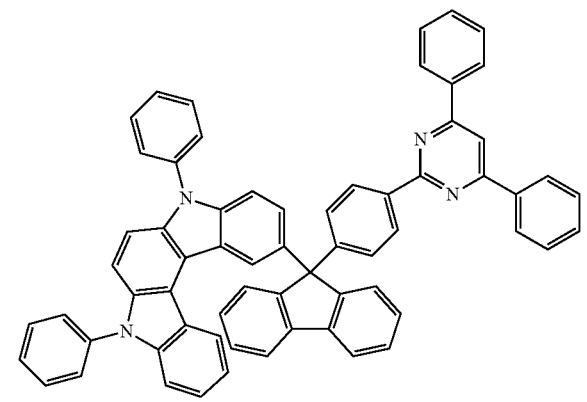

[Chemical Formula ad-24]

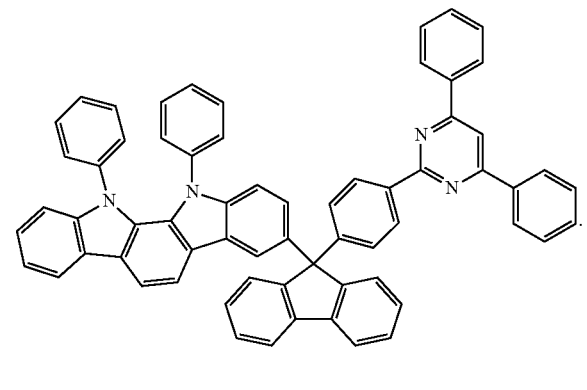

14. The compound for an organic photoelectric device as claimed in claim 8, wherein all of $X_1$ to $X_3$ of Chemical Formula A-1 are N.

15. The compound for an organic photoelectric device as claimed in claim 8, wherein $Ar_1$ in Chemical Formula A-1 is a phenylene group, a naphthylene group, an anthracenylene group, or a combination thereof.

16. The compound for an organic photoelectric device as claimed in claim 8, wherein $Ar_2$ to $Ar_4$ in Chemical Formula A-1 are each independently represented by one of the following Chemical Formulae 2a to 2c, or combination thereof:

[Chemical Formula 2a]

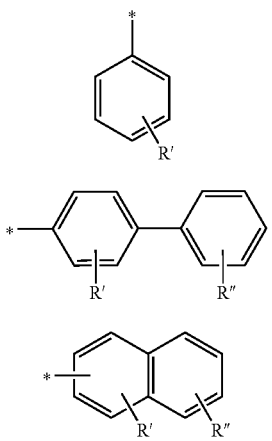

[Chemical Formula 2b]

[Chemical Formula 2c]

wherein, in Chemical Formula 2a to 2c, R' and R" are each independently hydrogen, a C1 to C10 alkyl group, a C6 to C18 aryl group, or a combination thereof.

17. An organic photoelectric device, comprising:
an anode;
a cathode; and
an organic thin layer between the anode and the cathode,
wherein the organic thin layer includes the compound for an organic photoelectric device as claimed in claim 1.

18. The organic photoelectric device as claimed in claim 17, wherein the organic thin layer includes an emission layer, a hole transport layer (HTL), a hole injection layer (HIL), a hole blocking layer, an electron transport layer (ETL), an electron injection layer (EIL), an electron blocking layer, or a combination thereof.

19. The organic photoelectric device as claimed in claim 17, wherein the organic thin layer further includes a dopant.

20. A display device comprising the organic photoelectric device as claimed in claim 17.

* * * * *